(12) United States Patent
Kato et al.

(10) Patent No.: US 8,994,400 B2
(45) Date of Patent: Mar. 31, 2015

(54) NONVOLATILE LATCH CIRCUIT AND LOGIC CIRCUIT, AND SEMICONDUCTOR DEVICE USING THE SAME

(71) Applicant: Semiconductor Energy Laboratory Co., Ltd., Atsugi-shi, Kanagawa-ken (JP)

(72) Inventors: Kiyoshi Kato, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 96 days.

(21) Appl. No.: 13/872,286

(22) Filed: Apr. 29, 2013

(65) Prior Publication Data

US 2013/0234757 A1 Sep. 12, 2013

Related U.S. Application Data

(63) Continuation of application No. 12/962,041, filed on Dec. 7, 2010, now Pat. No. 8,432,187.

(30) Foreign Application Priority Data

Dec. 11, 2009 (JP) ................................. 2009-282139

(51) Int. Cl.
*G11C 11/24* (2006.01)
*H03K 19/173* (2006.01)
(Continued)

(52) U.S. Cl.
CPC ............ *G11C 11/24* (2013.01); *G11C 14/0054* (2013.01); *H01L 27/0688* (2013.01); *H01L 27/105* (2013.01); *H03K 19/173* (2013.01); *H01L 27/1225* (2013.01)

USPC ................................................ 326/46; 326/41

(58) Field of Classification Search
None
See application file for complete search history.

(56) References Cited

U.S. PATENT DOCUMENTS

| 4,656,607 A | 4/1987 | Hagiwara et al. |
| 4,797,576 A | 1/1989 | Asazawa |

(Continued)

FOREIGN PATENT DOCUMENTS

| CN | 102668077 A | 9/2012 |
| EP | 0135036 A2 | 3/1985 |

(Continued)

OTHER PUBLICATIONS

Taiwanese Office Action (Application No. 102127768), Dated Feb. 11, 2014.

(Continued)

*Primary Examiner* — Crystal L Hammond
(74) *Attorney, Agent, or Firm* — Fish & Richardson P.C.

(57) ABSTRACT

To provide a novel nonvolatile latch circuit and a semiconductor device using the nonvolatile latch circuit, a nonvolatile latch circuit includes a latch portion having a loop structure where an output of a first element is electrically connected to an input of a second element, and an output of the second element is electrically connected to an input of the first element; and a data holding portion configured to hold data of the latch portion. In the data holding portion, a transistor using an oxide semiconductor as a semiconductor material for forming a channel formation region is used as a switching element. In addition, a capacitor electrically connected to a source electrode or a drain electrode of the transistor is included.

20 Claims, 29 Drawing Sheets

(51) Int. Cl.
    *G11C 14/00*     (2006.01)
    *H01L 27/06*     (2006.01)
    *H01L 27/105*    (2006.01)
    *H01L 27/12*     (2006.01)

(56) References Cited

U.S. PATENT DOCUMENTS

| | | |
|---|---|---|
| 4,809,225 A | 2/1989 | Dimmler et al. |
| 5,539,279 A | 7/1996 | Takeuchi et al. |
| 5,731,856 A | 3/1998 | Kim et al. |
| 5,744,864 A | 4/1998 | Cillessen et al. |
| 5,936,879 A | 8/1999 | Brouwer et al. |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,576,943 B1 | 6/2003 | Ishii et al. |
| 6,727,522 B1 | 4/2004 | Kawasaki et al. |
| 6,738,281 B2 | 5/2004 | Yokozeki |
| 6,788,567 B2 | 9/2004 | Fujimori |
| 6,809,952 B2 | 10/2004 | Masui |
| 6,845,032 B2 | 1/2005 | Toyoda et al. |
| 6,876,023 B2 | 4/2005 | Ishii et al. |
| 6,944,045 B2 | 9/2005 | Fujimori |
| 6,972,986 B2 | 12/2005 | Peng et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,064,973 B2 | 6/2006 | Peng et al. |
| 7,105,868 B2 | 9/2006 | Nause et al. |
| 7,189,992 B2 | 3/2007 | Wager, III et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,514,975 B2 | 4/2009 | Frederick et al. |
| 7,598,520 B2 | 10/2009 | Hirao et al. |
| 7,616,040 B2 | 11/2009 | Motomura |
| 7,616,041 B2 | 11/2009 | Frederick, Jr. et al. |
| 7,674,650 B2 | 3/2010 | Akimoto et al. |
| 7,696,513 B2 | 4/2010 | Hayashi et al. |
| 7,732,819 B2 | 6/2010 | Akimoto et al. |
| 7,847,287 B2 | 12/2010 | Kim et al. |
| 7,863,611 B2 | 1/2011 | Abe et al. |
| 7,888,207 B2 | 2/2011 | Wager, III et al. |
| 7,910,490 B2 | 3/2011 | Akimoto et al. |
| 7,932,521 B2 | 4/2011 | Akimoto et al. |
| 7,940,085 B2 | 5/2011 | Kim et al. |
| 7,977,169 B2 | 7/2011 | Hirao et al. |
| 7,993,964 B2 | 8/2011 | Hirao et al. |
| 8,085,076 B2 | 12/2011 | Djaja et al. |
| 8,158,987 B2 | 4/2012 | Nabekura et al. |
| 8,217,680 B2 | 7/2012 | Kim et al. |
| 8,274,077 B2 | 9/2012 | Akimoto et al. |
| 8,274,078 B2 | 9/2012 | Itagaki et al. |
| 8,410,838 B2 | 4/2013 | Kato et al. |
| 8,466,463 B2 | 6/2013 | Akimoto et al. |
| 2001/0046027 A1 | 11/2001 | Tai et al. |
| 2002/0056838 A1 | 5/2002 | Ogawa |
| 2002/0074568 A1 | 6/2002 | Yoshida et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0071039 A1 | 4/2004 | Fujimori |
| 2004/0127038 A1 | 7/2004 | Carcia et al. |
| 2004/0164778 A1 | 8/2004 | Toyoda et al. |
| 2004/0214389 A1 | 10/2004 | Madurawe |
| 2005/0017302 A1 | 1/2005 | Hoffman |
| 2005/0169039 A1 | 8/2005 | Peng et al. |
| 2005/0169040 A1 | 8/2005 | Peng et al. |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0095975 A1 | 5/2006 | Yamada et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0002605 A1 | 1/2007 | Koide |
| 2007/0019460 A1 | 1/2007 | Kang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0085585 A1 | 4/2007 | Frederick |
| 2007/0090365 A1 | 4/2007 | Hayashi et al. |
| 2007/0108446 A1 | 5/2007 | Akimoto |
| 2007/0126666 A1 | 6/2007 | Yamazaki et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1 | 2/2008 | Fukuoka |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0197414 A1 | 8/2008 | Hoffman et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258789 A1 | 10/2008 | Motomura |
| 2008/0265936 A1* | 10/2008 | Vora .............................. 326/41 |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0002044 A1 | 1/2009 | Kobayashi |
| 2009/0002590 A1 | 1/2009 | Kimura |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |

(56) References Cited

U.S. PATENT DOCUMENTS

| | | | |
|---|---|---|---|
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0305461 | A1 | 12/2009 | Akimoto et al. |
| 2010/0019839 | A1 | 1/2010 | Monden |
| 2010/0065844 | A1 | 3/2010 | Tokunaga |
| 2010/0085081 | A1 | 4/2010 | Ofuji et al. |
| 2010/0092800 | A1 | 4/2010 | Itagaki et al. |
| 2010/0109002 | A1 | 5/2010 | Itagaki et al. |
| 2010/0136743 | A1 | 6/2010 | Akimoto et al. |
| 2010/0148171 | A1 | 6/2010 | Hayashi et al. |
| 2010/0193785 | A1 | 8/2010 | Kimura |
| 2010/0213998 | A1 | 8/2010 | Uemura et al. |
| 2011/0010493 | A1 | 1/2011 | Kimura et al. |
| 2011/0024741 | A1 | 2/2011 | Abe et al. |
| 2011/0089417 | A1 | 4/2011 | Yamazaki et al. |
| 2011/0101351 | A1 | 5/2011 | Yamazaki |
| 2011/0104851 | A1 | 5/2011 | Akimoto et al. |
| 2011/0117697 | A1 | 5/2011 | Akimoto et al. |
| 2011/0121290 | A1 | 5/2011 | Akimoto et al. |
| 2011/0121878 | A1 | 5/2011 | Kato et al. |
| 2011/0148463 | A1 | 6/2011 | Kato et al. |
| 2011/0156024 | A1 | 6/2011 | Koyama et al. |
| 2011/0176357 | A1 | 7/2011 | Koyama et al. |
| 2013/0222033 | A1 | 8/2013 | Kato et al. |

FOREIGN PATENT DOCUMENTS

| | | | |
|---|---|---|---|
| EP | 0297777 | A2 | 1/1989 |
| EP | 0530928 | A2 | 3/1993 |
| EP | 0818891 | A2 | 1/1998 |
| EP | 1447909 | A1 | 8/2004 |
| EP | 1583239 | A2 | 10/2005 |
| EP | 1 737 044 | A1 | 12/2006 |
| EP | 1 770 788 | A2 | 4/2007 |
| EP | 1 998 373 | A2 | 3/2008 |
| EP | 1 998 374 | A2 | 3/2008 |
| EP | 1 998 375 | A2 | 3/2008 |
| EP | 1 995 787 | A1 | 11/2008 |
| EP | 1 998 373 | A2 | 12/2008 |
| EP | 1 998 374 | A2 | 12/2008 |
| EP | 1 998 375 | A2 | 12/2008 |
| EP | 2 226 847 | A2 | 9/2010 |
| EP | 2502272 | A | 5/2011 |
| JP | 60-025269 | A | 2/1985 |
| JP | 60-198861 | A | 10/1985 |
| JP | 62-177794 | A | 8/1987 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 64-066899 | A | 3/1989 |
| JP | 03192915 | A | 8/1991 |
| JP | 05-110392 | A | 4/1993 |
| JP | 05-251705 | A | 9/1993 |
| JP | 07-147530 | A | 6/1995 |
| JP | 08-264794 | A | 10/1996 |
| JP | 10-093423 | A | 4/1998 |
| JP | 11-505377 | A | 5/1999 |
| JP | 2000-044236 | A | 2/2000 |
| JP | 2000-077982 | A | 3/2000 |
| JP | 2000-077982 | A | 3/2000 |
| JP | 2000-150900 | A | 5/2000 |
| JP | 2000-269457 | A | 9/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-186874 | A | 7/2004 |
| JP | 2004-273614 | A | 9/2004 |
| JP | 2004-273732 | A | 9/2004 |
| JP | 2005-269616 | A | 9/2005 |
| JP | 2005-323295 | A | 11/2005 |
| JP | 2006-502597 | | 1/2006 |
| JP | 2006-050208 | A | 2/2006 |
| JP | 2006-165532 | A | 6/2006 |
| JP | 2007-073698 | A | 3/2007 |
| JP | 2007-096055 | A | 4/2007 |
| JP | 2007-110728 | A | 4/2007 |
| JP | 2007-123861 | A | 5/2007 |
| JP | 2007-125823 | A | 5/2007 |
| JP | 2007-179021 | A | 7/2007 |
| JP | 2007-250984 | A | 9/2007 |
| JP | 2008-147903 | A | 6/2008 |
| JP | 2008-533693 | | 8/2008 |
| JP | 2009-528670 | | 8/2009 |
| JP | 2009-206942 | A | 9/2009 |
| JP | 2009-212443 | A | 9/2009 |
| JP | 2009-212736 | A | 9/2009 |
| JP | 2009-260378 | A | 11/2009 |
| JP | 2009-275236 | A | 11/2009 |
| JP | 2010-034710 | A | 2/2010 |
| WO | 03/044953 | A1 | 5/2003 |
| WO | WO-2004/038757 | | 5/2004 |
| WO | 2004059838 | A1 | 7/2004 |
| WO | 2004/114391 | A1 | 12/2004 |
| WO | WO-2007/094501 | | 8/2007 |
| WO | WO-2007/119321 | | 10/2007 |
| WO | WO-2007/142167 | | 12/2007 |
| WO | WO-2008/133345 | | 11/2008 |
| WO | WO-2009/063542 | | 5/2009 |
| WO | 2009110623 | A1 | 9/2009 |
| WO | WO-2011/062075 | | 5/2011 |

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn—Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

(56) References Cited

OTHER PUBLICATIONS

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFe2O4, and YB2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMo3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure, " NIRIM Newsletter, Mar. 1995, vol. 150, pp. 1-4, with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272

Nomura, K et al., "Amorphous Oxide Semiconductors for High-Performance Flexible Thin-Film Transistors," JPN. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Chinese Office Action (Application No. 201080057883.X) Dated Apr. 24, 2014.

Korean Office Action (Application No. 2013-7019710) Dated Jul. 31, 2014.

(56) References Cited

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Nishijima, Tatsuji et al., "Low-power Display System Driven by Utilizing Technique Using Crystalline IGZO Transistor," SID 2012 Digest, 43.1, pp. 583-586, in English.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Yamazaki et al., "Research, Development, and Application of Crystalline Oxide Semiconductor," SID 2012 Digest, 15.1, pp. 183-186, in English.

International Search Report, PCT Application No. PCT/JP2010/070753, dated Mar. 1, 2011.

Written Opinion, PCT Application No. PCT/JP2010/070753, dated Mar. 1, 2011.

Tran, Jany, Notice of Allowance along with the allowed claims, U.S. Appl. No. 12/966,513, dated Jul. 12, 2012, in English, 17 pages.

Nguyen, Long T., Notice of Allowance along with the allowed claims, U.S. Appl. No. 12/946,122, dated Oct. 9, 2012, in English, 16 pages.

Lee, Hsien Ming, Notice of Allowance along with the allowed claims, U.S. Appl. No. 12/976,206, dated Sep. 20, 2012, in English, 39 pages.

\* cited by examiner

Energy band diagram of B-B'section ($V_G>0$)

Energy band diagram of B-B'section ($V_G<0$)

A2 300 302 304 A3

305
A2 A3

306
A2 A3

308a 304a 306a 308b
A2 A3

316 312 350 314 318
A2 A3

NONVOLATILE LATCH CIRCUIT AND LOGIC CIRCUIT, AND SEMICONDUCTOR DEVICE USING THE SAME

CROSS-REFERENCE TO RELATED APPLICATIONS

This application is a continuation of U.S. application Ser. No. 12/962,041, filed Dec. 7, 2010, now allowed, which claims the benefit of a foreign priority application filed in Japan as Serial No. 2009-282139 on Dec. 11, 2009, both of which are incorporated by reference.

TECHNICAL FIELD

The invention disclosed herein relates to a nonvolatile logic circuit in which the logical state of storing data is not erased even after power is turned off, and a semiconductor device using the nonvolatile logic circuit. In particular, the invention disclosed herein relates to a nonvolatile latch circuit and a semiconductor device using the nonvolatile latch circuit.

BACKGROUND ART

An integrated circuit has been proposed in which nonvolatile logic is integrated, where a feature of "nonvolatile" with which data is not erased even when power is turned off is applied to a logic circuit. For example, a nonvolatile latch circuit using a ferroelectric element as nonvolatile logic has been proposed (see Patent Document 1).

REFERENCE

Patent Document

[Patent Document 1] PCT International Publication No. 2003/044953

DISCLOSURE OF INVENTION

However, a nonvolatile latch circuit using a ferroelectric element has problems in terms of reliability of the number of rewrites and reduction in voltage. In addition, a ferroelectric element is polarized by an electric field which is applied to the element, and stores data by remanent polarization. However, when the remanent polarization is small, the following problems might arise: the influence of variation in the amount of charge becomes large, and a high-accuracy reading circuit is needed.

In view of the aforementioned problems, an object of an embodiment of the present invention is to provide a novel nonvolatile latch circuit and a semiconductor device using the nonvolatile latch circuit.

A nonvolatile latch circuit according to one embodiment of the present invention includes a latch portion having a loop structure, in which an output of a first element is electrically connected to an input of a second element, and an output of the second element is electrically connected to an input of the first element; and a data holding portion for holding data of the latch portion. In the data holding portion, a transistor using an oxide semiconductor as a semiconductor material for forming a channel formation region is used as a switching element.

In addition, the data holding portion includes a capacitor which is electrically connected to a source electrode or a drain electrode of the transistor. With the use of the transistor, data held in the latch portion can be written into the capacitor of the data holding portion. Further, with the use of the transistor, the data written into the capacitor of the data holding portion can be held. Furthermore, with the use of the transistor, the data held in the capacitor of the data holding portion can be read to the latch portion.

In other words, a nonvolatile latch circuit according to one embodiment of the present invention includes a latch portion and a data holding portion for holding data of the latch portion. The data holding portion includes a transistor and a capacitor. A channel formation region of the transistor includes an oxide semiconductor layer. One of a source electrode and a drain electrode of the transistor is electrically connected to one of electrodes of the capacitor, and the other of the source electrode and the drain electrode of the transistor is electrically connected to the latch portion.

In the aforementioned nonvolatile latch circuit, the latch portion includes a first element and a second element, and has a loop structure in which an output of the first element is electrically connected to an input of the second element, and an output of the second element is electrically connected to an input of the first element. In addition, the input of the first element is electrically connected to a wiring supplied with an input signal, and the output of the first element is electrically connected to a wiring supplied with an output signal. For example, an inverter can be used for each of the first element and the second element. Alternatively, a NAND can be used for the first element, and a clocked inverter can be used for the second element, for example.

In the aforementioned nonvolatile latch circuit, the other of the source electrode and the drain electrode of the transistor is electrically connected to the input of the first element of the latch portion, and the other of the source electrode and the drain electrode of the transistor is electrically connected to the wiring supplied with the input signal.

In the aforementioned nonvolatile latch circuit, the transistor has a function of writing data held in the latch portion into the capacitor of the data holding portion. In addition, the transistor has a function of holding the data written into the capacitor of the data holding portion. Moreover, the transistor has a function of reading the data held in the capacitor of the data holding portion to the latch portion.

A nonvolatile latch circuit according to another embodiment of the present invention includes a latch portion and a data holding portion for holding data of the latch portion. The data holding portion includes a first transistor, a second transistor, a first capacitor, and a second capacitor. Channel formation regions of the first transistor and the second transistor each include an oxide semiconductor layer. One of a source electrode and a drain electrode of the first transistor is electrically connected to one of electrodes of the first capacitor, and the other of the source electrode and the drain electrode of the first transistor is electrically connected to the latch portion. One of a source electrode and a drain electrode of the second transistor is electrically connected to one of electrodes of the second capacitor, and the other of the source electrode and the drain electrode of the second transistor is electrically connected to the latch portion.

In the aforementioned nonvolatile latch circuit, the latch portion includes a first element and a second element, and has a loop structure in which an output of the first element is electrically connected to an input of the second element, and an output of the second element is electrically connected to an input of the first element. In addition, the input of the first element is electrically connected to a wiring supplied with an input signal, and the output of the first element is electrically connected to a wiring supplied with an output signal. For example, an inverter can be used for each of the first element and the second element. Alternatively, a NAND can be used for the first element, and a clocked inverter can be used for the second element, for example.

In the aforementioned nonvolatile latch circuit, the other of the source electrode and the drain electrode of the first transistor is electrically connected to the input of the first element of the latch portion, and the other of the source electrode and the drain electrode of the first transistor is electrically connected to the wiring supplied with the input signal. The other of the source electrode and the drain electrode of the second transistor is electrically connected to the output of the first element of the latch portion, and the other of the source electrode and the drain electrode of the second transistor is electrically connected to the wiring supplied with the output signal.

In the aforementioned nonvolatile latch circuit, the first and second transistors each have a function of writing data held in the latch portion into the first and second capacitors of the data holding portion. In addition, the first and second transistors each have a function of holding data written into the first and second capacitors of the data holding portion. Moreover, the first and second transistors each have a function of reading data held in the first and second capacitors of the data holding portion to the latch portion.

In the aforementioned nonvolatile latch circuit, with a transistor including an oxide semiconductor layer, which is formed with an oxide semiconductor material, for a channel formation region, can obtain the following characteristics even in the case of, for example, an element whose channel width W is $1 \times 10^4$ μm and channel length L is 3 μm: the off-state current is less than or equal to $1 \times 10^{-13}$ A at room temperature; and the subthreshold swing (S value) is approximately 0.1 V/dec. (a gate insulating film: 100 nm thickness). In addition, the aforementioned transistor has characteristics of a normally-off transistor (threshold voltage thereof is positive in the case of an n-channel transistor).

Therefore, leakage current, that is, an off-state current at a state where a voltage between a gate electrode and a source electrode is approximately 0 V is much smaller than that of a transistor using silicon. For example, in the transistor whose channel width W is $1 \times 10^4$ μm, a leakage current at room temperature per one micrometer of a channel width is lower than or equal to 10 aA (hereinafter, in this specification, this is described as "the leakage current per unit channel width is less than or equal to 10 aA/μm at room temperature").

Accordingly, with the transistor including an oxide semiconductor layer for a channel formation region, which serves as a switching element, a charge accumulated in the capacitor of the data storing portion can be kept stored without any change even after supply of a power source voltage to the latch circuit has stopped. In other words, data written into the data holding portion can be kept held without any change.

For example, a refresh time and retention can be made much longer than those of a DRAM including a transistor using silicon for a channel formation region, and memory retention characteristics (a data holding property) which are substantially at the same level as a nonvolatile memory can be realized. In addition, after the supply of the power source voltage to the latch circuit has started again, the data held in the data holding portion can be read to the latch portion with the transistor. Accordingly, the logical state can be restored to the logical state prior to the stop of the supply of the power source voltage.

Further, in temperature characteristics, the off-state current can be sufficiently low and the on-state current can be sufficiently high even at a high temperature. For example, as $V_G$-$I_D$ characteristics of the transistor including an oxide semiconductor layer for a channel formation region, data is obtained in a range of −25° C. to 150° C. with low temperature dependence of off-state currents, on-state currents, mobilites, and S values. Furthermore, data is obtained which shows that the off-state current in the aforementioned temperature range is as extremely low as $1 \times 10^{-13}$ A or less. One of the reasons is that an i-type or substantially i-type oxide semiconductor which is obtained by sufficiently reducing the hydrogen concentration to be highly purified and has extremely low carrier concentration is used as the oxide semiconductor.

Note that in this specification, an oxide semiconductor having a carrier density which is less than $1 \times 10^{11}/cm^3$ is called an "intrinsic or i-type oxide semiconductor", and an oxide semiconductor having a carrier density greater than or equal to $1 \times 10^{11}/cm^3$ but less than $1 \times 10^{12}/cm^3$ is called a "substantially-intrinsic oxide semiconductor".

In this manner, an embodiment of the present invention is to provide a nonvolatile latch circuit which has a wide operating temperature range and operates stably even at a high temperature and in which a logical state of storing data is not erased even after power is turned off.

In the aforementioned nonvolatile latch circuit, various logic circuits can be provided by using the nonvolatile latch circuit. In addition, various semiconductor devices using the logic circuits can be provided. For example, among a plurality of block circuits of the logic circuit, supply of a power source voltage to one or the plurality of block circuits which is/are not used can be stopped. With the use of the nonvolatile latch circuit, the logical state of the block circuit can be kept stored even after the supply of the power source voltage to the block circuit has stopped. Moreover, the stored logical state can be read after the supply of the power source voltage to the block circuit has started again. Accordingly, the logical state can be restored to the logical state prior to the stop of the supply of the power source voltage.

In the aforementioned nonvolatile latch circuit, as the oxide semiconductor layer, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor; a Sn—O-based oxide semiconductor; or a Zn—O-based oxide semiconductor which are one-component metal oxides. In addition, the aforementioned oxide semiconductors may contain $SiO_2$.

Note that in this specification, for example, an In—Sn—Ga—Zn—O-based oxide semiconductor means an oxide semiconductor containing at least In, Sn, Ga, and Zn, where a composition ratio of each metal element is not limited. In addition, a metal element other than In, Sn, Ga, and Zn may be contained therein.

As the oxide semiconductor layer, a thin film containing a material represented by $InMO_3(ZnO)_m$ (m>0) can be used. Here, M represents one or more of metal elements selected from Ga, Al, Mn, and Co. For example, M can be Ga, Ga and Al, Ga and Mn, Ga and Co, or the like.

In the aforementioned nonvolatile latch circuit, the hydrogen concentration in the oxide semiconductor layer can be set to less than or equal to $5\times10^{19}/cm^3$, preferably less than or equal to $5\times10^{18}/cm^3$, more preferably less than or equal to $5\times10^{17}/cm^3$, and still more preferably less than $1\times10^{16}/cm^3$. Further, the carrier concentration in the oxide semiconductor layer can be set to less than $1\times10^{14}/cm^3$, preferably less than $1\times10^{12}/cm^3$, more preferably less than $1\times10^{11}/cm^3$. The off-state current of the transistor using such an i-type oxide semiconductor or substantially i-type oxide semiconductor can be set to less than or equal to $1\times10^{-17}$ A, preferably $1\times10^{-18}$ A.

In the aforementioned nonvolatile latch circuit, the transistor using an oxide semiconductor may be a bottom-gate type, a top-gate type, a bottom-contact type, or a top-contact type. A bottom-gate transistor includes at least a gate electrode over an insulating surface; a gate insulating film over the gate electrode; and an oxide semiconductor layer to be a channel formation region over the gate electrode, with the gate insulating film interposed therebetween.

The top-gate transistor includes at least an oxide semiconductor layer to be a channel formation region over an insulating surface; a gate insulating film over the oxide semiconductor layer; and a gate electrode over the oxide semiconductor layer, with the gate insulating film interposed therebetween. The bottom-contact transistor includes an oxide semiconductor layer to be a channel formation region over a source electrode and a drain electrode. The top-contact transistor includes a source electrode and a drain electrode over an oxide semiconductor layer to be a channel formation region.

Note that the term such as "over" or "below" in this specification does not necessarily mean that a component is placed "directly on" or "directly under" another component. For example, the expression "a gate electrode over a gate insulating layer" does not exclude the case where a component is placed between the gate insulating layer and the gate electrode. Moreover, the terms such as "over" and "below" are only used for convenience of description and can include the case where the relation of components is reversed, unless otherwise specified.

In this specification, the term of "electrode" or "wiring" does not limit the function of components. For example, an "electrode" can be used as part of "wiring", and the "wiring" can be used as part of the "electrode". In addition, the term of "electrode" or "wiring" can also mean a combination of a plurality of "electrodes" and "wirings", for example.

Note that functions of the "source" and the "drain" may be switched in the case where transistors of different polarities are employed or in the case where the direction of a current flow changes in a circuit operation. Therefore, the terms "source" and "drain" can be replaced with each other in this specification.

Note that in this specification, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

Note that in general, the term "SOI substrate" means a substrate having a silicon semiconductor layer over its insulating surface. In this specification, the term "SOI substrate" also means a substrate having a semiconductor layer using a material other than silicon over its insulating surface. That is, a semiconductor layer included in the "SOI substrate" is not limited to a silicon semiconductor layer.

A substrate in the "SOI substrate" is not limited to a semiconductor substrate such as a silicon wafer and can be a non-semiconductor substrate such as a glass substrate, a quartz substrate, a sapphire substrate, or a metal substrate. That is, an "SOI substrate" also includes a conductive substrate and an insulating substrate over which a layer is formed using a semiconductor material.

Further, in this specification, the term "semiconductor substrate" means not only a substrate formed using only a semiconductor material but also all substrates including a semiconductor material. That is, in this specification, the "SOI substrate" is also included in the category of the "semiconductor substrate".

According to an embodiment of the present invention, with the use of a transistor using an oxide semiconductor as a semiconductor material for forming a channel formation region, which serves as a switching element of a data holding portion, a nonvolatile latch circuit which has a wide operating temperature range and operates stably even at a high temperature and in which a logical state of storing data is not erased even after power is turned off, or a latch circuit provided with a data holding portion where a refresh period is sufficiently long can be realized. Since data writing is performed by switching of the transistor, the number of rewrites is not substantially limited. In addition, the writing voltage is almost equivalent to the threshold voltage of the transistor; thus, the data writing can be performed at a low voltage. Further, the charge accumulated in the capacitor of the data storing portion can be kept held as data without any change; therefore, the variation in the amount of charge which is stored as data can be suppressed small and data can be read easily as compared to the case where remanent polarization is used as data.

Various logic circuits can be provided by using the nonvolatile latch circuit. For example, in the logic circuit using the nonvolatile latch circuit, the power consumption can be reduced by turning off power of the unused block. In addition, since a logical state is stored even when power is turned off, a system can be started when power is turned on or terminated when power is turned off, at high speed and low power.

BEST MODE FOR CARRYING OUT THE INVENTION

Figure 1:
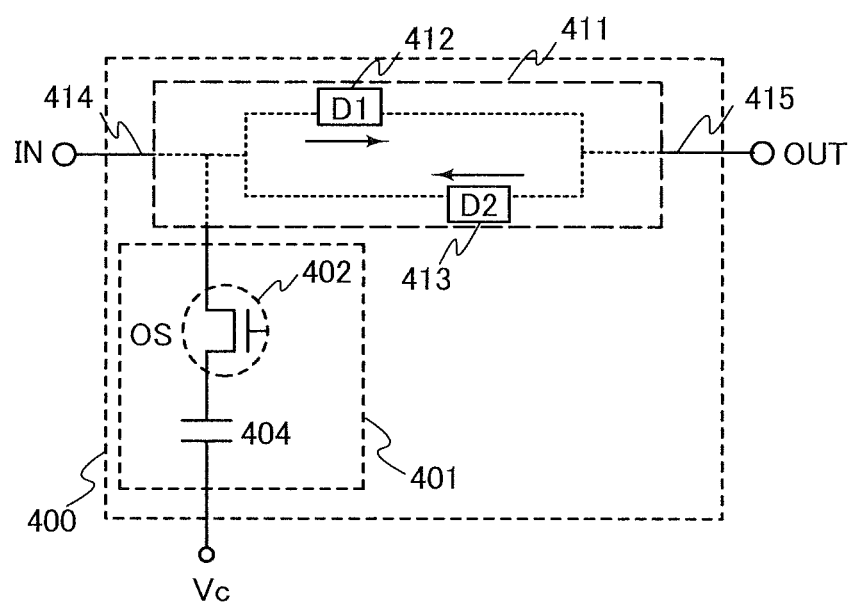
FIG. 1 illustrates an example of a configuration of a nonvolatile latch circuit.

Hereinafter, embodiments of the present invention are described below with reference to the drawings. However, the present invention is not limited to the following description. It is easily understood by those skilled in the art that the mode and detail can be changed in various ways unless departing from the scope and spirit of the present invention. Therefore, the present invention should not be construed as being limited to the description in the following embodiments. In describing structures of the present invention with reference to the drawings, reference numerals denoting the same components are used in different drawings.

Note that the size, the thickness of a layer, and a region of each structure illustrated in the drawings and the like in embodiments are exaggerated for simplicity in some cases. Therefore, embodiments of the present invention are not limited to such scales.

Note that terms with ordinal numbers such as "first", "second", and "third" in this specification are used in order to identify components, and the terms do not limit the components numerically.

[Embodiment 1]

In this embodiment, a configuration and an operation of a nonvolatile latch circuit which is an embodiment of the invention disclosed herein; and a structure, a manufacturing method, and the like of elements of the nonvolatile latch circuit will be described with reference to FIG. 1, FIGS. 2A and 2B, FIGS. 3A and 3B, FIGS. 4A to 4H, FIGS. 5A to 5G, FIGS. 6A to 6D, FIG. 7, FIG. 8, FIGS. 9A and 9B, FIG. 10, FIG. 11, FIG. 12, FIG. 13, FIG. 14, and FIG. 15.

<Configuration and Operation of Nonvolatile Latch Circuit>

FIG. 1 illustrates a configuration of a nonvolatile latch circuit 400 including a latch portion 411 and a data holding portion 401 for holding data of the latch portion.

The nonvolatile latch circuit 400 in FIG. 1 includes the latch portion 411 having a loop structure and the data holding portion 401 for holding data of the latch portion. In the latch portion 411 having a loop structure, an output of a first element (D1) 412 is electrically connected to an input of a second element (D2) 413, and an output of the second element (D2) 413 is electrically connected to an input of the first element (D1) 412.

The input of the first element (D1) 412 is electrically connected to a wiring 414 supplied with an input signal of the latch circuit. The output of the first element (D1) 412 is electrically connected to a wiring 415 supplied with an output signal of the latch circuit.

When there is a plurality of inputs of the first element (D1) 412, one of the inputs can be electrically connected to the wiring 414 supplied with the input signal of the latch circuit. When there is a plurality of inputs of the second element (D2) 413, one of the inputs can be electrically connected to the output of the first element (D1) 412.

As the first element (D1) 412, an element in which inputted signal is inverted and the resulting signal serves as an output can be used. For example, as the first element (D1) 412, an inverter, a NAND, a NOR, a clocked inverter, or the like can be used. As the second element (D2) 413, an element in which inputted signal is inverted and the resulting signal serves as an output can be used. For example, as the second element (D2) 413, an inverter, a NAND, a NOR, a clocked inverter, or the like can be used.

In the data holding portion 401, a transistor 402 using an oxide semiconductor as a semiconductor material for forming a channel formation region is used as a switching element. In addition, the data holding portion 401 includes a capacitor 404 which is electrically connected to a source electrode or a drain electrode of the transistor 402. In other words, one of electrodes of the capacitor 404 is electrically connected to one of the source electrode and the drain electrode of the transistor 402. The other of the source electrode and the drain electrode of the transistor 402 is electrically connected to the input of the first element or a wiring supplied with the input signal of the latch circuit. The other electrode of the capacitor 404 is supplied with a potential $V_c$.

Figure 2A:
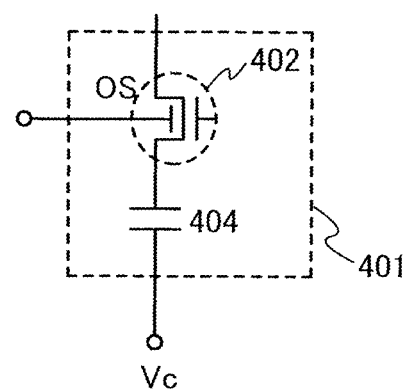
FIGS. 2A and 2B illustrate an example of a configuration of part of a nonvolatile latch circuit.
Figure 2B:
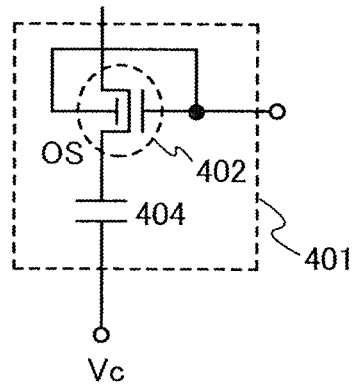

As the data holding portion 401, the configuration illustrated in FIGS. 2A and 2B can be employed instead of the configuration illustrated in FIG. 1.

In a data holding portion 401 in FIG. 2A, a transistor 402 includes a first gate electrode and a second gate electrode. An oxide semiconductor layer for forming a channel formation region is provided between the first gate electrode and the second gate electrode. The first gate electrode is electrically connected to a wiring supplied with a control signal. The second gate electrode is electrically connected to a wiring supplied with a predetermined potential. For example, the second gate electrode is electrically connected to a wiring supplied with a negative potential or a ground potential (GND).

In addition, in the data holding portion 401 in FIG. 2A, one of the electrodes of the capacitor 404 is electrically connected to one of the source electrode and the drain electrode of the transistor 402. The other of the source electrode and the drain electrode of the transistor 402 is electrically connected to the input of the first element or the wiring supplied with the input signal of the latch circuit. The other electrode of the capacitor 404 is supplied with a potential $V_c$.

With the nonvolatile latch circuit using the data holding portion 401 in FIG. 2A, an advantageous effect that adjustment of electric characteristics (e.g., a threshold voltage) of the transistor 402 is facilitated can be obtained in addition to the advantageous effect of the nonvolatile latch circuit in FIG. 1. For example, when the second gate electrode of the transistor 402 is supplied with a negative potential, the transistor 402 can be normally off easily.

In a data holding portion 401 in FIG. 2B, the transistor 402 includes a first gate electrode and a second gate electrode. An oxide semiconductor layer for forming a channel formation region is provided between the first gate electrode and the second gate electrode. The second gate electrode is electrically connected to the first gate electrode. In addition, in the data holding portion 401 in FIG. 2B, one of the electrodes of the capacitor 404 is electrically connected to one of the source electrode and the drain electrode of the transistor 402. The other of the source electrode and the drain electrode of the transistor 402 is electrically connected to the input of the first element or the wiring supplied with the input signal of the latch circuit. The other electrode of the capacitor 404 is supplied with a potential $V_c$. With the nonvolatile latch circuit using the data holding portion 401 in FIG. 2B, an advantageous effect that the amount of current in the transistor 402 is increased can be obtained in addition to the advantageous effect of the nonvolatile latch circuit in FIG. 1.

In the nonvolatile latch circuit having the configurations illustrated in FIG. 1 and FIGS. 2A and 2B, the following writing, holding, and reading of data can be performed. Note that although the description will be made below with reference to the configuration of FIG. 1, the aforementioned operations can be similarly performed in the case of the other configurations.

The transistor 402 using an oxide semiconductor has a function of writing data held in the latch portion 411 into the capacitor 404 of the data holding portion 401. In addition, the transistor 402 has a function of holding the data written into the capacitor 404 of the data holding portion 401. Moreover, the transistor 402 has a function of reading the data held in the capacitor 404 of the data holding portion 401 to the latch portion 411.

A writing operation of the data held in the latch portion 411 into the data holding portion 401, a holding operation of the data, a reading operation of the data from the data holding portion 401 to the latch portion 411, and a rewriting operation of the data of the data holding portion 401 will be described. First, the transistor 402 is turned on by supplying a gate electrode of the transistor 402 with a potential at which the transistor 402 is turned on. Accordingly, one of the electrodes of the capacitor 404 is supplied with the data held in the latch portion, that is, a potential of the input of the first element (D1) 412, which is held in the latch portion. As a result, the charge corresponding to the potential of the input of the first element (D1) 412, which is held in the latch portion, is accumulated in one of the electrodes of the capacitor 404 (this operation corresponds to writing).

After that, the transistor 402 is turned off in such a manner that a potential of the gate electrode of the transistor 402 is set to a potential at which the transistor 402 is turned off. Accordingly, the charge accumulated in one of the electrodes of the capacitor 404 is held (holding). In addition, after the potential of the input of the first element (D1) 412 is brought into a floating state, the transistor 402 is turned on by supplying the gate electrode of the transistor 402 with a potential at which the transistor 402 is turned on. Accordingly, the charge is distributed to one of the electrodes of the capacitor 404 and the input of the first element (D1) 412. As a result, the input of the first element (D1) 412 is supplied with the potential corresponding to the charge accumulated in one of the electrodes of the capacitor 404. Then, the data is held in the latch portion. As a result, the data can be read (reading). Rewriting of the data can be performed in a manner similar to that of the writing and holding of the data.

As the oxide semiconductor layer included in the transistor 402, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor; a Sn—O-based oxide semiconductor; or a Zn—O-based oxide semiconductor which are one-component metal oxides. In addition, the aforementioned oxide semiconductors may contain $SiO_2$.

As the oxide semiconductor layer, a thin film containing a material represented by $InMO_3(ZnO)_m$ (m>0) can be used. Here, M represents one or more of metal elements selected from Ga, Al, Mn, and Co. For example, M can be Ga, Ga and Al, Ga and Mn, Ga and Co, or the like.

The oxide semiconductor layer is preferably an oxide semiconductor layer which is highly purified by sufficiently removing an impurity such as hydrogen and supplying oxygen. Specifically, the hydrogen concentration in the oxide semiconductor layer, which is measured by SIMS (secondary ion mass spectroscopy), can be set to less than or equal to $5 \times 10^{19}/cm^3$, preferably less than or equal to $5 \times 10^{18}/cm^3$, more preferably less than or equal to $5 \times 10^{17}/cm^3$, and still more preferably less than $1 \times 10^{16}/cm^3$.

Further, the carrier concentration in the oxide semiconductor layer can be set to less than $1 \times 10^{14}/cm^3$, preferably less than $1 \times 10^{12}/cm^3$, more preferably less than $1 \times 10^{11}/cm^3$. In the oxide semiconductor layer which is highly purified by sufficiently reducing the hydrogen concentration and supplying oxygen, the carrier concentration is sufficiently low (e.g., less than $1 \times 10^{12}/cm^3$, preferably less than $1 \times 10^{11}/cm^3$), as compared to carrier concentration (approximately $1 \times 10^{14}/cm^3$) in a general silicon wafer (a silicon wafer to which a slight amount of impurity elements such as phosphorus or boron is added).

In this manner, by using an i-type or a substantially i-type oxide semiconductor which is obtained by sufficiently reducing the hydrogen concentration to be highly purified and have extremely low carrier concentration, the transistor 402 which has extremely favorable off-state current characteristics can be obtained. For example, even in the case of an element whose channel width W is $1\times10^4$ µm and channel length L is 3 µm, when a drain voltage $V_D$ which is applied to a drain electrode is +1 V or +10 V and a gate voltage $V_G$ which is applied to a gate electrode ranges from −5 V to −20 V, the off-state current is less than or equal to $1\times10^{-13}$ A at room temperature. Moreover, the aforementioned transistor has characteristics of a normally-off transistor. Therefore, leakage current, that is, an off-state current at a state where a voltage between a gate electrode and a source electrode is approximately 0 V is much smaller than that of a transistor using silicon. For example, the leakage current per unit channel width is less than or equal to 10 aA/µm at room temperature.

Further, in temperature characteristics, a transistor in which an off-state current can be sufficiently low and an on-state current can be sufficiently high even at a high temperature can be obtained. For example, as $V_G$-$I_D$ characteristics of the transistor 402, data is obtained in a range of −25° C. to 150° C. with low temperature dependence of on-state currents, mobilites, and S values. Furthermore, data is obtained which shows that the off-state current in the aforementioned temperature range is as extremely low as $1\times10^{-13}$ A or less (less than or equal to the measurement limit). One of the reasons is that an i-type or substantially i-type oxide semiconductor which is obtained by sufficiently reducing the hydrogen concentration to be highly purified and has extremely low carrier concentration is used as the oxide semiconductor.

In this manner, by using as a switching element the transistor 402 using an i-type or substantially i-type oxide semiconductor which is obtained by sufficiently reducing the hydrogen concentration to be highly purified and have extremely low carrier concentration, the charge accumulated in the capacitor 404 of the data holding portion 401 can be kept held for an extremely long time even after supply of a power source voltage to the latch circuit 400 has stopped. In other words, the data written into the data holding portion 401 can be kept held for an extremely long time.

For example, in the transistor 402, a refresh time and retention can be made much longer than those of a DRAM including a transistor using silicon for a channel formation region, and memory retention characteristics (a data holding property) which are substantially at the same level as a nonvolatile memory can be realized. In addition, the logical state can be restored to the logical state prior to the stop of the supply of the power source voltage by reading the data held in the data holding portion 401. In this manner, by using as a switching element the transistor 402 using an i-type or substantially i-type oxide semiconductor which is obtained by sufficiently reducing the hydrogen concentration to be highly purified and have extremely low carrier concentration, a novel nonvolatile latch circuit which has a wide operating temperature range and operates stably even at a high temperature and in which a logical state of storing data is not erased even after power is turned off can be realized.

<Structure of Elements of Nonvolatile Latch Circuit>

Among elements of the nonvolatile latch circuit 400, a material other than an oxide semiconductor can be used as a semiconductor material for the elements other than the transistor 402 using an oxide semiconductor. As the material other than an oxide semiconductor, single crystal silicon, crystalline silicon, or the like can be used. For example, the element other than the transistor 402 can be provided over a substrate containing a semiconductor material. As the substrate containing a semiconductor material, a silicon wafer, an SOI (silicon on insulator) substrate, a silicon film over an insulating surface, or the like can be used. With the use of the material other than an oxide semiconductor, high-speed operation can be realized. For example, the first element (D1) 412 and the second element (D2) 413 of the latch portion can be formed with a transistor using a material other than an oxide semiconductor.

Figure 3A:
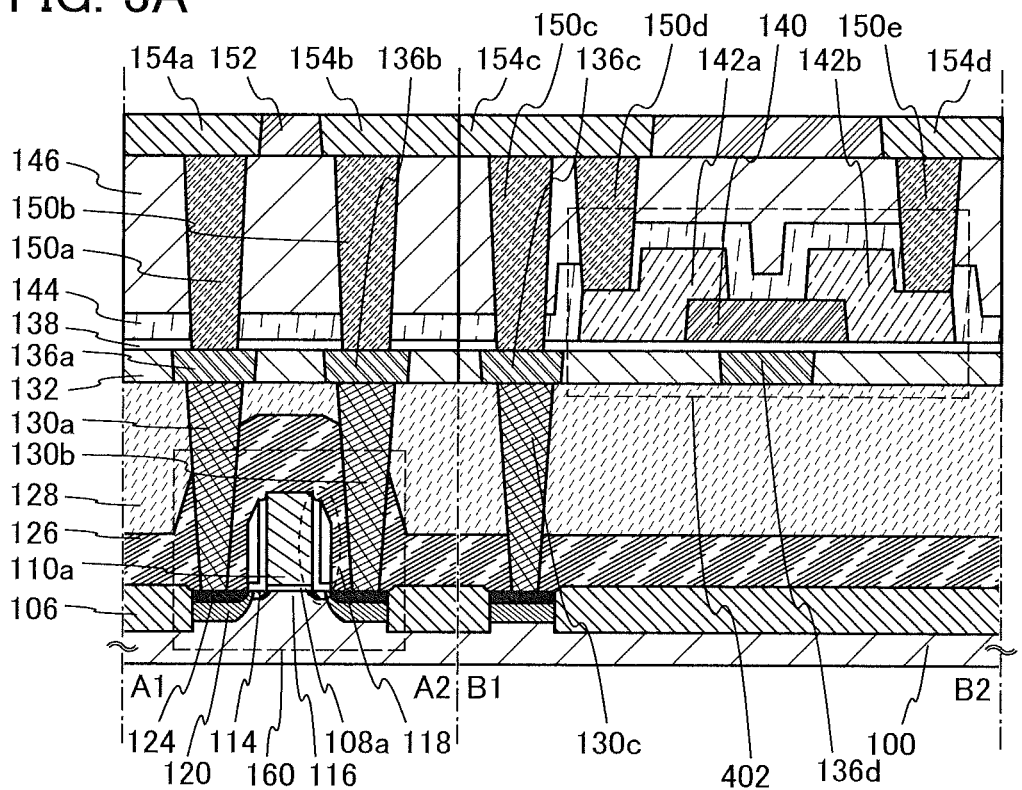
FIGS. 3A and 3B are cross-sectional views illustrating an example of elements of a nonvolatile latch circuit.
Figure 3B:
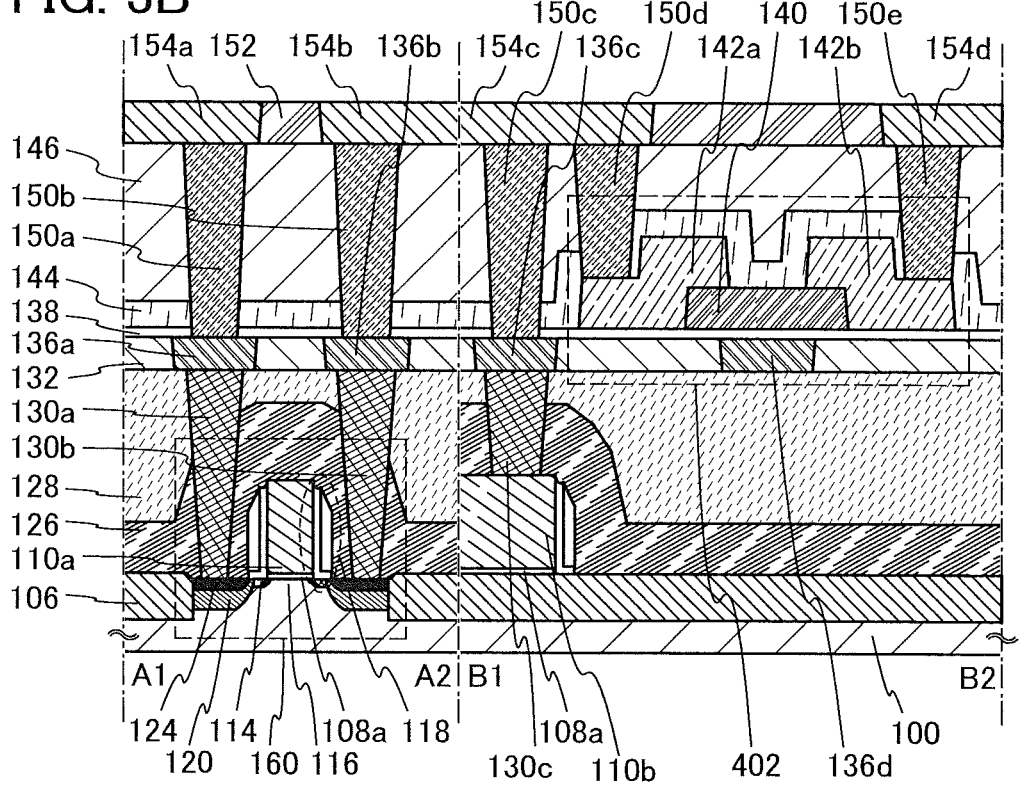

FIGS. 3A and 3B illustrate an example of the structure of the elements of the nonvolatile latch circuit. In FIG. 3A, a transistor 160 using a material other than an oxide semiconductor is provided in a lower portion, and the transistor 402 using an oxide semiconductor is provided in an upper portion. The transistor 160 using a material other than an oxide semiconductor can be used as a transistor included in the first element (D1) 412 and the second element (D2) 413 of the latch portion. Also other elements of the nonvolatile latch circuit can have a structure similar or comparable to that of the transistor 160.

The element such as the capacitor 404 of the nonvolatile latch circuit can be formed using a conductive film, a semiconductor film, an insulating film, or the like included in the transistor 402 or the transistor 160. Note that the transistor 160 and the transistor 402 are n-channel transistors here; alternatively, a p-channel transistor may be used. It is easy to use a p-channel transistor as the transistor 160. FIG. 3B illustrates an example where the connection relationship between the transistor 402 and an electrode (or a wiring) in the lower portion differs from that in FIG. 3A. The structure in FIG. 3A is mainly described below.

The transistor 160 includes a channel formation region 116 provided in a substrate 100 containing a semiconductor material; impurity regions 114 and high-concentration regions 120 (a combination of the impurity regions 114 and the high-concentration regions 120 can simply be referred to as impurity regions) formed with the channel formation region 116 interposed therebetween; a gate insulating layer 108a over the channel formation region 116; a gate electrode 110a over the gate insulating layer 108a; a source or drain electrode 130a electrically connected to the impurity region 114; and a source or drain electrode 130b electrically connected to the impurity region 114 (see FIG. 3A).

Here, sidewall insulating layers 118 are formed on the sides of the gate electrode 110a. Moreover, as seen from a plane, the high-concentration regions 120 are formed in a region of the substrate 100 which does not overlap with the sidewall insulating layers 118, and metal compound regions 124 is in contact with the high-concentration regions 120. Further, element isolation insulating layers 106 are formed over the substrate 100 so as to surround the transistor 160, and an interlayer insulating layer 126 and an interlayer insulating layer 128 are formed to cover the transistor 160.

The source or drain electrode 130a and the source or drain electrode 130b are electrically connected to the metal compound regions 124 through openings formed in the interlayer insulating layer 126 and the interlayer insulating layer 128. In other words, the source or drain electrode 130a and the source or drain electrode 130b are electrically connected to the high-concentration regions 120 and the impurity regions 114 through the metal compound regions 124.

The transistor 402 includes a gate electrode 136d over the interlayer insulating layer 128; a gate insulating layer 138 over the gate electrode 136d; an oxide semiconductor layer 140 over the gate insulating layer 138; and a source or drain electrode 142a and a source or drain electrode 142b which are over the oxide semiconductor layer 140 and electrically connected to the oxide semiconductor layer 140 (see FIG. 3A).

A protective insulating layer 144 is formed over the transistor 402 so as to be in contact with part of the oxide semiconductor layer 140. An interlayer insulating layer 146 is formed over the protective insulating layer 144. Here, the protective insulating layer 144 and the interlayer insulating layer 146 are provided with openings that reach the source or drain electrode 142a and the source or drain electrode 142b. An electrode 150d and an electrode 150e are in contact with the source or drain electrode 142a and the source or drain electrode 142b through the openings.

At the same time as formation of the electrode 150d and the electrode 150e, an electrode 150a, an electrode 150b, and an electrode 150c are formed which are in contact with the electrode 136a, the electrode 136b, and the electrode 136c, respectively, through openings in the gate insulating layer 138, the protective insulating layer 144, and the interlayer insulating layer 146. Note that although the example of a bottom-gate transistor is shown as the transistor 402, the present invention is not limited thereto. A top-gate transistor may also be employed.

Here, the oxide semiconductor layer 140 is preferably an oxide semiconductor layer which is highly purified by sufficiently removing an impurity such as hydrogen and supplying oxygen. Specifically, the hydrogen concentration in the oxide semiconductor layer 140, which is measured by SIMS (secondary ion mass spectroscopy), can be set to less than or equal to $5\times10^{19}/cm^3$, preferably less than or equal to $5\times10^{18}/cm^3$, more preferably less than or equal to $5\times10^{17}/cm^3$, and still more preferably less than $1\times10^{16}/cm^3$.

Note that in the oxide semiconductor layer 140 which is highly purified by sufficiently reducing the hydrogen concentration and supplying oxygen, the carrier concentration is sufficiently low (e.g., less than $1\times10^{12}/cm^3$, preferably less than $1\times10^{11}/cm^3$), as compared to carrier concentration (approximately $1\times10^{14}/cm^3$) in a general silicon wafer (a silicon wafer to which a slight amount of impurity elements such as phosphorus or boron is added).

In this manner, by using an i-type or substantially i-type oxide semiconductor, the transistor 402 which has extremely favorable off-state current characteristics can be obtained. For example, when a drain voltage $V_D$ is +1 V or +10 V and a gate voltage $V_G$ ranges from −5 V to −20 V, the off-state current is less than or equal to $1\times10^{-13}$ A at room temperature. Moreover, the aforementioned transistor has characteristics of a normally-off transistor. Therefore, leakage current, that is, an off-state current at a state where a voltage between a gate electrode and a source electrode is approximately 0 V is much smaller than that of a transistor using silicon. For example, the leakage current per unit channel width is less than or equal to 10 aA/μm at room temperature.

Further, in temperature characteristics, a transistor in which an off-state current can be sufficiently low and an on-state current can be sufficiently high even at a high temperature can be obtained. For example, as $V_G$-$I_D$ characteristics of the transistor 402, data is obtained in a range of −25° C. to 150° C. with low temperature dependence of on-state currents, mobilites, and S values. Furthermore, data is obtained which shows that the off-state current in the aforementioned temperature range is as extremely low as $1\times10^{-13}$ A or less. One of the reasons is that an i-type or substantially i-type oxide semiconductor which is obtained by sufficiently reducing the hydrogen concentration to be highly purified and has extremely low carrier concentration is used as the oxide semiconductor.

When the oxide semiconductor layer 140 which is highly purified by sufficiently reducing the hydrogen concentration is used and the off-state current of the transistor 402 is reduced, a semiconductor device having a novel structure can be realized.

An insulating layer 152 is formed over the interlayer insulating layer 146. An electrode 154a, an electrode 154b, an electrode 154c, and an electrode 154d are formed so as to be embedded in the insulating layer 152. Here, the electrode 154a is in contact with the electrode 150a, the electrode 154b is in contact with the electrode 150b, the electrode 154c is in contact with the electrode 150c and the electrode 150d, and the electrode 154d is in contact with the electrode 150e.

That is, the source or drain electrode 142a of the transistor 402 is electrically connected to another element (e.g., the transistor using a material other than an oxide semiconductor) through an electrode 130c, the electrode 136c, the electrode 150c, the electrode 154c, and the electrode 150d (see FIG. 3A). In addition, the source or drain electrode 142b of the transistor 402 is electrically connected to another element through the electrode 150e and the electrode 154d. Note that the structure of connection electrodes (such as the electrode 130c, the electrode 136c, the electrode 150c, the electrode 154c, and the electrode 150d) is not limited to the aforementioned structure, and appropriate addition, omission, or the like is possible.

FIG. 3B illustrates the case where the connection relationship of the source or drain electrode 142a of the transistor 402 differs from that in FIG. 3A. Specifically, the source or drain electrode 142a is electrically connected to an electrode 110b through the electrode 130c, the electrode 136c, the electrode 150c, the electrode 154c, and the electrode 150d. Here, the electrode 110b is formed in a manner similar to that of the gate electrode 110a. The electrode 110b may be a component of the transistor or may be part of a wiring or the like. Note that the structure of connection electrodes (such as the electrode 130c, the electrode 136c, the electrode 150c, the electrode 154c, and the electrode 150d) is not limited to the aforementioned structure, and appropriate addition, omission, or the like is possible.

Although the two examples of typical connection relationships are given above, an embodiment of the invention disclosed herein is not limited to these examples. For example, the structure illustrated in FIG. 3A and the structure illustrated in FIG. 3B may be combined. Furthermore, the gate electrode 110a of the transistor 160 and the source or drain electrode 142a of the transistor 402 may be electrically connected to each other.

<Manufacturing Method of Elements of Nonvolatile Latch Circuit>

Next, an example of a manufacturing method of the elements of the nonvolatile latch circuit will be described. First, a manufacturing method of the transistor 160 will be described below with reference to FIGS. 4A to 4H, and then a manufacturing method of the transistor 402 will be described below with reference to FIGS. 5A to 5G and FIGS. 6A to 6D. With the manufacturing method described below, the elements of the nonvolatile latch circuit can be manufactured. Note that FIGS. 4A to 4H illustrate only a cross section corresponding to A1-A2 in FIG. 3A. In addition, FIGS. 5A to 5G and FIGS. 6A to 6D illustrate cross sections corresponding to A1-A2 and B1-B2 in FIG. 3A.

<Manufacturing Method of Transistor in Lower Portion>

Figure 4A:
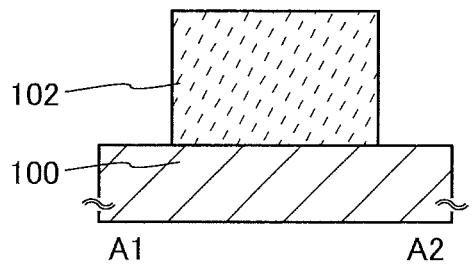
FIGS. 4A to 4H illustrate an example of a manufacturing method of an element of a nonvolatile latch circuit.

First, the substrate 100 containing a semiconductor material is prepared (see FIG. 4A). A single crystal semiconductor substrate or a polycllistalline semiconductor substrate of silicon, carbon silicon, or the like; a compound semiconductor substrate of silicon germanium or the like; an SOI substrate, or the like can be used as the substrate 100 containing a semiconductor material. Here, an example of the case where a single crystal silicon substrate is used as the substrate 100 containing a semiconductor material is described.

Note that in general, the term "SOI substrate" means a substrate having a silicon semiconductor layer over its insulating surface. In this specification, the term "SOI substrate" also means a substrate having a semiconductor layer using a material other than silicon over its insulating surface. That is, a semiconductor layer included in the "SOI substrate" is not limited to a silicon semiconductor layer. Examples of the SOI substrate include a substrate which has a semiconductor layer over its insulating substrate such as a glass substrate.

A protective layer 102 that serves as a mask for forming an element isolation insulating layer is formed over the substrate 100 (see FIG. 4A). An insulating layer of silicon oxide, silicon nitride, silicon nitride oxide, or the like, for example, can be used as the protective layer 102. Note that before and after this step, an impurity element imparting n-type conductivity or an impurity element imparting p-type conductivity can be added to the substrate 100 in order to control the threshold voltage of the transistor. As the impurity imparting n-type conductivity, phosphorus, arsenic, or the like can be used, for example, when the semiconductor material contained in the substrate 100 is silicon. As the impurity imparting p-type conductivity, boron, aluminum, gallium, or the like can be used, for example.

Next, with the use of the aforementioned protective layer 102 as a mask, part of the substrate 100 in a region which is not covered with the protective layer 102 (an exposed region) is removed by etching. Thus, an isolated semiconductor region 104 is formed (see FIG. 4B). As the etching, dry etching is preferably performed, but wet etching can be performed. An etching gas and an etchant can be selected as appropriate depending on a material of layers to be etched.

Figure 4B:
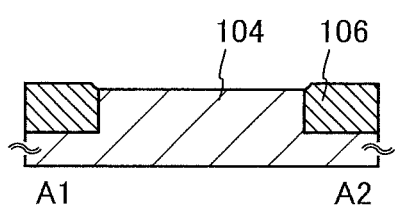

Next, an insulating layer is formed to cover the semiconductor region 104 and a region of the insulating layer which overlaps with the semiconductor region 104 is selectively removed, so that the element isolation insulating layers 106 are formed (see FIG. 4B). The insulating layer is formed using silicon oxide, silicon nitride, silicon nitride oxide, or the like. Methods for removing the insulating layer include etching, polishing such as CMP, and the like, and any of these are applicable. Note that after the semiconductor region 104 is formed or after the element isolation insulating layers 106 are formed, the protective layer 102 is removed.

Next, an insulating layer is formed over the semiconductor region 104, and a layer containing a conductive material is formed over the insulating layer.

Because the insulating layer serves as a gate insulating layer later, the insulating layer preferably has a single-layer structure or a stacked structure using a film containing silicon oxide, silicon nitride oxide, silicon nitride, hafnium oxide, aluminum oxide, tantalum oxide, or the like formed with a CVD method, a sputtering method, or the like. Alternatively, the insulating layer can be formed by oxidizing or nitriding a surface of the semiconductor region 104 by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer; the insulating layer can be formed in the range of 1 nm to 100 nm inclusive, for example.

The layer containing a conductive material can be formed using a metal material such as aluminum, copper, titanium, tantalum, or tungsten. Alternatively, the layer containing a conductive material may be formed using a semiconductor material such as polycrystalline silicon containing an impurity element imparting conductivity. There is no particular limitation on the film formation method of the layer containing a conductive material; a variety of film formation methods such as an evaporation method, a CVD method, a sputtering method, and a spin coating method can be employed. Note that in this embodiment, an example of the case where the layer containing a conductive material is formed using a metal material is described.

Figure 4C:
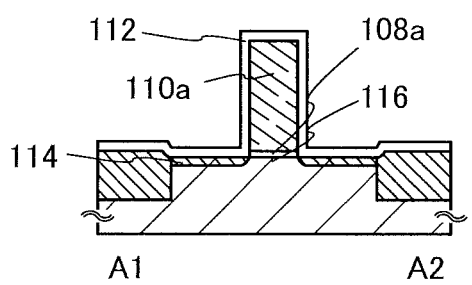

After that, the insulating layer and the layer containing a conductive material are selectively etched, so that the gate insulating layer 108a and the gate electrode 110a are formed (see FIG. 4C).

Next, an insulating layer 112 that covers the gate electrode 110a is formed (see FIG. 4C). Then, the impurity regions 114 with a shallow junction depth are formed by adding phosphorus (P), arsenic (As), or the like to the semiconductor region 104 (see FIG. 4C). Note that phosphorus or arsenic is added here in order to form an n-channel transistor; however, an impurity element such as boron (B) or aluminum (Al) may be added in the case of forming a p-channel transistor.

With the formation of the impurity regions 114, the channel formation region 116 is formed in the semiconductor region 104 below the gate insulating layer 108a (see FIG. 4C). Here, the concentration of the impurity added can be set as appropriate; the concentration is preferably increased when the size of a semiconductor element is extremely decreased. The step in which the impurity regions 114 are formed after the formation of the insulating layer 112 is employed here; alternatively, the insulating layer 112 may be formed after the formation of the impurity regions 114.

Figure 4D:
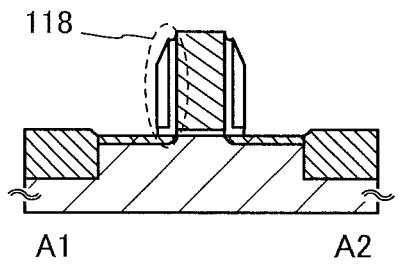
Figure 4E:
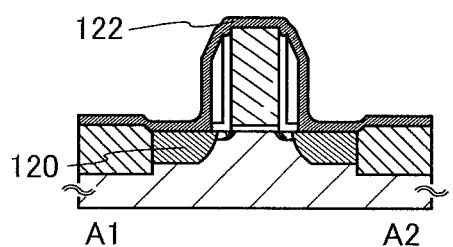
Figure 4F:
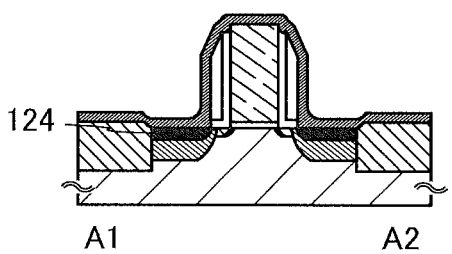

Next, the sidewall insulating layers 118 are formed (see FIG. 4D). When, as the sidewall insulating layers 118, an insulating layer is formed to cover the insulating layer 112 and then subjected to highly anisotropic etching, the sidewall insulating layers 118 can be formed in a self-aligned manner. At this time, it is preferable to etch the insulating layer 112 partly so that a top surface of the gate electrode 110a and top surfaces of the impurity regions 114 are exposed.

Then, an insulating layer is formed to cover the gate electrode 110a, the impurity regions 114, the sidewall insulating layers 118, and the like. Next, phosphorus (P), arsenic (As), or the like is added to regions in which the insulating layer is in contact with the impurity regions 114, so that the high-concentration impurity regions 120 are formed. After that, the insulating layer is removed, and a metal layer 122 is formed to cover the gate electrode 110a, the sidewall insulating layers 118, the high-concentration impurity regions 120, and the like (see FIG. 4E).

A variety of film formation methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 4F). Note that when the gate electrode 110a is formed using polycrystalline silicon or the like, a metal compound region is also formed in a region of the gate electrode 110a in contact with the metal layer 122.

As the heat treatment, irradiation with a flash lamp can be employed, for example. Although it is needless to say that another heat treatment method may be used, a method with which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 4G:
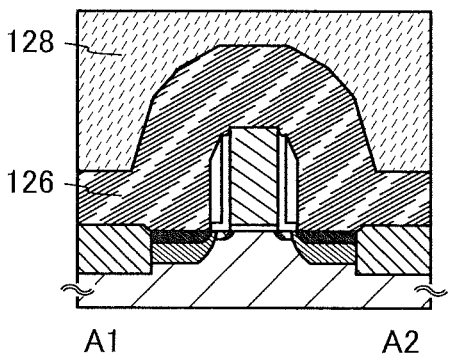

Then, the interlayer insulating layer 126 and the interlayer insulating layer 128 are formed to cover the components formed in the aforementioned steps (see FIG. 4G). The interlayer insulating layer 126 and the interlayer insulating layer 128 can be formed using a material including an inorganic insulating material such as silicon oxide, silicon nitride oxide, silicon nitride, hafnium oxide, aluminum oxide, or tantalum oxide. Moreover, the interlayer insulating layer 126 and the interlayer insulating layer 128 can also be formed using an organic insulating material such as polyimide or acrylic. Note that a two-layer structure of the interlayer insulating layer 126 and the interlayer insulating layer 128 is employed here; however, the structure of an interlayer insulating layer is not limited to this structure. After the formation of the interlayer insulating layer 128, a surface of the interlayer insulating layer 128 is preferably planarized with CMP, etching, or the like.

Figure 4H:
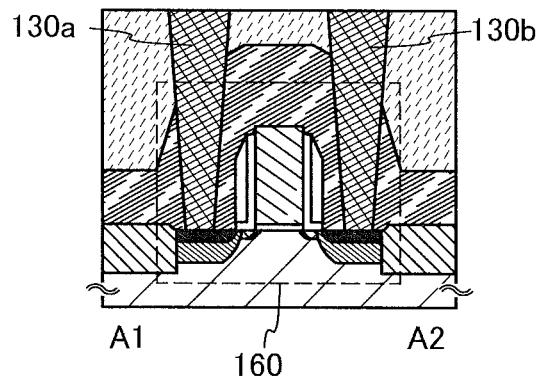

Then, openings that reach the metal compound regions 124 are formed in the interlayer insulating layers, and the source or drain electrode 130a and the source or drain electrode 130b are formed in the openings (see FIG. 4H). The source or drain electrode 130a and the source or drain electrode 130b can be formed in such a manner that, for example, a conductive layer is formed in a region including the openings with a PVD method, a CVD method, or the like and then part of the conductive layer is removed by etching, CMP, or the like.

Note that in the case where the source or drain electrode 130a and the source or drain electrode 130b are formed by removing part of the conductive layer, the process is preferably performed so that the surfaces are planarized. For example, when a thin titanium film or a thin titanium nitride film is formed in a region including the openings and then a tungsten film is formed to be embedded in the openings, excess tungsten, titanium, titanium nitride, or the like is removed and the planarity of the surface can be improved by subsequent CMP. When the surface including the source or drain electrode 130a and the source or drain electrode 130b is planarized in such a manner, an electrode, a wiring, an insulating layer, a semiconductor layer, and the like can be favorably formed in later steps.

There is no particular limitation on a material used for the source or drain electrode 130a and the source or drain electrode 130b, and a variety of conductive materials can be used. For example, a conductive material such as molybdenum, titanium, chromium, tantalum, tungsten, aluminum, copper, neodymium, or scandium can be used. In addition, although only the source or drain electrode 130a and the source or drain electrode 130b which are in contact with the metal compound regions 124 are illustrated here, the electrode 130c and the like in FIGS. 3A and 3B can also be formed together in this step.

Specifically, it is possible to employ a method, for example, in which a thin titanium film is formed in a region including the openings with a PVD method and a thin titanium nitride film is formed with a CVD method, and then, a tungsten film is formed to be embedded in the openings. Here, the titanium film formed with a PVD method has a function of reducing an oxide film which might be formed on the surface of the metal compound regions to decrease the contact resistance with the metal compound regions. The titanium nitride film formed after the formation of the titanium film has a barrier function of preventing diffusion of the conductive material. A copper film may be formed with a plating method after the formation of the barrier film of titanium, titanium nitride, or the like. Note that not only a so-called single damascene method but also a dual damascene method may be employed.

Through the aforementioned steps, the transistor 160 using the substrate 100 containing a semiconductor material is formed. Note that an electrode, a wiring, an insulating layer, or the like may be further formed after the aforementioned steps. When the wirings have a multi-layer structure of a stacked structure including an interlayer insulating layer and a conductive layer, a highly integrated semiconductor device can be provided.

<Manufacturing Method of Transistor in Upper Portion>

Next, steps for manufacturing the transistor 402 over the interlayer insulating layer 128 will be described with reference to FIGS. 5A to 5G and FIGS. 6A to 6D. Note that FIGS. 5A to 5G and FIGS. 6A to 6D illustrate steps for manufacturing electrodes, the transistor 402, and the like over the interlayer insulating layer 128; therefore, the transistor 160 and the like placed below the transistor 402 are omitted.

Figure 5A:
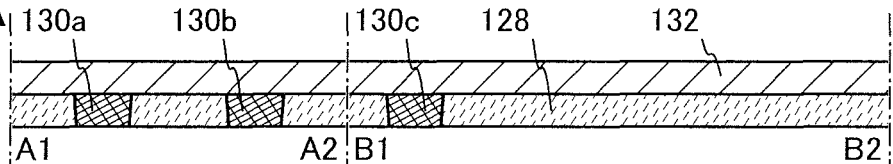
FIGS. 5A to 5G illustrate an example of a manufacturing method of an element of a nonvolatile latch circuit.
Figure 5B:
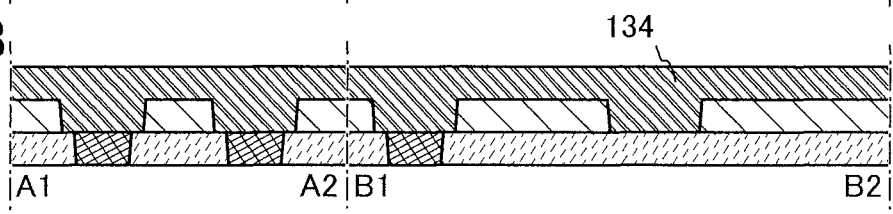

First, the insulating layer 132 is formed over the interlayer insulating layer 128, the source or drain electrode 130a, the source or drain electrode 130b, and the electrode 130c (see FIG. 5A). Next, openings that reach the source or drain electrode 130a, the source or drain electrode 130b, and the electrode 130c are formed in the insulating layer 132. Then, a conductive layer 134 is formed to be embedded in the openings (see FIG. 5B). After that, part of the conductive layer 134 is removed by etching, CMP, or the like, so that the insulating layer 132 is exposed and the electrode 136a, the electrode 136b, the electrode 136c, and the gate electrode 136d are formed (see FIG. 5C).

The insulating layer 132 can be formed with a PVD method, a CVD method, or the like. The insulating layer 132 can be formed using a material containing an inorganic insulating material such as silicon oxide, silicon nitride oxide, silicon nitride, hafnium oxide, aluminum oxide, or tantalum oxide.

The openings can be formed in the insulating layer 132 with a method such as etching using a mask. The mask can be formed with a method such as light exposure using a photomask. Either wet etching or dry etching may be used as the etching; dry etching is preferably used in terms of microfabrication.

The conductive layer 134 can be formed with a film formation method such as a PVD method or a CVD method. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example (see FIG. 5B).

More specifically, it is possible to employ a method, for example, in which a thin titanium film is formed in a region including the openings with a PVD method and a thin titanium nitride film is formed with a CVD method, and then, a tungsten film is formed to be embedded in the openings. Here, the titanium film formed with a PVD method has a function of reducing an oxide film which might be formed on the surface of lower electrodes (here, the source or drain electrode 130a, the source or drain electrode 130b, the electrode 130c, and the like) to decrease the contact resistance with lower electrodes.

The titanium nitride film formed after the formation of the titanium film has a barrier function of preventing diffusion of the conductive material. A copper film may be formed with a plating method after the formation of the barrier film of titanium, titanium nitride, or the like. Note that not only a so-called single damascene method but also a dual damascene method may be employed.

Figure 5C:
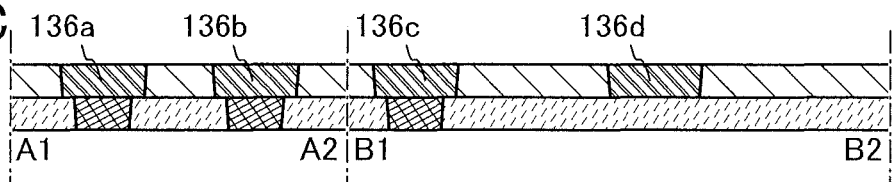

After the conductive layer 134 is formed, part of the conductive layer 134 is removed by etching, CMP, or the like, so that the insulating layer 132 is exposed and the electrode 136a, the electrode 136b, the electrode 136c, and the gate electrode 136d can be formed (see FIG. 5C). Note that when the electrode 136a, the electrode 136b, the electrode 136c, and the gate electrode 136d are formed by removing part of the conductive layer 134, the process is preferably performed so that the surfaces are planarized. When the surfaces of the insulating layer 132, the electrode 136a, the electrode 136b, the electrode 136c, and the gate electrode 136d are planarized in such a manner, an electrode, a wiring, an insulating layer, a semiconductor layer, and the like can be favorably formed in later steps.

Figure 5D:
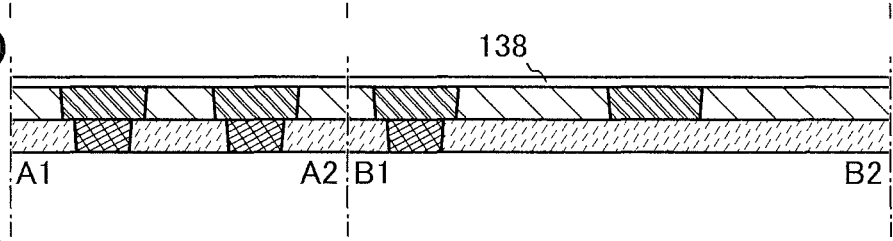

Next, the gate insulating layer 138 is formed to cover the insulating layer 132, the electrode 136a, the electrode 136b, the electrode 136c, and the gate electrode 136d (see FIG. 5D). The gate insulating layer 138 can be formed with a CVD method, a sputtering method, or the like. The gate insulating layer 138 is preferably formed using silicon oxide, silicon nitride, silicon oxynitride, silicon nitride oxide, aluminum oxide, hafnium oxide, tantalum oxide, or the like. Note that the gate insulating layer 138 may have a single-layer structure or a stacked structure.

For example, the gate insulating layer 138 can be formed using silicon oxynitride with a plasma CVD method using silane ($SiH_4$), oxygen, and nitrogen as a source gas. There is no particular limitation on the thickness of the gate insulating layer 138; the gate insulating layer 138 can have a thickness of 10 nm to 500 nm inclusive, for example. In the case of employing a stacked structure, for example, the gate insulating layer 138 is preferably a stack of a first gate insulating layer with a thickness of 50 nm to 200 nm inclusive, and a second gate insulating layer with a thickness of 5 nm to 300 nm inclusive over the first gate insulating layer.

If hydrogen, water, or the like is contained in the gate insulating layer 138, hydrogen may enter the oxide semiconductor layer or extract oxygen from the oxide semiconductor layer, whereby characteristics of the transistor might be degraded. Therefore, it is preferable to form the gate insulating layer 138 so as to contain hydrogen or water as little as possible.

In the case where a sputtering method or the like is employed, for example, it is preferable that the gate insulating layer 138 be formed in a state where moisture in the treatment chamber is removed. In order to remove moisture in the treatment chamber, an entrapment vacuum pump such as a cryopump, an ion pump, or a titanium sublimation pump is preferably used. Alternatively, a turbo pump provided with a cold trap may be used. Since hydrogen, water, or the like is sufficiently removed from the treatment chamber evacuated with a cryopump or the like, the concentration of an impurity contained in the gate insulating layer 138 can be reduced.

When the gate insulating layer 138 is formed, it is preferable to use a high-purity gas in which an impurity such as hydrogen or water is reduced to a concentration of a few ppm or less (preferably, a few ppb or less).

Note that an i-type or substantially i-type oxide semiconductor which is obtained by removing an impurity (a highly purified oxide semiconductor) is quite susceptible to the interface level and the interface charge; therefore, when such an oxide semiconductor is used for an oxide semiconductor layer, the interface with the gate insulating layer is important. In other words, the gate insulating layer 138 that is to be in contact with a highly purified oxide semiconductor layer needs to have high quality.

For example, the gate insulating layer 138 is preferably formed with a high-density plasma CVD method using a microwave (frequency: 2.45 GHz) because the gate insulating layer 138 can be dense and have high withstand voltage and high quality. When a highly purified oxide semiconductor layer and a high-quality gate insulating layer are in close contact with each other, the interface level can be reduced and favorable interface characteristics can be obtained.

It is needless to say that, even when a highly purified oxide semiconductor layer is used, another method such as a sputtering method or a plasma CVD method can be employed as long as a high-quality insulating layer can be formed as the gate insulating layer 138. Moreover, it is possible to use an insulating layer whose film quality and interface characteristics with the oxide semiconductor layer are improved with heat treatment performed after the formation of the gate insulating layer 138. In any case, an insulating layer that has favorable film quality as the gate insulating layer 138 and can reduce interface level density with an oxide semiconductor layer to form a favorable interface is formed as the gate insulating layer 138.

Figure 5E:
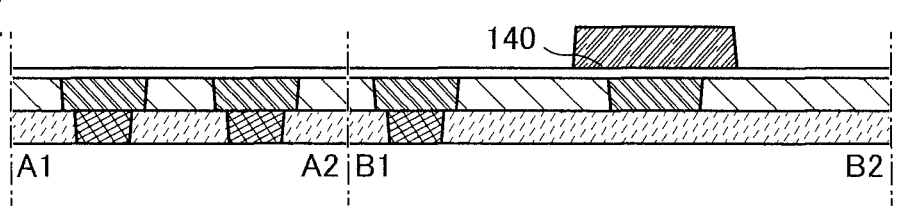

Next, an oxide semiconductor layer is formed over the gate insulating layer 138 and processed with a method such as etching using a mask, so that the island-shaped oxide semiconductor layer 140 is formed (see FIG. 5E).

As the oxide semiconductor layer, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor; a Sn—O-based oxide semiconductor; or a Zn—O-based oxide semiconductor which are one-component metal oxides. In addition, the aforementioned oxide semiconductors may contain $SiO_2$.

As the oxide semiconductor layer, a thin film containing a material represented by $InMO_3(ZnO)_m$ (m>0) can be used. Here, M represents one or more of metal elements selected from Ga, Al, Mn, and Co. For example, M can be Ga, Ga and Al, Ga and Mn, Ga and Co, or the like.

In this embodiment, as the oxide semiconductor layer, an amorphous oxide semiconductor layer is formed with a sputtering method using an In—Ga—Zn—O-based metal oxide target. Note that since crystallization of an amorphous oxide semiconductor layer can be suppressed by adding silicon to the amorphous oxide semiconductor layer, an oxide semiconductor layer may be formed, for example, using a target containing $SiO_2$ of 2 wt % to 10 wt % inclusive.

As the metal oxide target used for forming an oxide semiconductor layer with a sputtering method, for example, a metal oxide target having a composition ratio of $In_2O_3$:$Ga_2O_3$:$ZnO$=1:1:1 [molar ratio] can be used. Furthermore, a metal oxide target having a composition ratio of $In_2O_3$:$Ga_2O_3$:$ZnO$=1:1:2 [molar ratio] or a metal oxide target having a composition ratio of $In_2O_3$:$Ga_2O_3$:$ZnO$=1:1:4 [molar ratio] can also be used. The filling rate of a metal oxide target is 90% to 100% inclusive, preferably greater than or equal to 95% (e.g., 99.9%). A dense oxide semiconductor layer is formed by using a metal oxide target with a high filling rate.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use, for example, a high-purity gas atmosphere from which an impurity such as hydrogen, water, a hydroxyl group, or hydride is removed to a concentration of a few ppm or less (preferably, a few ppb or less).

At the time of forming the oxide semiconductor layer, the substrate is held in a treatment chamber kept under reduced pressure and the substrate is heated to a temperature of 100° C. to 600° C. inclusive, preferably 200° C. to 400° C. inclusive. The oxide semiconductor layer is formed while the substrate is heated, so that the concentration of an impurity contained in the oxide semiconductor layer can be reduced. Moreover, damage of the semiconductor layer due to sputtering is reduced. Then, a sputtering gas from which hydrogen and water are removed is introduced into the treatment chamber while moisture in the treatment chamber is removed, whereby the oxide semiconductor layer is formed using metal oxide as a target.

An entrapment vacuum pump is preferably used in order to remove moisture in the treatment chamber. For example, a cryopump, an ion pump, or a titanium sublimation pump can be used. An evacuation unit may be a turbo pump provided with a cold trap. In the film formation chamber that is evacuated with the cryopump, a hydrogen atom, a compound containing a hydrogen atom such as water ($H_2O$) (and more preferably also a compound containing a carbon atom), and the like are removed, whereby the concentration of an impurity contained in the oxide semiconductor layer formed in the film formation chamber can be reduced.

The oxide semiconductor layer can be formed under the following conditions, for example: the distance between a substrate and the target is 100 mm; the pressure is 0.6 Pa; the direct-current (DC) power supply is 0.5 kW; and the atmosphere is oxygen (the proportion of the oxygen flow is 100%). Note that it is preferable to use a pulsed direct-current (DC) power source because dust can be reduced and the thickness distribution can be reduced. The thickness of the oxide semiconductor layer is 2 nm to 200 nm inclusive, preferably 5 nm to 30 nm inclusive. Note that the appropriate thickness of the oxide semiconductor layer differs depending on the oxide semiconductor material to be used; therefore, the thickness may be determined in accordance with the material to be used.

Note that before the oxide semiconductor layer is formed with a sputtering method, reverse sputtering is preferably performed in which plasma is generated with an argon gas introduced, so that dust on the surface of the gate insulating layer 138 is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which a high-frequency voltage is applied to the surface to be processed under an argon atmosphere so that plasma is generated near a substrate. Note that an atmosphere of nitrogen, helium, oxygen, or the like may be used instead of an argon atmosphere.

As an etching method for the oxide semiconductor layer, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)) or the like. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid; ammonia peroxide mixture (a mixture of ammonia, water, and a hydrogen peroxide solution); or the like can be used. An etchant such as ITO07N (produced by KANTO CHEMICAL CO., INC.) may also be used.

Then, first heat treatment is preferably performed on the oxide semiconductor layer. The oxide semiconductor layer can be dehydrated or dehydrogenated through the first heat treatment. The temperature of the first heat treatment is 300° C. to 800° C. inclusive, preferably 400° C. to 700° C. inclusive, more preferably 450° C. to 700° C. inclusive, and still more preferably 550° C. to 700° C. inclusive.

The oxide semiconductor layer can be dehydrated or dehydrogenated when the first heat treatment is performed at a temperature of 350° C. or higher, so that the hydrogen concentration in the oxide semiconductor layer can be reduced. In addition, when the first heat treatment is performed at a temperature of 450° C. or higher, the hydrogen concentration in the oxide semiconductor layer can be further reduced. Moreover, when the first heat treatment is performed at a temperature of 550° C. or higher, the hydrogen concentration in the oxide semiconductor layer can be still further reduced. For example, the substrate is introduced into an electric furnace in which a resistance heating element or the like is used and the oxide semiconductor layer 140 is subjected to heat treatment at 450° C. for 1 hour under a nitrogen atmosphere. The oxide semiconductor layer 140 is not exposed to the air during the heat treatment so that the entry of water or hydrogen can be prevented.

The heat treatment apparatus is not limited to the electric furnace and can be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used.

An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The substrate is put in an inert gas atmosphere that has been heated to a high temperature of 650° C. to 700° C., heated for several minutes, and taken out of the inert gas atmosphere. The GRTA process enables high-temperature heat treatment for a short time. Moreover, the GRTA process can be employed even when the temperature exceeds the strain point of the substrate because it is heat treatment for a short time. For example, in the case where an SOI substrate including a substrate with relatively low heat resistance, such as a glass substrate, is used, shrinkage of the substrate becomes a problem at a temperature higher than the upper temperature limit (strain point) but does not in the case where heat treatment is performed for a short time.

Note that as the inert gas atmosphere under which the first heat treatment is performed, it is preferable to employ an atmosphere that contains nitrogen or a rare gas (e.g., helium, neon, or argon) as its main component and does not contain water, hydrogen, or the like. For example, the purity of nitrogen or a rare gas such as helium, neon, or argon introduced into the heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

Note that the inert gas atmosphere may be changed during the process to an atmosphere including oxygen. For example, in the case where an electrical furnace is used in the first heat treatment, an atmosphere can be changed when a heat treatment temperature falls. For example, the heat treatment can be performed (at a constant temperature) under an atmosphere of an inert gas such as a rare gas (e.g., helium, neon, or argon) or nitrogen, and the atmosphere can be switched to an atmosphere containing oxygen when the heat treatment temperature falls. As the atmosphere containing oxygen, an oxygen gas or a mixed gas of an oxygen gas and a nitrogen gas can be used. Also in the case where the atmosphere containing oxygen is employed, it is preferable that the atmosphere do not contain water, hydrogen, or the like. Alternatively, the purity of the oxygen gas or the nitrogen used is preferably greater than or equal to 6N (99.9999%), more preferably greater than or equal to 7N (99.99999%) (that is, the impurity concentration is less than or equal to 1 ppm, preferably less than or equal to 0.1 ppm). This is because defects caused by oxygen deficiency can be reduced by performing the first heat treatment under an atmosphere containing oxygen.

In some cases, the oxide semiconductor layer is crystallized to be microcrystalline or polycrystalline, which depends on the conditions of the first heat treatment or the material of the oxide semiconductor layer. For example, in some cases, the oxide semiconductor layer becomes a microcrystalline oxide semiconductor layer having a degree of crystallization of 90% or more, or 80% or more. Further, in some cases, the oxide semiconductor layer may be an amorphous oxide semiconductor layer containing no crystalline component, which depends on the conditions of the first heat treatment or the material of the oxide semiconductor layer.

Furthermore, in some cases, the oxide semiconductor layer becomes a layer in which a microcrystal (with a grain size of 1 nm to 20 nm inclusive, typically 2 nm to 4 nm inclusive) is mixed in an amorphous oxide semiconductor (e.g., a surface of the oxide semiconductor layer).

The electric characteristics of the oxide semiconductor layer can be changed by aligning microcrystals in an amorphous semiconductor. For example, when the oxide semiconductor layer is formed using an In—Ga—Zn—O-based metal oxide target, the electric characteristics of the oxide semiconductor layer can be changed by formation of a microcrystalline region in which crystal grains of $In_2Ga_2ZnO_7$ with electrical anisotropy are aligned.

For example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline region has a function of suppressing entry of an impurity such as water or hydrogen into the oxide semiconductor layer.

Note that the oxide semiconductor layer including the microcrystalline region can be formed by heating the surface of the oxide semiconductor layer by a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the aforementioned heat treatment, which has an effect of dehydration or dehydrogenation on the oxide semiconductor layer 140, can also be referred to as dehydration treatment, dehydrogenation treatment, or the like. The dehydration treatment or dehydrogenation treatment can be performed, for example, after the oxide semiconductor layer is formed, after a source or drain electrode is stacked over the oxide semiconductor layer 140, or after a protective insulating layer is formed over the source or drain electrode. Such dehydration treatment or dehydrogenation treatment may be performed once or plural times.

Figure 5F:
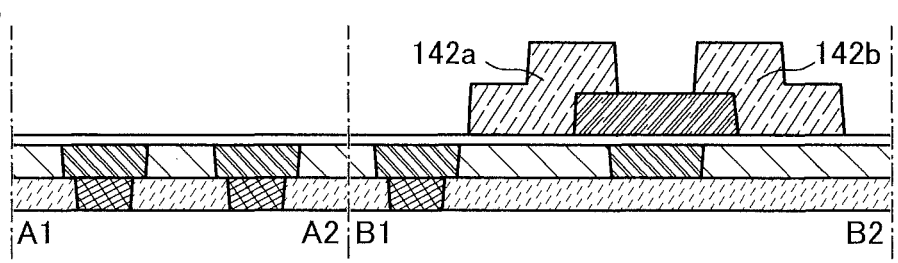

Next, the source or drain electrode 142*a* and the source or drain electrode 142*b* are formed so as to be in contact with the oxide semiconductor layer 140 (see FIG. 5F). The source or drain electrode 142*a* and the source or drain electrode 142*b* can be formed in such a manner that a conductive layer is formed to cover the oxide semiconductor layer 140 and then is selectively etched.

The conductive layer can be formed with a PVD (Physical Vapor Deposition) method such as a sputtering method or a CVD (Chemical Vapor Deposition) method such as a plasma CVD method. As a material for the conductive layer, an element selected from aluminum, chromium, copper, tantalum, titanium, molybdenum, and tungsten; an alloy containing any of these elements as its component; or the like can be used. Moreover, one or more of materials selected from manganese, magnesium, zirconium, beryllium, and yttrium may be used. It is also possible to use aluminum combined with one or more of elements selected from titanium, tantalum, tungsten, molybdenum, chromium, neodymium, and scandium.

The conductive layer may be formed using an oxide conductive film. As the oxide conductive film, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

In that case, as compared to a material for the oxide semiconductor layer 140, a material whose conductivity is high or whose resistivity is low is preferably used for the oxide conductive film. The conductivity of the oxide conductive film can be increased by an increase in the carrier concentration. The carrier concentration in the oxide conductive film can be increased by an increase in the hydrogen concentration. Further, the carrier concentration in the oxide conductive film can be increased by an increase in oxygen deficiency.

The conductive layer can have a single-layer structure or a stacked structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order. Here, a three-layer structure of a titanium film, an aluminum film, and a titanium film is employed.

Note that an oxide conductive layer may be formed between the oxide semiconductor layer 140 and the conductive layer. The oxide conductive layer and the conductive layer can be successively formed. By providing such an oxide conductive layer, the resistance of the source region or the drain region can be reduced, so that the transistor can operate at high speed.

Next, the source or drain electrode 142a and the source or drain electrode 142b are formed by selectively etching the conductive layer (see FIG. 5F). Ultraviolet light, KrF laser light, or ArF laser light is preferably used for light exposure at the time of forming a mask used for etching.

The channel length (L) of the transistor is determined by a distance between a lower edge portion of the source or drain electrode 142a and a lower edge portion of the source or drain electrode 142b. Note that in the case where light exposure is performed so that the channel length (L) is less than 25 nm, light exposure for forming a mask is performed with extreme ultraviolet rays whose wavelength is extremely short of several nanometers to several tens of nanometers. The resolution of light exposure with extreme ultraviolet rays is high and the depth of focus is large. For these reasons, it is possible to design a mask so that the channel length (L) of the transistor to be formed later is less than 25 nm, that is, in the range of 10 nm to 1000 nm inclusive, and the circuit can operate at higher speed. Moreover, the off-state current is extremely low, which prevents an increase in power consumption.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Note that plasma treatment is preferably performed with the use of a gas such as $N_2O$, $N_2$, or Ar after the aforementioned step. This plasma treatment removes water or the like attached to an exposed surface of the oxide semiconductor layer. Plasma treatment may be performed using a mixed gas of oxygen and argon.

Figure 5G:
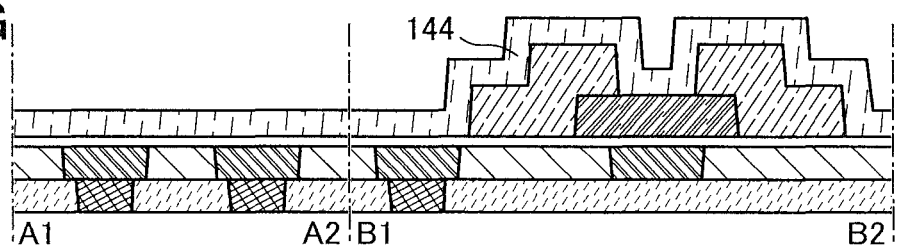

Next, the protective insulating layer 144 is formed in contact with part of the oxide semiconductor layer 140 without exposure to the air (see FIG. 5G).

The protective insulating layer 144 can be formed with a method such as a sputtering method, with which impurities such as water and hydrogen are prevented from being mixed to the protective insulating layer 144, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a stacked structure. The substrate temperature at the time of forming the protective insulating layer 144 is preferably room temperature to 300° C. inclusive. The atmosphere for forming the protective insulating layer 144 is preferably a rare gas (typically argon) atmosphere, an oxygen atmosphere, or a mixed atmosphere containing a rare gas (typically argon) and oxygen.

If hydrogen is contained in the protective insulating layer 144, the hydrogen may enter the oxide semiconductor layer or extract oxygen in the oxide semiconductor layer, whereby the resistance of the oxide semiconductor layer on the backchannel side might be decreased and a parasitic channel might be formed. Therefore, it is important not to use hydrogen in forming the protective insulating layer 144 so that the oxide insulating layer 144 contains hydrogen as little as possible.

Moreover, the protective insulating layer 144 is preferably formed while water in the treatment chamber is removed, in order that hydrogen, a compound containing a hydroxyl group, or moisture is not contained in the oxide semiconductor layer 140 and the protective insulating layer 144.

An entrapment vacuum pump is preferably used in order to remove moisture in the treatment chamber. For example, a cryopump, an ion pump, or a titanium sublimation pump is preferably used. An evacuation unit may be a turbo pump provided with a cold trap. In the film formation chamber that is evacuated with the cryopump, a hydrogen atom and a compound containing a hydrogen atom, such as water ($H_2O$), are removed, for example; thus, the concentration of an impurity contained in the protective insulating layer 144 formed in the film formation chamber can be reduced.

As a sputtering gas used at the time of forming the protective insulating layer 144, it is preferable to use a high-purity gas from which an impurity such as hydrogen, water, a compound containing a hydroxyl group, or hydride is removed to a concentration of 1 ppm or less (preferably, 1 ppb or less).

Next, second heat treatment is preferably performed under an inert gas atmosphere or an oxygen gas atmosphere (preferably, at 200° C. to 400° C. inclusive, for example, at 250° C. to 350° C. inclusive). For example, the second heat treatment is performed at 250° C. for 1 hour under a nitrogen atmosphere. The second heat treatment can reduce variation in electric characteristics of the transistor.

Furthermore, heat treatment may be performed at 100° C. to 200° C. inclusive for 1 hour to 30 hours inclusive in the air. This heat treatment may be performed at a fixed heating temperature; alternatively, the following change in the heating temperature may be repeatedly performed plural times: the heating temperature is increased from room temperature to a temperature of 100° C. to 200° C. inclusive and then decreased to room temperature. This heat treatment may be performed under a reduced pressure before the protective insulating layer is formed. The heat treatment time can be shortened under the reduced pressure. This heat treatment may be performed instead of the second heat treatment or may be performed before or after the second heat treatment.

Figure 6A:
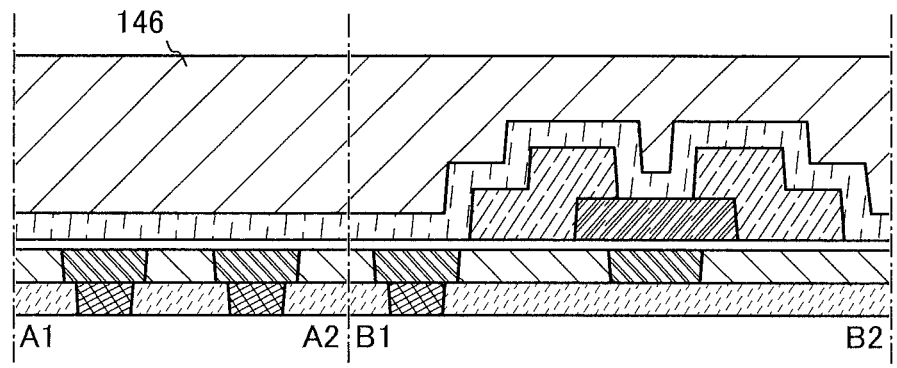
FIGS. 6A to 6D illustrate an example of a manufacturing method of an element of a nonvolatile latch circuit.
Figure 6B:
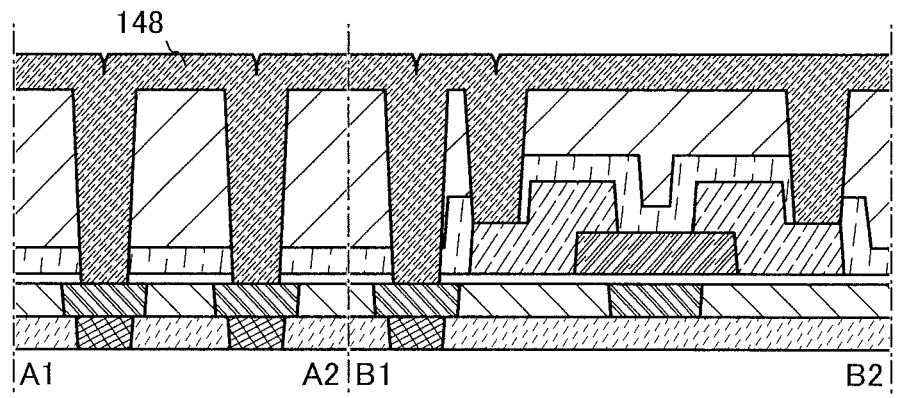

Next, the interlayer insulating layer 146 is formed over the protective insulating layer 144 (see FIG. 6A). The interlayer insulating layer 146 can be formed with a PVD method, a CVD method, or the like. The interlayer insulating layer 146 can be formed using a material including an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with a method such as CMP or etching.

Next, openings that reach the electrode 136a, the electrode 136b, the electrode 136c, the source or drain electrode 142a, and the source or drain electrode 142b are formed in the interlayer insulating layer 146, the protective insulating layer 144, and the gate insulating layer 138. Then, a conductive layer 148 is formed to be embedded in the openings (see FIG. 6B). The openings can be formed with a method such as etching using a mask. The mask can be formed with a method such as light exposure using a photomask.

Either wet etching or dry etching may be used as the etching; dry etching is preferably used in terms of microfabrication. The conductive layer 148 can be formed with a film formation method such as a PVD method or a CVD method. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings with a PVD method and a thin titanium nitride film is formed with a CVD method, and then, a tungsten film is formed to be embedded in the openings. Here, the titanium film formed with a PVD method has a function of reducing an oxide film at the interface with the interlayer insulating layer 146 to decrease the contact resistance with lower electrodes (here, the electrode 136a, the electrode 136b, the electrode 136c, the source or drain electrode 142a, and the source or drain electrode 142b). The titanium nitride film formed after the formation of the titanium film has a barrier function of preventing diffusion of the conductive material. A copper film may be formed with a plating method after the formation of the barrier film of titanium, titanium nitride, or the like.

Figure 6C:
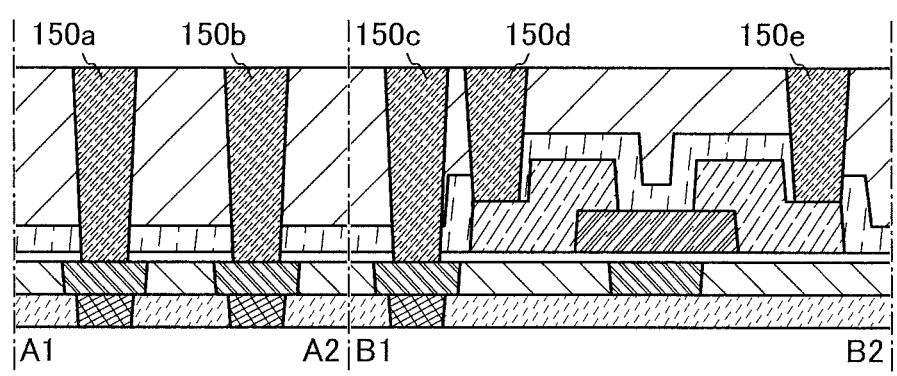
Figure 6D:
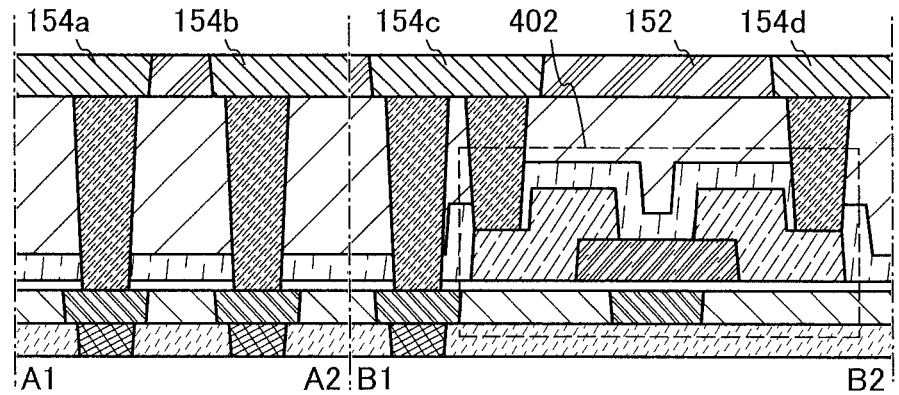

After the conductive layer 148 is formed, part of the conductive layer 148 is removed with a method such as etching or CMP, so that the interlayer insulating layer 146 is exposed and the electrode 150a, the electrode 150b, the electrode 150c, the electrode 150d, and the electrode 150e are formed (see FIG. 6C). Note that when the electrode 150a, the electrode 150b, the electrode 150c, the electrode 150d, and the electrode 150e are formed by removing part of the conductive layer 148, the process is preferably performed so that the surfaces are planarized. When the surfaces of the interlayer insulating layer 146, the electrode 150a, the electrode 150b, the electrode 150c, the electrode 150d, and the electrode 150e are planarized in such a manner, an electrode, a wiring, an insulating layer, a semiconductor layer, and the like can be favorably formed in later steps.

Then, the insulating layer 152 is further formed, and openings that reach the electrode 150a, the electrode 150b, the electrode 150c, the electrode 150d, and the electrode 150e are formed in the insulating layer 152. After a conductive layer is formed to be embedded in the openings, part of the conductive layer is removed with a method such as etching or CMP. Thus, the insulating layer 152 is exposed and the electrode 154a, the electrode 154b, the electrode 154c, and the electrode 154d are formed (see FIG. 6D). This step is similar to the step of forming the electrode 150a and the like; therefore, the detailed description is omitted.

In the case where the transistor 402 is formed with the aforementioned method, the hydrogen concentration in the oxide semiconductor layer 140 is $5\times10^{19}/cm^3$ or less and the off-state current of the transistor 402 is $1\times10^{-13}$ A or less at room temperature. The carrier concentration in the oxide semiconductor layer is less than $1\times10^{14}/cm^3$. The transistor 402 with excellent characteristics can be obtained by the application of the oxide semiconductor layer 140 that is highly purified by sufficiently reducing the hydrogen concentration and supplying oxygen as described above. Moreover, since the nonvolatile latch circuit includes the transistor 160 formed using a material other than an oxide semiconductor in the lower portion and the transistor 402 formed using an oxide semiconductor in the upper portion, it is possible to manufacture an excellent nonvolatile latch circuit having characteristics of both the transistors and a semiconductor device using the nonvolatile latch circuit.

Note that it is preferable that oxygen be supplied to the oxide semiconductor layer 140 shortly after the hydrogen concentration is reduced because there is no possibility that hydrogen, water, or the like enters the oxide semiconductor layer and thus an oxide semiconductor layer with extremely favorable characteristics can be realized. It is needless to say that treatment for reducing the hydrogen concentration and treatment for supplying oxygen do not need to be performed successively as long as an oxide semiconductor layer with favorable characteristics can be realized. For example, another treatment may be performed between the treatment for reducing the hydrogen concentration and treatment for supplying oxygen. Alternatively, both of the treatment may be performed at the same time.

Note that silicon carbide (e.g., 4H—SiC) is given as a semiconductor material which can be compared to an oxide semiconductor. An oxide semiconductor and 4H—SiC have some things in common. The carrier density is one of them. In accordance with Fermi-Dirac distribution, the density of minority carriers in an oxide semiconductor is estimated to be approximately $1\times10^{-7}/cm^3$. This value of the minority carrier density is extremely small similarly to that in 4H—SiC, $6.7\times10^{-11}/cm^3$. When the minority carrier density of an oxide semiconductor is compared to the intrinsic carrier density of silicon (approximately $1.4\times10^{10}/cm^3$), it can be understood well that the minority carrier density of an oxide semiconductor is significantly low.

Further, the energy band gap of an oxide semiconductor is 3.0 eV to 3.5 eV and the energy band gap of 4H—SiC is 3.26 eV. Thus, an oxide semiconductor and silicon carbide are similar in that they are both wide-gap semiconductors.

On the other hand, there is a major difference between an oxide semiconductor and silicon carbide, that is, the process temperature. Since heat treatment at 1500° C. to 2000° C. is generally needed in a semiconductor process using silicon carbide, it is difficult to form a stack of silicon carbide and a semiconductor element formed using a semiconductor material other than silicon carbide. This is because a semiconductor substrate, the semiconductor element, or the like is damaged at such high temperatures. Meanwhile, an oxide semiconductor can be formed with heat treatment at 300° C. to 500° C. (the glass transition temperature or lower, up to about 700° C.); therefore, it is possible to form an integrated circuit with the use of a semiconductor material other than an oxide semiconductor and then to form a semiconductor element including an oxide semiconductor.

In addition, in contrast to silicon carbide, an oxide semiconductor is advantageous because a low heat-resistant substrate such as a glass substrate can be used. Moreover, an oxide semiconductor does not need to be subjected to heat treatment at high temperature, so that energy cost can be reduced sufficiently as compared to silicon carbide, which is another advantage.

Although a lot of researches on properties of an oxide semiconductor such as density of state (DOS) have been conducted, they do not include the idea of sufficiently reducing localized states themselves. According to an embodiment of the invention disclosed herein, a highly purified oxide semiconductor is formed by removing water or hydrogen which might affect the localized states. This is based on the idea that the localized states themselves are sufficiently reduced. Such a highly purified oxide semiconductor enables fabrication of very excellent industrial products.

Further, it is also possible to form a more highly purified (i-type) oxide semiconductor by supplying oxygen to a dangling bond of metal which is generated by oxygen vacancy and reducing the localized states due to the oxygen vacancy. For example, an oxide film containing excessive oxygen is formed in close contact with a channel formation region and then oxygen is supplied to the channel formation region from the oxide film, so that the localized states due to oxygen vacancy can be reduced.

A defect of an oxide semiconductor is said to be attributed to a level of 0.1 eV to 0.2 eV under the conduction band due to excessive hydrogen, a deep level due to shortage of oxygen, or the like. Thorough removal of hydrogen and sufficient supply of oxygen for elimination of such a defect would be right as a technological thought.

An oxide semiconductor is generally considered as an n-type semiconductor; however, according to an embodiment of the invention disclosed herein, an i-type semiconductor is realized by removing an impurity, particularly water and hydrogen. In this respect, it can be said that an embodiment of the invention disclosed herein includes a novel technical idea because it is different from an i-type semiconductor such as silicon added with an impurity.

The example is described above in which, among elements of the nonvolatile latch circuit 400, a material other than an oxide semiconductor is used as a semiconductor material for the elements other than the transistor 402 using an oxide semiconductor. However, the invention disclosed herein is not limited thereto. Among the elements of the nonvolatile latch circuit 400, an oxide semiconductor can also be used as a semiconductor material for the elements other than the transistor 402.

<Electrical Conduction Mechanism of Transistor Using Oxide Semiconductor>

An electrical conduction mechanism of a transistor using an oxide semiconductor will be described herewith reference to FIG. 7, FIG. 8, FIGS. 9A and 9B, and FIG. 10. Note that the following description is based on the assumption of an ideal situation for easy understanding and does not necessarily reflect a real situation. Note also that the following description is just a consideration and does not affect the validity of the invention.

Figure 7:
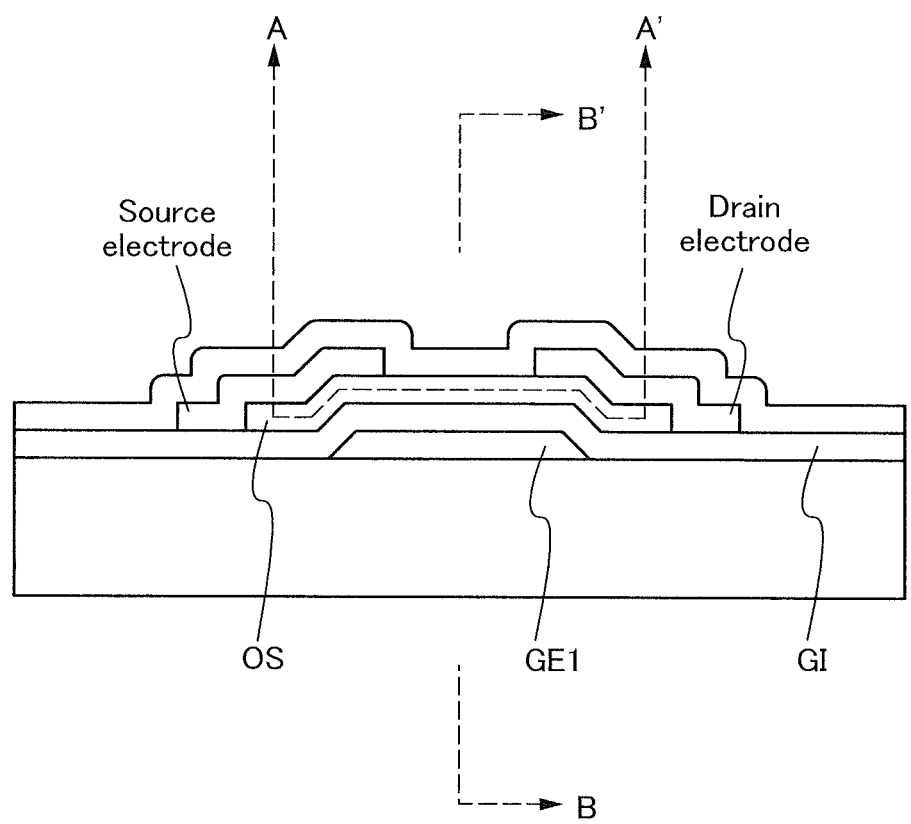
FIG. 7 is a cross-sectional view of a transistor using an oxide semiconductor.

FIG. 7 is a cross-sectional view of a transistor (thin film transistor) using an oxide semiconductor. An oxide semiconductor layer (OS) is provided over a gate electrode (GE1) with a gate insulating layer (GI) interposed therebetween, and a source electrode (S) and a drain electrode (D) are provided over the oxide semiconductor layer. An insulating layer is provided so as to cover the source electrode (S) and the drain electrode (D).

Figure 8:
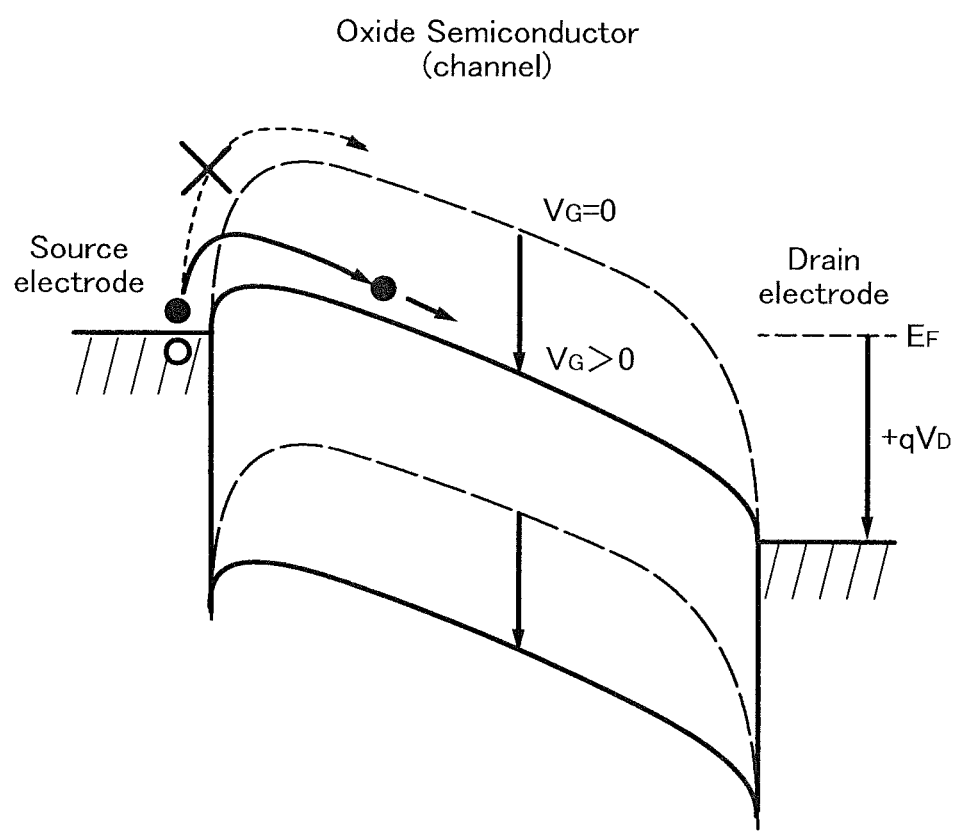
FIG. 8 is an energy band diagram (schematic diagram) along an A-A' section in FIG. 7.

FIG. 8 is an energy band diagram (schematic diagram) of the cross section A-A' in FIG. 7. In FIG. 8, a black circle (●) and a white circle (○) represent an electron and a hole and have electric charges (−q, +q), respectively. With a positive voltage ($V_D>0$) applied to the drain electrode, the dashed line shows the case where no voltage is applied to the gate electrode ($V_G=0$) and the solid line shows the case where a positive voltage is applied to the gate electrode ($V_G>0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 9A:
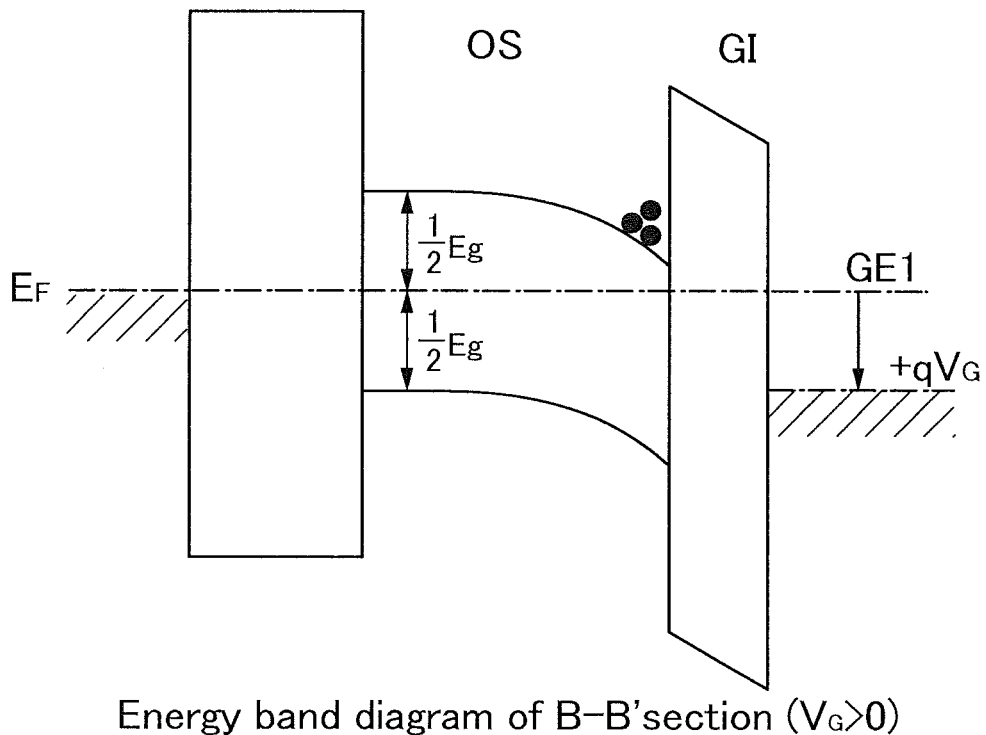
FIG. 9A illustrates a state where a positive voltage ($V_G>0$) is applied to a gate (GE1)
Figure 9B:
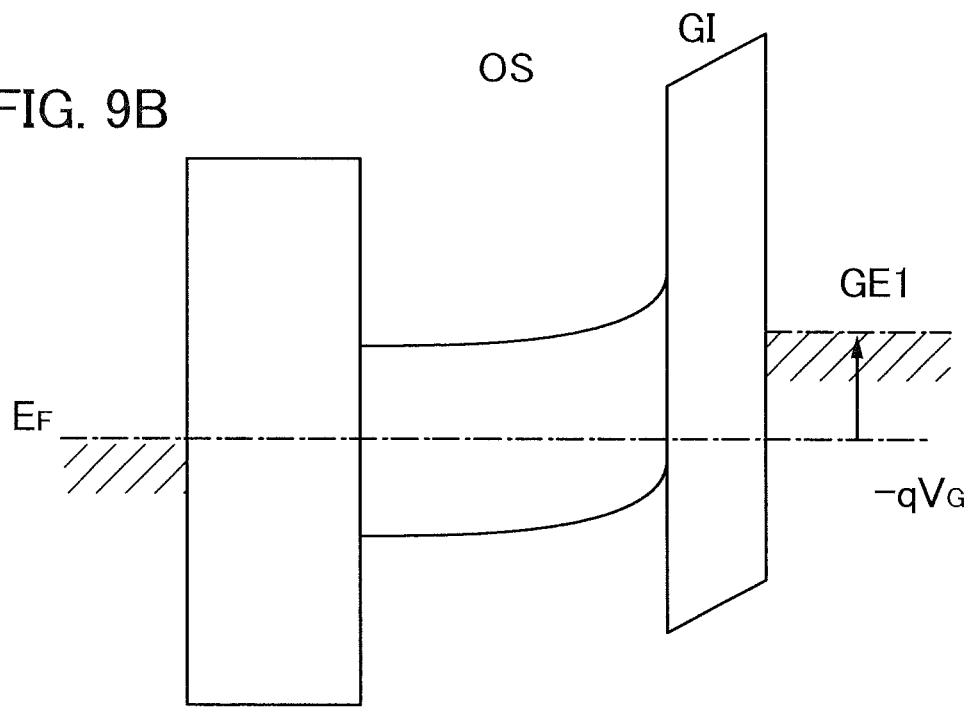
FIG. 9B illustrates a state where a negative voltage ($V_G<0$) is applied to the gate (GE1).

FIGS. 9A and 9B are energy band diagrams (schematic diagrams) along B-B' in FIG. 7. FIG. 9A illustrates a state in which a positive voltage ($V_G>0$) is applied to the gate electrode (GE1) and carriers (electrons) flow between the source electrode and the drain electrode. FIG. 9B illustrates an off state in which a negative voltage ($V_G<0$) is applied to the gate electrode (GE1) and minority carriers do not flow.

Figure 10:
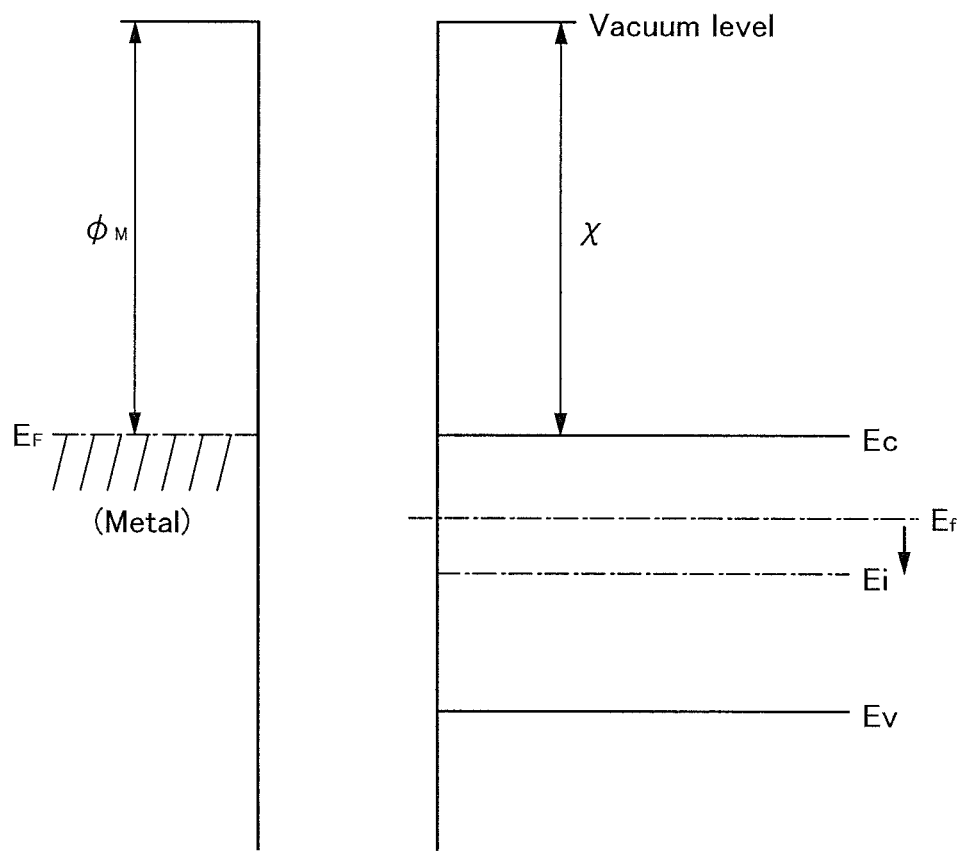
FIG. 10 illustrates the relationships between the vacuum level and the work function of a metal ($\phi_M$) and between the vacuum level and the electron affinity ($\chi$) of an oxide semiconductor.

FIG. 10 illustrates the relationships between the vacuum level and the work function of a metal ($\phi_M$) and between the vacuum level and the electron affinity ($\chi$) of an oxide semiconductor. At normal temperature, electrons in the metal are degenerated and the Fermi level is located in the conduction band. On the other hand, a conventional oxide semiconductor is an n-type semiconductor, in which the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor according to an embodiment of the invention disclosed herein is an intrinsic (i-type) or a substantially intrinsic oxide semiconductor which is obtained in the following manner: hydrogen that is a factor for an n-type oxide semiconductor from an oxide semiconductor and purifying the oxide semiconductor such that an element other than its main component of the oxide semiconductor (i.e., an impurity element) is prevented from being contained therein as much as possible. That is, a feature is that a purified i-type (intrinsic) semiconductor or a semiconductor close thereto is obtained not by adding an impurity element but by removing an impurity such as hydrogen and water as much as possible. Thus, the Fermi level ($E_F$) can be comparable with the intrinsic Fermi level ($E_i$).

It is said that the band gap ($E_g$) of an oxide semiconductor is 3.15 eV and the electron affinity ($\chi$) thereof is 4.3 eV. The work function of titanium (Ti) contained in the source electrode and the drain electrode is substantially equal to the electron affinity ($\chi$) of the oxide semiconductor. In this case, a Schottky barrier is not formed for an electron is not formed at the interface between metal and the oxide semiconductor.

At that time, as illustrated in FIG. 9A, the electron moves in the vicinity of the interface between the gate insulating layer and the highly purified oxide semiconductor (the lowest portion of the oxide semiconductor which is stable in terms of energy).

In addition, as illustrated in FIG. 9B, when a negative potential is supplied to the gate electrode (GE1), the value of current is extremely close to zero because holes that are minority carriers are substantially zero.

In such a manner, an intrinsic (i-type) or substantially intrinsic oxide semiconductor is obtained by being highly purified such that an element other than its main component (i.e., an impurity element) is contained as little as possible. Thus, characteristics of the interface between the oxide semiconductor and the gate insulating layer become important. For that reason, the gate insulating layer needs to be able to form a favorable interface with the oxide semiconductor. Specifically, it is preferable to use the following insulating layer, for example: an insulating layer formed with a CVD method using high-density plasma generated with a power source frequency in the range of the VHF band to the microwave band, or an insulating layer formed with a sputtering method.

When the oxide semiconductor is highly purified and the interface between the oxide semiconductor and the gate insulating layer is made favorable, in the case where the transistor has a channel width (W) of $1 \times 10^4$ μm and a channel length (L) of 3 μm, for example, it is possible to realize an off-state current of $1 \times 10^{-13}$ A or less and a subthreshold swing (S value) of 0.1 V/dec. (a gate insulating layer: 100 nm thickness).

When the oxide semiconductor is highly purified as described above so as to contain an element other than its main component (i.e., an impurity element) as little as possible, the transistor can operate in a favorable manner.

<Resistance of Transistor Using Oxide Semiconductor to Hot Carrier Degradation>

Next, the resistance of a transistor using an oxide semiconductor to hot carrier degradation will be described with reference to FIG. 11, FIG. 12, and FIG. 13. Note that the following description is based on the assumption of an ideal situation for easy understanding and does not necessarily reflect a real situation. Note also that the following description is just a consideration.

Main causes of hot carrier degradation are channel hot electron injection (CHE injection) and drain avalanche hot carrier injection (DAHC injection). Note that only electrons are considered below for simplicity.

CHE injection refers to a phenomenon in which electrons having gained energy higher than the barrier of a gate insulating layer in a semiconductor layer are injected into the gate insulating layer or the like. Electrons gain energy by being accelerated by a low electric field.

DAHC injection refers to a phenomenon in which electrons generated by collision of electrons accelerated by a high electric field are injected into a gate insulating layer or the like. A difference between DAHC injection and CHE injection is whether or not they involve avalanche breakdown caused by impact ionization. Note that DAHC injection requires electrons having a kinetic energy higher than a band gap of a semiconductor.

Figure 11:
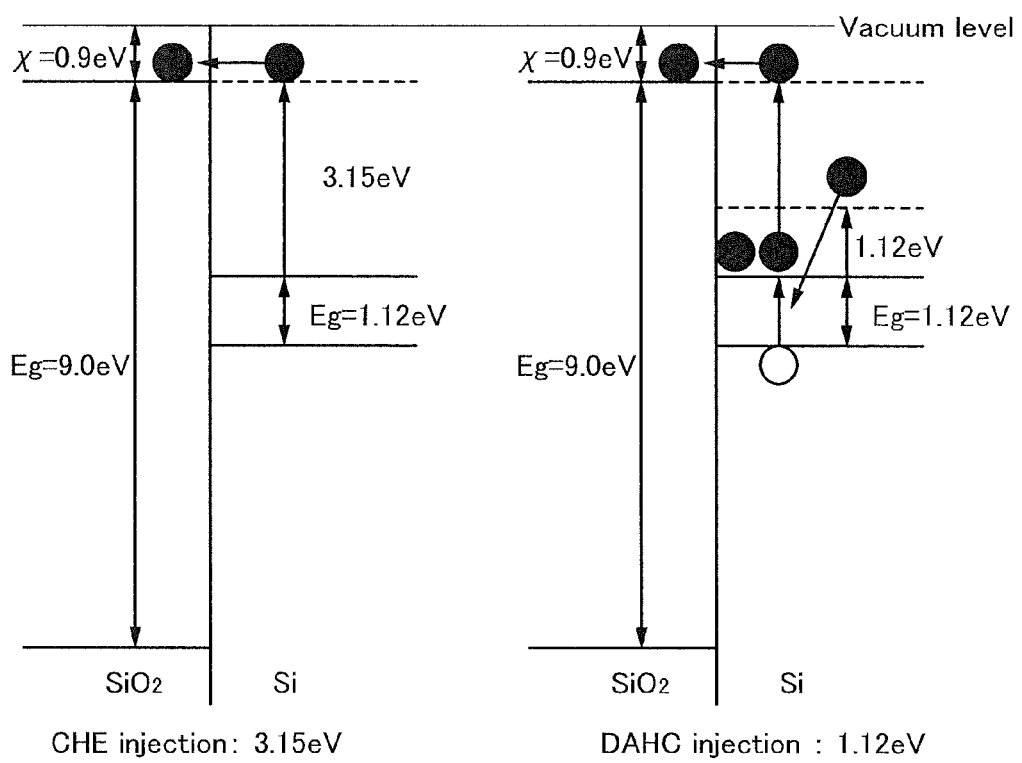
FIG. 11 illustrates energy required for hot carrier injection in silicon (Si).
Figure 12:
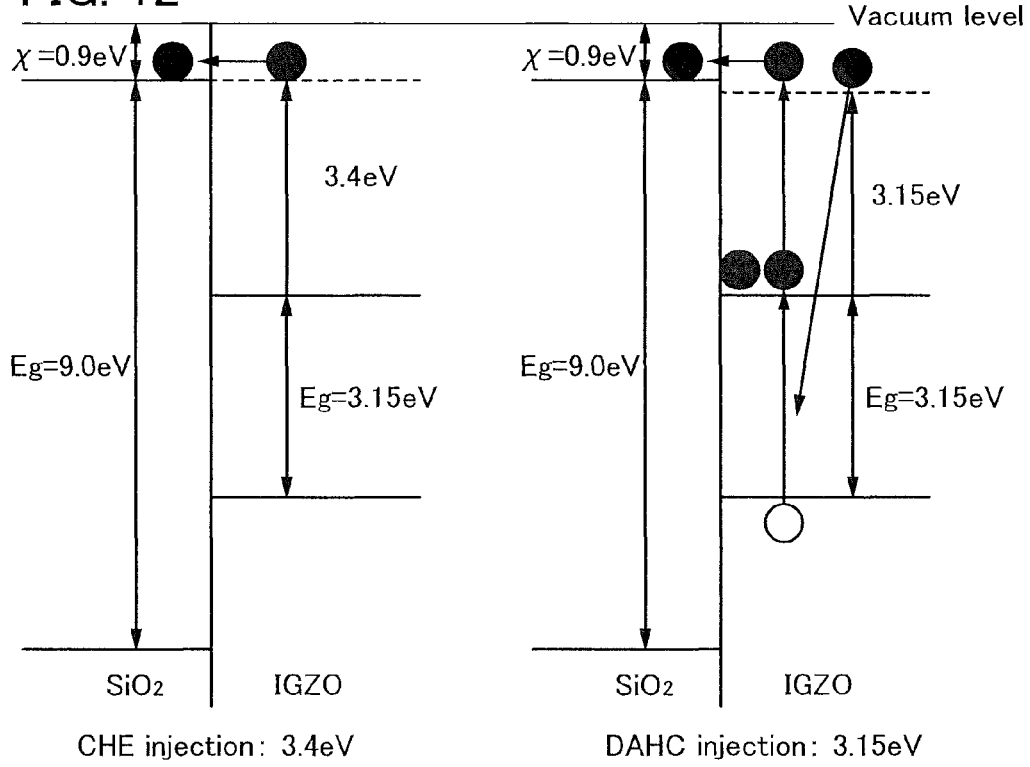
FIG. 12 illustrates energy required for hot carrier injection in an In—Ga—Zn—O-based oxide semiconductor (IGZO).
Figure 13:
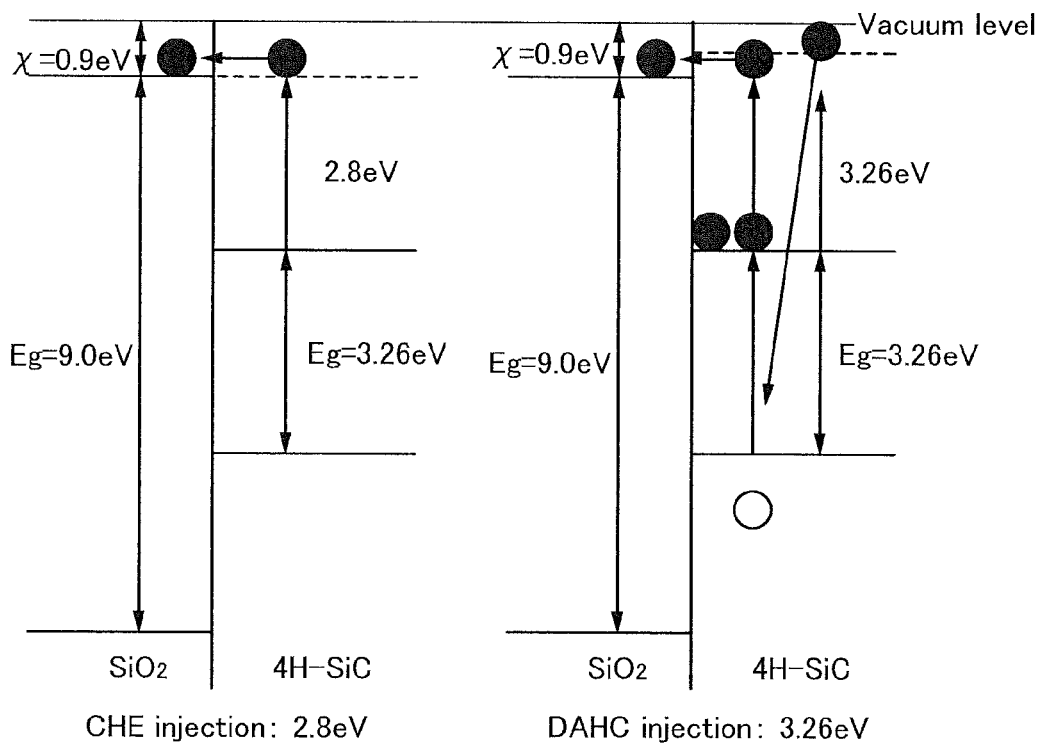
FIG. 13 illustrates energy required for hot carrier injection in silicon carbide (4H—SiC).

FIG. 11 illustrates energy required for each hot carrier injection which is estimated from the band structure of silicon (Si), and FIG. 12 illustrates energy required for each hot carrier injection which is estimated from the band structure of an In—Ga—Zn—O-based oxide semiconductor (IGZO). The left of each of FIG. 11 and FIG. 12 show CHE injection, and the right of each of FIG. 11 and FIG. 12 show DAHC injection.

Regarding silicon, degradation caused by DAHC injection is more serious than that caused by CHE injection. This results from the fact that carriers (e.g., electrons) which are accelerated without colliding are very few in silicon whereas silicon has a narrow band gap and avalanche breakdown readily occurs therein. The avalanche breakdown sharply increases the number of electrons capable of crossing over the barrier of the gate insulating layer (i.e., electrons injected into the gate insulating layer), which causes degradation.

Regarding an In—Ga—Zn—O-based oxide semiconductor, the energy required for CHE injection does not greatly differ from that in the case of silicon, and the probability of CHE injection is still low. On the other hand, since the band gap of the In—Ga—Zn—O-based oxide semiconductor is wider than that of silicon, the energy required for DAHC injection is increased and thus avalanche breakdown unlikely occurs. In other words, the probabilities of both CHE injection and DAHC injection are low, and hot carrier degradation unlikely occurs as compared to the case of using silicon.

Meanwhile, the band gap of an In—Ga—Zn—O-based oxide semiconductor is comparable to that of silicon carbide (SiC) which attracts attention as a material having a high withstand voltage. FIG. 13 illustrates energy required for each hot carrier injection regarding 4H—SiC. Regarding CHE injection, an In—Ga—Zn—O-based oxide semiconductor has a slightly higher threshold and can be said to have an advantage.

As described above, it can be seen that an In—Ga—Zn—O-based oxide semiconductor has significantly higher resistance to hot carrier degradation and higher resistance to source-drain breakdown than silicon. It can also be said that a withstand voltage comparable to that of silicon carbide can be obtained.

<Short-Channel Effect in Transistor Using Oxide Semiconductor>

Figure 14:
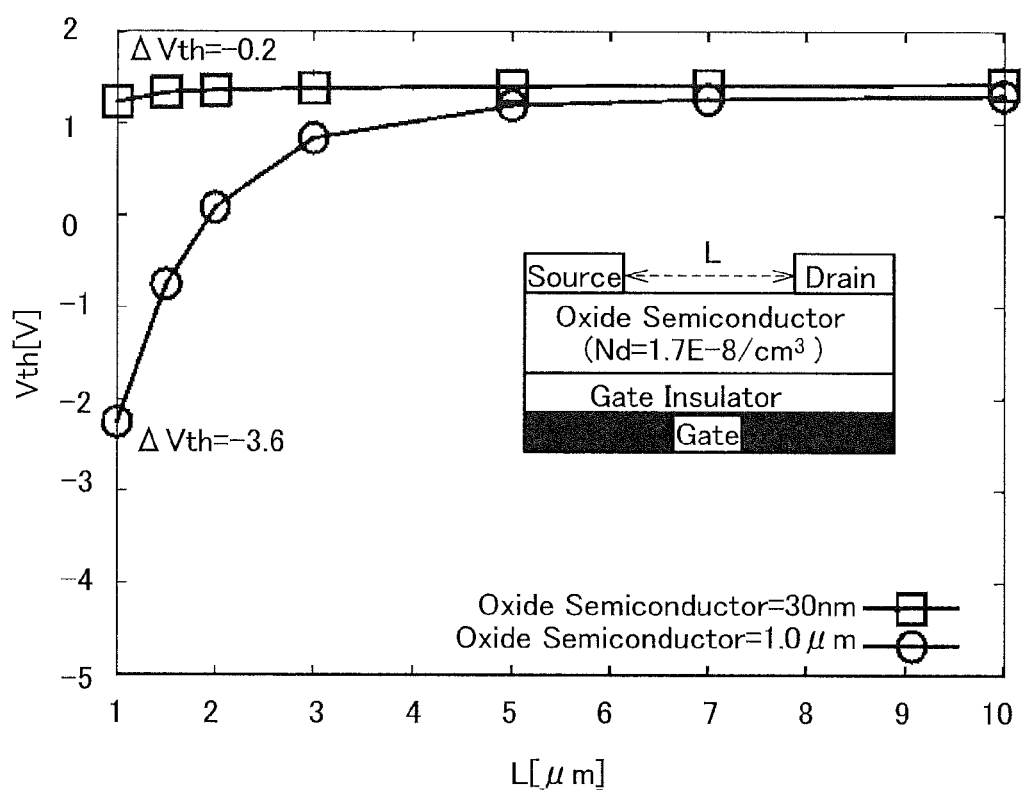
FIG. 14 shows the results of device simulation as to short-channel effect.
Figure 15:
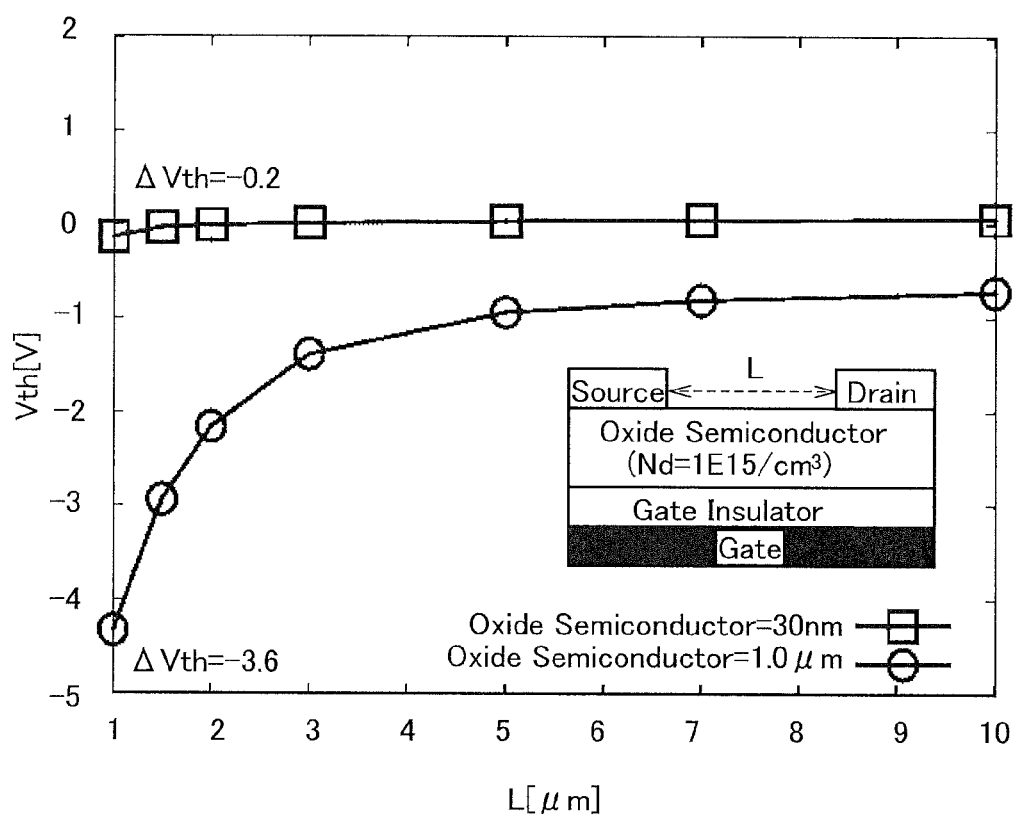
FIG. 15 shows the results of device simulation as to short-channel effect.

Next, a short-channel effect in a transistor using an oxide semiconductor will be described with reference to FIG. 14 and FIG. 15. Note that the following description is based on the assumption of an ideal situation for easy understanding and does not necessarily reflect a real situation. Note also that the following description is just a consideration.

The short-channel effect refers to degradation of electric characteristics which becomes obvious with miniaturization of a transistor (a reduction in channel length (L)). The short-channel effect results from the effect of a drain on a source. Specific examples of the short-channel effect are a decrease in threshold voltage, an increase in subthreshold swing (S value), an increase in leakage current, and the like.

Here, a structure capable of suppressing a short-channel effect is examined by device simulation. Specifically, four kinds of models each having a different carrier concentration and a different thickness of an oxide semiconductor layer were prepared, and the relationship between a channel length (L) and a threshold voltage ($V_{th}$) was checked. As the models, bottom-gate transistors were employed, in each of which an oxide semiconductor had a carrier concentration of $1.7 \times 10^-$s/cm$^3$ or $1.0 \times 10^{15}$/cm$^3$ and an oxide semiconductor layer with a thickness of 1 μm or 30 nm. Note that an In—Ga—Zn—O-based oxide semiconductor was used for the oxide semiconductor layer, and a silicon oxynitride film with a thickness of 100 nm was used as a gate insulating layer. It was assumed that, in the oxide semiconductor, the band gap was 3.15 eV, the electron affinity was 4.3 eV, the relative permittivity was 15, and the electron mobility was 10 cm$^2$/Vs. The relative permittivity of the silicon oxynitride film was assumed to be 4.0. The calculation was performed using device simulation software "ATLAS" produced by Silvaco Inc.

Note that there is no significant difference in calculation results between a top-gate transistor and a bottom-gate transistor. FIG. 14 and FIG. 15 show calculation results. FIG. 14 shows the case where the carrier concentration is $1.7\times10^{-8}/\text{cm}^3$, and FIG. 15 shows the case where the carrier concentration is $1.0\times10^{15}/\text{cm}^3$. FIG. 14 and FIG. 15 each show the amount of change ($\Delta V_{th}$) in threshold voltage ($V_{th}$) when a transistor whose channel length (L) is 10 μm is used as a reference and channel lengths (L) vary from 10 μm to 1 μm. As shown in FIG. 14, in the case where the carrier concentration in the oxide semiconductor was $1.7\times10^{-8}/\text{cm}^3$ and the thickness of the oxide semiconductor layer was 1 μm, the amount of change ($\Delta V_{th}$) in threshold voltage was −3.6 V. Moreover, as shown in FIG. 14, in the case where the carrier concentration in the oxide semiconductor was $1.7\times10^{-8}/\text{cm}^3$ and the thickness of the oxide semiconductor layer was 30 nm, the amount of change ($\Delta V_{th}$) in threshold voltage was −0.2 V. In addition, as shown in FIG. 15, in the case where the carrier concentration in the oxide semiconductor was $1.0\times10^{15}/\text{cm}^3$ and the thickness of the oxide semiconductor layer was 1 nm, the amount of change ($\Delta V_{th}$) in threshold voltage was −3.6 V. Moreover, as shown in FIG. 15, in the case where the carrier concentration in the oxide semiconductor was $1.0\times10^{15}/\text{cm}^3$ and the thickness of the oxide semiconductor layer was 30 nm, the amount of change ($\Delta V_{th}$) in threshold voltage was −0.2 V. The results show that a short-channel effect can be suppressed in a transistor using an oxide semiconductor by a reduction in thickness of an oxide semiconductor layer. For example, in the case where the channel length (L) is approximately 1 μm, even with an oxide semiconductor layer having sufficiently high carrier concentration, it can be understood that a short-channel effect can be sufficiently suppressed when the thickness of the oxide semiconductor layer is set to approximately 30 nm.

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized.

Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

The structures, methods, and the like described in this embodiment can be combined as appropriate with any of the structures, methods, and the like described in the other embodiments.

[Embodiment 2]

In this embodiment, another example of a structure, a manufacturing method, and the like of elements of the nonvolatile latch circuit which is an embodiment of the invention disclosed herein will be described with reference to FIG. 16, FIGS. 17A to 17E, and FIGS. 18A to 18D. In this embodiment, the configuration of the nonvolatile latch circuit is similar to that in FIG. 1.

Figure 16:
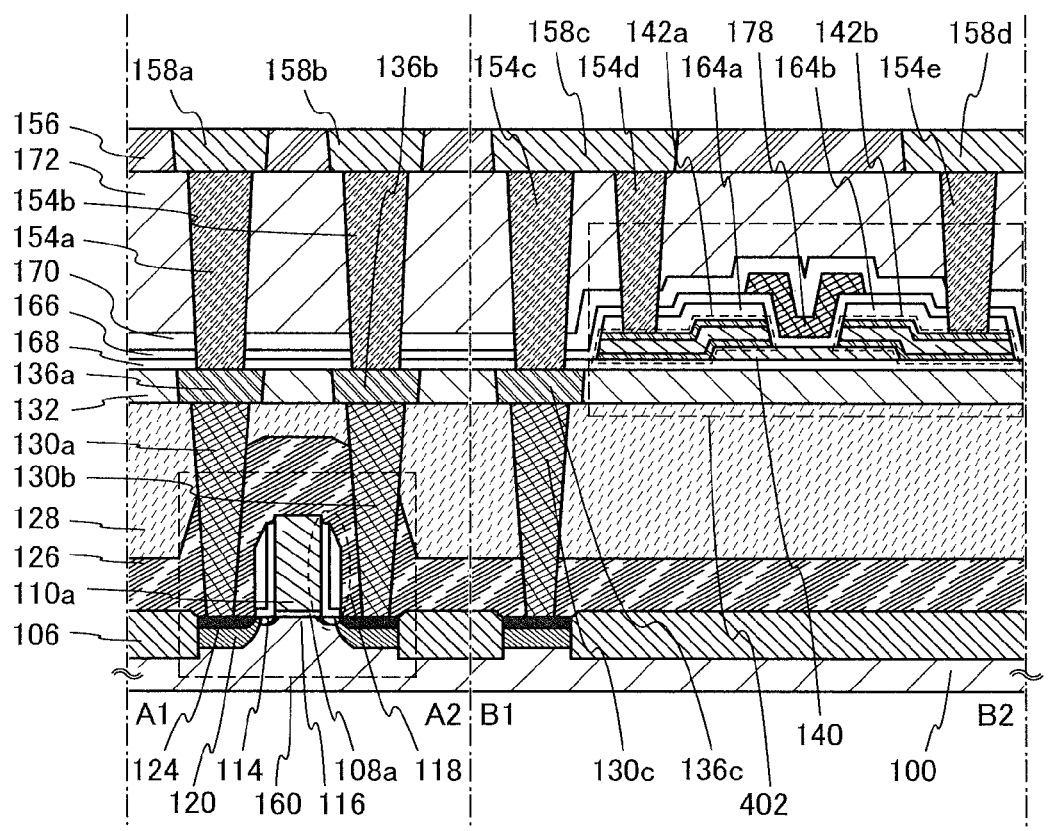
FIG. 16 illustrates an example of a cross section of elements of a nonvolatile latch circuit.

FIG. 16 is a cross-sectional view illustrating an example of structures of elements of a nonvolatile latch circuit. FIG. 16 is an example in which, among the elements of the nonvolatile latch circuit, the structure of a transistor 402 formed using an oxide semiconductor in the upper portion is different from that in FIGS. 3A and 3B. In other words, FIG. 16 is an example in which a top-gate transistor is applied to the transistor 402 formed using an oxide semiconductor in the upper portion. The structures of the other elements (the structure of the transistor in the lower portion, and the like) are similar to those in FIGS. 3A and 3B.

<Structure of Elements of Nonvolatile Latch Circuit>

In FIG. 16, the transistor 160 using a material other than an oxide semiconductor is provided in a lower portion, and the transistor 402 using an oxide semiconductor is provided in an upper portion. The transistor 160 using a material other than an oxide semiconductor can be used as a transistor included in the first element (D1) 412 and the second element (D2) 413 of the latch portion. With the use of the material other than an oxide semiconductor, high-speed operation can be realized. Also other elements of the nonvolatile latch circuit can have a structure similar or comparable to that of the transistor 160.

The element such as the capacitor 404 of the nonvolatile latch circuit can be formed using a conductive film, a semiconductor film, an insulating film, or the like included in the transistor 402 or the transistor 160. Note that the transistor 160 and the transistor 402 are n-channel transistors here; alternatively, a p-channel transistor may be used. It is easy to use a p-channel transistor as the transistor 160.

The transistor 160 includes the channel formation region 116 provided in the substrate 100 containing a semiconductor material; the impurity regions 114 and the high-concentration regions 120 (a combination of the impurity regions 114 and the high-concentration regions 120 can simply be referred to as impurity regions) formed with the channel formation region 116 interposed therebetween; the gate insulating layer 108a over the channel formation region 116; the gate electrode 110a over the gate insulating layer 108a; the source or drain electrode 130a electrically connected to the impurity region 114; and the source or drain electrode 130b electrically connected to the impurity region 114.

Here, the sidewall insulating layers 118 are formed on the sides of the gate electrode 110a. Moreover, as seen from a plane, the high-concentration regions 120 are formed in a region of the substrate 100 which does not overlap with the sidewall insulating layers 118, and the metal compound regions 124 is in contact with the high-concentration regions 120. Further, the element isolation insulating layers 106 are formed over the substrate 100 so as to surround the transistor 160, and the interlayer insulating layer 126 and the interlayer insulating layer 128 are formed to cover the transistor 160.

The source or drain electrode 130a and the source or drain electrode 130b are electrically connected to the metal compound regions 124 through the openings formed in the interlayer insulating layer 126 and the interlayer insulating layer 128. In other words, the source or drain electrode 130a and the source or drain electrode 130b are electrically connected to the high-concentration regions 120 and the impurity regions 114 through the metal compound regions 124.

The transistor 402 includes an oxide semiconductor layer 140 provided over an insulating layer 168, a source or drain electrode 142a and a source or drain electrode 142b provided over the oxide semiconductor layer 140 and electrically connected to the oxide semiconductor layer 140, a gate insulating layer 166 provided to cover the oxide semiconductor layer 140, the source or drain electrode 142a, and the source or drain electrode 142b, and a gate electrode 178 provided over the gate insulating layer 166 in a region overlapping with the oxide semiconductor layer 140 (see FIG. 16).

Here, the oxide semiconductor layer 140 is preferably an oxide semiconductor layer which is highly purified by sufficiently removing an impurity such as hydrogen and supplying oxygen. Specifically, the hydrogen concentration in the oxide semiconductor layer 140, which is measured by SIMS (secondary ion mass spectroscopy), can be set to less than or equal to $5\times10^{19}/cm^3$, preferably less than or equal to $5\times10^{18}/cm^3$, more preferably less than or equal to $5\times10^{17}/cm^3$, and still more preferably less than $1\times10^{16}/cm^3$.

Note that in the oxide semiconductor layer 140 which is highly purified by sufficiently reducing the hydrogen concentration and supplying oxygen, the carrier concentration is sufficiently low (e.g., less than $1\times10^{12}/cm^3$, preferably less than $1\times10^{11}/cm^3$), as compared to carrier concentration (approximately $1\times10^{14}/cm^3$) in a general silicon wafer (a silicon wafer to which a slight amount of impurity elements such as phosphorus or boron is added).

In this manner, by using an i-type or substantially i-type oxide semiconductor, the transistor 402 which has extremely favorable off-state current characteristics can be obtained. For example, when a drain voltage $V_D$ is +1 V or +10 V and a gate voltage $V_G$ ranges from −5 V to −20 V, the off-state current is less than or equal to $1\times10^{-13}$ A at room temperature. Moreover, the aforementioned transistor has characteristics of a normally-off transistor. Therefore, leakage current, that is, an off-state current at a state where a voltage between a gate electrode and a source electrode is approximately 0 V is much smaller than that of a transistor using silicon. For example, the leakage current per unit channel width is less than or equal to 10 aA/μm at room temperature.

Further, in temperature characteristics, the off-state current can be sufficiently low and the on-state current can be sufficiently high even at a high temperature. For example, as $V_G$-$I_D$ characteristics of the transistor 402, data is obtained in a range of −25° C. to 150° C. with low temperature dependence of off-state currents, on-state currents, mobilies, and S values. Furthermore, data is obtained which shows that the off-state current in the aforementioned temperature range is as extremely low as $1\times10^{-13}$ A or less. One of the reasons is that an i-type or substantially i-type oxide semiconductor which is obtained by sufficiently reducing the hydrogen concentration to be highly purified and has extremely low carrier concentration is used as the oxide semiconductor.

When the oxide semiconductor layer 140 which is highly purified by sufficiently reducing the hydrogen concentration is used and the off-state current of the transistor 402 is reduced, a semiconductor device having a novel structure can be realized.

In addition, over the transistor 402, an interlayer insulating layer 170 and an interlayer insulating layer 172 are provided. Here, the gate insulating layer 166, the interlayer insulating layer 170, and the interlayer insulating layer 172 are provided with openings that reach the source or drain electrode 142a and the source or drain electrode 142b. An electrode 154d and an electrode 154e are in contact with the source or drain electrode 142a and the source or drain electrode 142b through the openings. At the same time as formation of the electrode 154d and the electrode 154e, an electrode 154a, an electrode 154b, and an electrode 154c are formed which are in contact with the electrode 136a, the electrode 136b, and the electrode 136c, respectively, through openings in the gate insulating layer 166, the interlayer insulating layer 170, and the interlayer insulating layer 172.

An insulating layer 156 is formed over the interlayer insulating layer 172. An electrode 158a, an electrode 158b, an electrode 158c, and an electrode 158d are formed so as to be embedded in the insulating layer 156. Here, the electrode 158a is in contact with the electrode 154a, the electrode 158b is in contact with the electrode 154b, the electrode 158c is in contact with the electrode 154c and the electrode 154d, and the electrode 158d is in contact with the electrode 154e.

That is, the source or drain electrode 142a of the transistor 402 is electrically connected to another element (e.g., the transistor using a material other than an oxide semiconductor) through the electrode 130c, the electrode 136c, the electrode 154c, the electrode 158c, and the electrode 154d (see FIG. 16). In addition, the source or drain electrode 142b of the transistor 402 is electrically connected to another element through the electrode 154e and the electrode 158d. Note that the structure of connection electrodes (such as the electrode 130c, the electrode 136c, the electrode 154c, the electrode 158c, and the electrode 154d) is not limited to the aforementioned structure, and appropriate addition, omission, or the like is possible.

<Manufacturing Method of Elements of Nonvolatile Latch Circuit>

Next, an example of a manufacturing method of the elements of the nonvolatile latch circuit will be described. With the manufacturing method described below, the elements of the nonvolatile latch circuit can be manufactured. Note that the manufacturing method of the transistor 160 is similar to that in FIGS. 4A to 4H; therefore, description thereof is omitted. The manufacturing method of the transistor 402 will be described with reference to FIGS. 17A to 17E and FIGS. 18A to 18D.

<Manufacturing Method of Transistor in Upper Portion>

Next, steps for manufacturing the transistor 402 over the interlayer insulating layer 128 will be described with reference to FIGS. 17A to 17E and FIGS. 18A to 18D. Note that FIGS. 17A to 17E and FIGS. 18A to 18D illustrate steps for manufacturing electrodes, the transistor 402, and the like over the interlayer insulating layer 128; therefore, the transistor 160 and the like placed below the transistor 402 are omitted.

First, the insulating layer 132 is formed over the interlayer insulating layer 128, the source or drain electrode 130a, the source or drain electrode 130b, and the electrode 130c. Next, openings that reach the source or drain electrode 130a, the source or drain electrode 130b, and the electrode 130c are formed in the insulating layer 132. Then, a conductive layer is formed to be embedded in the openings. After that, part of the conductive layer is removed by etching, CMP, or the like, so that the insulating layer 132 is exposed and the electrode 136a, the electrode 136b, and the electrode 136c are formed (see FIG. 17A).

The insulating layer 132 can be formed with a PVD method, a CVD method, or the like. The insulating layer 132 can be formed using a material containing an inorganic insulating material such as silicon oxide, silicon nitride oxide, silicon nitride, hafnium oxide, aluminum oxide, or tantalum oxide.

The openings can be formed in the insulating layer 132 with a method such as etching using a mask. The mask can be formed with a method such as light exposure using a photomask. Either wet etching or dry etching may be used as the etching; dry etching is preferably used in terms of microfabrication.

The conductive layer can be formed with a film formation method such as a PVD method or a CVD method. The conductive layer can be formed using a conductive material such as molybdenum, titanium, chromium, tantalum, tungsten, aluminum, copper, neodymium, or scandium or an alloy or a compound (e.g., a nitride) of any of these materials, for example.

More specifically, it is possible to employ a method, for example, in which a thin titanium film is formed in a region including the openings with a PVD method and a thin titanium nitride film is formed with a CVD method, and then, a tungsten film is formed to be embedded in the openings. Here, the titanium film formed with a PVD method has a function of reducing an oxide film which might be formed on the surface of lower electrodes (here, the source or drain electrode 130a, the source or drain electrode 130b, the electrode 130c, and the like) to decrease the contact resistance with the lower electrodes.

The titanium nitride film formed after the formation of the titanium film has a barrier function of preventing diffusion of the conductive material. A copper film may be formed with a plating method after the formation of the barrier film of titanium, titanium nitride, or the like. Note that not only a so-called single damascene method but also a dual damascene method may be employed.

When the electrode 136a, the electrode 136b, and the electrode 136c are formed, the process is preferably performed by CMP or the like so that the surfaces are planarized. When the surfaces of the insulating layer 132, the electrode 136a, the electrode 136b, and the electrode 136c are planarized in such a manner, an electrode, a wiring, an insulating layer, a semiconductor layer, and the like can be favorably formed in later steps.

Next, the insulating layer 168 is formed to cover the insulating layer 132, the electrode 136a, the electrode 136b, and the electrode 136c. Next, an oxide semiconductor layer is formed over the insulating layer 168 and processed with a method such as etching using a mask, so that the island-shaped oxide semiconductor layer 140 is formed (see FIG. 17B).

The insulating layer 168 functions as a base and can be formed with a CVD method, a sputtering method, or the like. The insulating layer 168 is preferably formed using silicon oxide, silicon nitride, silicon oxynitride, silicon nitride oxide, aluminum oxide, hafnium oxide, tantalum oxide, or the like. Note that the insulating layer 168 may have a single-layer structure or a stacked structure. There is no particular limitation on the thickness of the insulating layer 168; the insulating layer 168 can be formed in the range of 10 nm to 500 nm inclusive, for example. Here, the insulating layer 168 is not an essential component; therefore, a structure in which the insulating layer 168 is not provided is also possible.

If hydrogen, water, or the like is contained in the insulating layer 168, hydrogen may enter the oxide semiconductor layer or extract oxygen from the oxide semiconductor layer, whereby characteristics of the transistor might be degraded. Therefore, it is preferable to form the insulating layer 168 so as to contain hydrogen or water as little as possible.

In the case where a sputtering method or the like is employed, for example, it is preferable that the insulating layer 168 be formed in a state where moisture in the treatment chamber is removed. In order to remove moisture in the treatment chamber, an entrapment vacuum pump such as a cryopump, an ion pump, or a titanium sublimation pump is preferably used. Alternatively, a turbo pump provided with a cold trap may be used. Since hydrogen, water, or the like is sufficiently removed from the treatment chamber evacuated with a cryopump or the like, the concentration of an impurity contained in the insulating layer 168 can be reduced.

When the insulating layer 168 is formed, it is preferable to use a high-purity gas in which an impurity such as hydrogen or water is reduced to a concentration of a few ppm or less (preferably, 10 ppb or less).

As the oxide semiconductor layer, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor; a Sn—O-based oxide semiconductor; or a Zn—O-based oxide semiconductor which are one-component metal oxides. In addition, the aforementioned oxide semiconductors may contain $SiO_2$.

As the oxide semiconductor layer, a thin film containing a material represented by $InMO_3(ZnO)_m$ (m>0) can be used. Here, M represents one or more of metal elements selected from Ga, Al, Mn, and Co. For example, M can be Ga, Ga and Al, Ga and Mn, Ga and Co, or the like.

In this embodiment, as the oxide semiconductor layer, an amorphous oxide semiconductor layer is formed with a sputtering method using an In—Ga—Zn—O-based metal oxide target. Note that since crystallization of an amorphous oxide semiconductor layer can be suppressed by adding silicon to the amorphous oxide semiconductor layer, an oxide semiconductor layer may be formed, for example, using a target containing $SiO_2$ of 2 wt % to 10 wt % inclusive.

As the metal oxide target used for forming an oxide semiconductor layer with a sputtering method, for example, a metal oxide target having a composition ratio of $In_2O_3$:$Ga_2O_3$:ZnO=1:1:1 [molar ratio] can be used. Furthermore, a metal oxide target having a composition ratio of $In_2O_3$:$Ga_2O_3$:ZnO=1:1:2 [molar ratio] or a metal oxide target having a composition ratio of $In_2O_3$:$Ga_2O_3$:ZnO=1:1:4 [molar ratio] can also be used. The filling rate of a metal oxide target is 90% to 100% inclusive, preferably greater than or equal to 95% (e.g., 99.9%). A dense oxide semiconductor layer is formed by using a metal oxide target with a high filling rate.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use, for example, a high-purity gas atmosphere from which an impurity such as hydrogen, water, a hydroxyl group, or hydride is removed to a concentration of a few ppm or less (preferably, a few ppb or less).

At the time of forming the oxide semiconductor layer, the substrate is held in a treatment chamber kept under reduced pressure and the substrate is heated to a temperature of 100° C. to 600° C. inclusive, preferably 200° C. to 400° C. inclusive. Then, a sputtering gas from which hydrogen and water are removed is introduced into the treatment chamber while moisture in the treatment chamber is removed, whereby the oxide semiconductor layer is formed using the metal oxide as a target. The oxide semiconductor layer is formed while the substrate is heated, so that the concentration of an impurity contained in the oxide semiconductor layer can be reduced. Moreover, damage of the oxide semiconductor layer due to sputtering is reduced.

An entrapment vacuum pump is preferably used in order to remove moisture in the treatment chamber. For example, a cryopump, an ion pump, or a titanium sublimation pump can be used. Alternatively, a turbo pump provided with a cold trap may be used. Since hydrogen, water, or the like is removed from the treatment chamber evacuated with a cryopump, the concentration of an impurity in the oxide semiconductor layer can be reduced.

The oxide semiconductor layer can be formed under the following conditions, for example: the distance between the substrate and the target is 100 mm; the pressure is 0.6 Pa; the direct-current (DC) power supply is 0.5 kW; and the atmosphere is oxygen (the proportion of the oxygen flow is 100%). Note that it is preferable to use a pulsed direct-current (DC) power source because dust can be reduced and the thickness distribution is can be reduced. The thickness of the oxide semiconductor layer is 2 nm to 200 nm inclusive, preferably 5 nm to 30 nm inclusive. Note that the appropriate thickness of the oxide semiconductor layer differs depending on the oxide semiconductor material to be used, the intended purpose of a semiconductor device, or the like; therefore, the thickness may be determined in accordance with the material to be used, the intended purpose, or the like.

Note that before the oxide semiconductor layer is formed with a sputtering method, reverse sputtering is preferably performed in which plasma is generated with an argon gas introduced, so that dust on the surface of the insulating layer 168 is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which a high-frequency voltage is applied to the surface to be processed under an argon atmosphere so that plasma is generated near a substrate. Note that an atmosphere of nitrogen, helium, oxygen, or the like may be used instead of an argon atmosphere.

As an etching method for the oxide semiconductor layer, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

As the dry etching method, a parallel plate RIE (reactive ion etching) method or an ICP (inductively coupled plasma) etching method can be used. Also in this case, it is necessary to set etching conditions (e.g., the amount of electric power applied to a coiled electrode, the amount of electric power applied to an electrode on the substrate side, and the electrode temperature on the substrate side) as appropriate.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)) or the like. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As an etchant used for wet etching, a mixed solution of phosphoric acid, acetic acid, and nitric acid; ammonia peroxide mixture (a mixture of ammonia, water, and a hydrogen peroxide solution); or the like can be used. An etchant such as ITO07N (produced by KANTO CHEMICAL CO., INC.) may also be used.

Then, first heat treatment is preferably performed on the oxide semiconductor layer. Water (including a hydroxyl group), hydrogen, or the like contained in the oxide semiconductor layer can be removed through the first heat treatment. The temperature of the first heat treatment is 300° C. to 800° C. inclusive, preferably 400° C. to 700° C. inclusive, more preferably 450° C. to 700° C. inclusive, and still more preferably 550° C. to 700° C. inclusive.

The oxide semiconductor layer can be dehydrated or dehydrogenated when the first heat treatment is performed at a temperature of 350° C. or higher, so that the hydrogen concentration in the oxide semiconductor layer can be reduced. In addition, when the first heat treatment is performed at a temperature of 450° C. or higher, the hydrogen concentration in the oxide semiconductor layer can be further reduced. Moreover, when the first heat treatment is performed at a temperature of 550° C. or higher, the hydrogen concentration in the oxide semiconductor layer can be still further reduced. For example, the substrate is introduced into an electric furnace in which a resistance heating element or the like is used and the oxide semiconductor layer 140 is subjected to heat treatment at 450° C. for 1 hour under a nitrogen atmosphere. The oxide semiconductor layer 140 is not exposed to the air during the heat treatment so that the entry of water or hydrogen can be prevented.

The heat treatment apparatus is not limited to the electric furnace and can be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used.

An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, for example, nitrogen or a rare gas such as argon is used.

For example, as the first heat treatment, a GRTA process may be performed as follows. The substrate is put in an inert gas atmosphere that has been heated to a high temperature of 650° C. to 700° C., heated for several minutes, and taken out of the inert gas atmosphere. The GRTA process enables high-temperature heat treatment for a short time. Moreover, the GRTA process can be employed even when the temperature exceeds the upper temperature limit of the substrate because it is heat treatment for a short time. For example, in the case where an SOI substrate including a substrate with relatively low heat resistance, such as a glass substrate, is used, shrinkage of the substrate becomes a problem at a temperature higher than the upper temperature limit (strain point) but does not in the case where heat treatment is performed for a short time.

Note that as the inert gas atmosphere under which the first heat treatment is performed, it is preferable to employ an atmosphere that contains nitrogen or a rare gas (e.g., helium, neon, or argon) as its main component and does not contain water, hydrogen, or the like. For example, the purity of nitrogen or a rare gas such as helium, neon, or argon introduced into the heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

Note that the inert gas atmosphere may be changed during the process to an atmosphere including oxygen. For example, in the case where an electrical furnace is used in the first heat treatment, an atmosphere can be changed when a heat treatment temperature falls. For example, the heat treatment can be performed (at a constant temperature) under an atmosphere of an inert gas such as a rare gas (e.g., helium, neon, or argon) or nitrogen, and the atmosphere can be switched to an atmosphere containing oxygen when the heat treatment temperature falls. As the atmosphere containing oxygen, an oxygen gas or a mixed gas of an oxygen gas and a nitrogen gas can be used.

Also in the case where the atmosphere containing oxygen is employed, it is preferable that the atmosphere do not contain water, hydrogen, or the like. Alternatively, the purity of the oxygen gas or the nitrogen used is preferably greater than or equal to 6N (99.9999%), more preferably greater than or equal to 7N (99.99999%) (that is, the impurity concentration is less than or equal to 1 ppm, preferably less than or equal to 0.1 ppm). This is because defects caused by oxygen deficiency can be reduced by performing the first heat treatment under an atmosphere containing oxygen.

In some cases, the oxide semiconductor layer is crystallized to be microcrystalline or polycrystalline, which depends on the conditions of the first heat treatment or the material of the oxide semiconductor layer. For example, in some cases, the oxide semiconductor layer becomes a microcrystalline oxide semiconductor layer having a degree of crystallization of 90% or more, or 80% or more. Further, in some cases, the oxide semiconductor layer may be an amorphous oxide semiconductor layer containing no crystalline component, which depends on the conditions of the first heat treatment or the material of the oxide semiconductor layer.

Furthermore, in some cases, the oxide semiconductor layer becomes a layer in which a microcrystal (with a grain size of 1 nm to 20 nm inclusive, typically 2 nm to 4 nm inclusive) is mixed in an amorphous oxide semiconductor (e.g., a surface of the oxide semiconductor layer). The electric characteristics of the oxide semiconductor layer can be changed by aligning microcrystals in an amorphous semiconductor in the aforementioned manner.

For example, when the oxide semiconductor layer is formed using an In—Ga—Zn—O-based metal oxide target, the electric characteristics of the oxide semiconductor layer can be changed by formation of a microcrystalline region in which crystal grains of $In_2Ga_2ZnO_7$ with electrical anisotropy are aligned. The microcrystalline region is preferably a region in which the crystal grains are arranged so that the c-axis of $In_2Ga_2ZnO_7$ is perpendicular to a surface of the oxide semiconductor layer, for example.

By forming a region in which crystal grains are arranged in such a manner, the conductivity in the direction parallel to the surface of the oxide semiconductor layer can be improved and insulating properties in the direction perpendicular to the surface of the oxide semiconductor layer can be improved. Furthermore, such a microcrystalline region has a function of suppressing entry of an impurity such as water or hydrogen into the oxide semiconductor layer.

Note that the oxide semiconductor layer including the microcrystalline region can be formed by heating the surface of the oxide semiconductor layer by a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the aforementioned first heat treatment can also be referred to as dehydration treatment, dehydrogenation treatment, or the like. The dehydration treatment or dehydrogenation treatment can be performed, for example, after the oxide semiconductor layer is formed, after a source or drain electrode is stacked over the oxide semiconductor layer 140, or after a gate insulating layer is formed over the source or drain electrode. Such dehydration treatment or dehydrogenation treatment may be performed once or plural times.

Figure 17A:
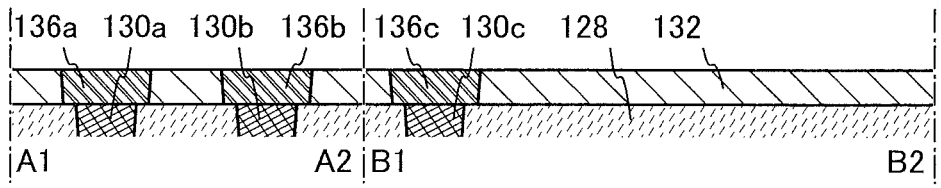
FIGS. 17A to 17E illustrate an example of a manufacturing method of an element of a nonvolatile latch circuit.
Figure 17B:
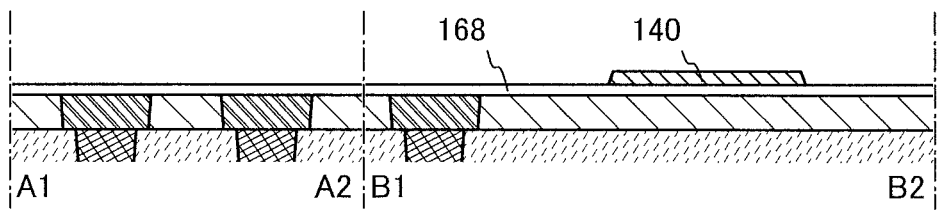
Figure 17C:
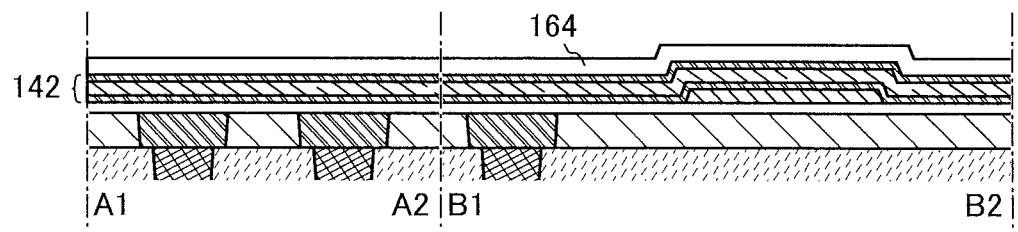

Next, after a conductive layer 142 is formed so as to be in contact with the oxide semiconductor layer 140, an insulating layer 164 is formed over the conductive layer 142 (see FIG. 17C). Note that the insulating layer 164 is not necessarily formed.

The conductive layer 142 can be formed with a PVD method such as a sputtering method or a CVD method such as a plasma CVD method. As a material for the conductive layer 142, an element selected from aluminum, chromium, copper, tantalum, titanium, molybdenum, and tungsten; an alloy containing any of these elements as its component; or the like can be used. Moreover, one or more of materials selected from manganese, magnesium, zirconium, beryllium, and yttrium may be used. It is also possible to use aluminum combined with one or more of elements selected from titanium, tantalum, tungsten, molybdenum, chromium, neodymium, and scandium.

The conductive layer 142 may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer 142 can have a single-layer structure or a stacked structure including two or more layers. For example, the conductive layer 142 can have a single-layer structure of an aluminum film containing silicon, a two-layer structure in which a titanium film is stacked over an aluminum film, or a three-layer structure in which a titanium film, an aluminum film, and a titanium film are stacked in this order. Here, a three-layer structure of a titanium film, an aluminum film, and a titanium film is employed.

Note that an oxide conductive layer may be formed between the oxide semiconductor layer 140 and the conductive layer 142. The oxide conductive layer and the conductive layer 142 can be successively formed. By providing such an oxide conductive layer, the resistance of the source region or the drain region can be reduced, so that the transistor can operate at high speed.

The insulating layer 164 can be formed with a CVD method, a sputtering method, or the like. The insulating layer 164 is preferably formed using silicon oxide, silicon nitride, silicon oxynitride, silicon nitride oxide, aluminum oxide, hafnium oxide, tantalum oxide, or the like. Note that the insulating layer 164 may have a single-layer structure or a stacked structure. There is no particular limitation on the thickness of the insulating layer 164; the insulating layer 164 can be formed in the range of 10 nm to 500 nm inclusive, for example.

Figure 17D:
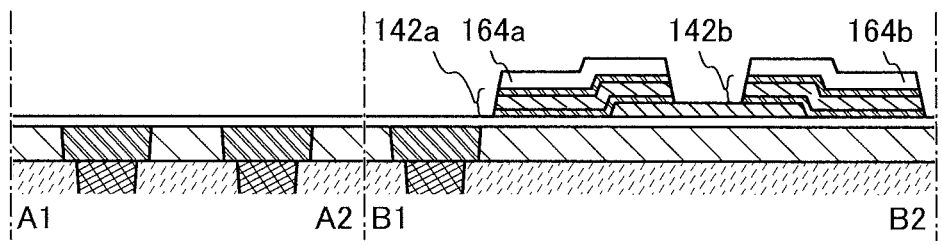

Next, the source or drain electrode 142a, the source or drain electrode 142b, an insulating layer 164a, and an insulating layer 164b are formed by selectively etching the conductive layer 142 and the insulating layer 164 (see FIG. 17D).

Ultraviolet light, KrF laser light, or ArF laser light is preferably used for light exposure at the time of forming a mask used for etching. In particular, in the case where light exposure is performed so that the channel length (L) is less than 25 nm, light exposure for forming a mask is preferably performed with extreme ultraviolet rays whose wavelength is extremely short of several nanometers to several tens of nanometers. The resolution of light exposure with extreme ultraviolet rays is high and the depth of focus is large. For these reasons, it is possible to design a mask so that the channel length (L) of the transistor to be formed later is less than 25 nm, that is, in the range of 10 nm to 1000 nm inclusive. By a decrease in channel length with such a method, operation speed can be improved. In addition, the off-state current of the transistor using an oxide semiconductor is small; thus, an increase in power consumption due to miniaturization can be suppressed.

The materials and etching conditions of the conductive layer 142 and the oxide semiconductor layer 140 are adjusted as appropriate so that the oxide semiconductor layer 140 is not removed in etching of the conductive layer 142. Note that in some cases, the oxide semiconductor layer 140 is partly etched in the etching step and thus has a groove portion (a recessed portion) depending on the materials and the etching conditions.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Figure 17E:
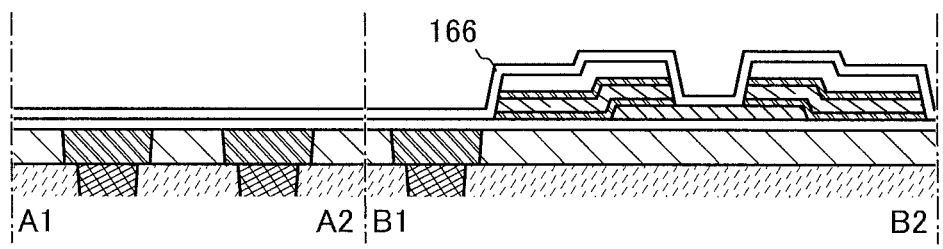

Next, the gate insulating layer 166 is formed in contact with part of the oxide semiconductor layer 140 without exposure to the air (see FIG. 17E). The gate insulating layer 166 can be formed with a CVD method, a sputtering method, or the like. The gate insulating layer 166 is preferably formed using silicon oxide, silicon nitride, silicon oxynitride, silicon nitride oxide, aluminum oxide, hafnium oxide, tantalum oxide, or the like. Note that the gate insulating layer 166 may have a single-layer structure or a stacked structure. There is no particular limitation on the thickness of the gate insulating layer 166; the gate insulating layer 166 can be formed in the range of 10 nm to 500 nm inclusive, for example.

Note that an i-type or substantially i-type oxide semiconductor obtained by removing an impurity (a purified oxide semiconductor) is highly susceptible to interface states or interface charges; therefore, the gate insulating layer 166 needs to have high quality.

For example, the gate insulating layer 166 is preferably formed with a high-density plasma CVD method using a microwave (frequency: 2.45 GHz) because the gate insulating layer 166 can be dense and have high withstand voltage and high quality. When a highly purified oxide semiconductor layer and a high-quality gate insulating layer are in close contact with each other, the interface level can be reduced and favorable interface characteristics can be obtained.

It is needless to say that another method such as a sputtering method or a plasma CVD method can be employed as long as a high-quality insulating layer can be formed as the gate insulating layer 166. Moreover, it is possible to use an insulating layer whose film quality and interface characteristics are improved with heat treatment performed after the formation of the gate insulating layer 166. In any case, an insulating layer that has favorable film quality as the gate insulating layer 166 and can reduce interface level density with an oxide semiconductor layer to form a favorable interface is formed as the gate insulating layer 166.

By thus improving characteristics of the interface with a gate insulating layer and eliminating an impurity, particularly hydrogen, water, or the like, from an oxide semiconductor, it is possible to obtain a stable transistor whose threshold voltage ($V_{th}$) does not change with a gate bias-temperature stress test (BT test, e.g., at 85° C. and $2\times10^6$ V/cm for 12 hours).

After that, second heat treatment is performed under an inert gas atmosphere or an oxygen atmosphere. The heat treatment is performed at a temperature of 200° C. to 400° C. inclusive, preferably 250° C. to 350° C. inclusive. For example, the second heat treatment may be performed at 250° C. for 1 hour under a nitrogen atmosphere. The second heat treatment can reduce variation in electric characteristics of the transistor. Note that although the second heat treatment is performed in this embodiment after the gate insulating layer 166 is formed, there is no particular limitation on the timing of the second heat treatment as long as it is performed after the first heat treatment.

Figure 18A:
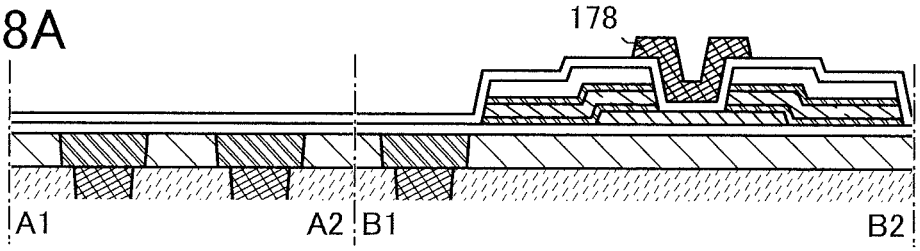
FIGS. 18A to 18D illustrate an example of a manufacturing method of an element of a nonvolatile latch circuit.

Next, the gate electrode 178 is formed over the gate insulating layer 166 in a region overlapping with the oxide semiconductor layer 140 (see FIG. 18A). The gate electrode 178 can be formed by forming a conductive layer over the gate insulating layer 166 and then selectively patterning the conductive layer.

The conductive layer can be formed with a PVD method such as a sputtering method or a CVD method such as a plasma CVD method. As a material for the conductive layer, an element selected from aluminum, chromium, copper, tantalum, titanium, molybdenum, and tungsten; an alloy containing any of these elements as its component; or the like can be used. Moreover, one or more of materials selected from manganese, magnesium, zirconium, beryllium, and yttrium may be used. It is also possible to use aluminum combined with one or more of elements selected from titanium, tantalum, tungsten, molybdenum, chromium, neodymium, and scandium.

The conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer can have a single-layer structure or a stacked structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order. Here, the conductive layer is formed using a material including titanium and then processed into the gate electrode 178.

Figure 18B:
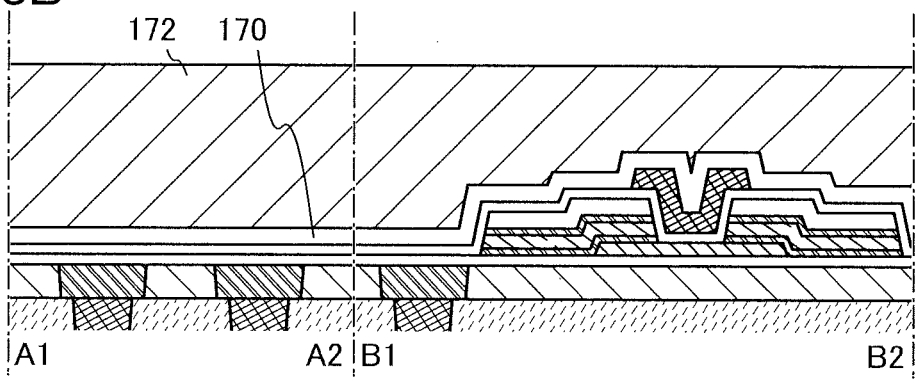
Figure 18C:
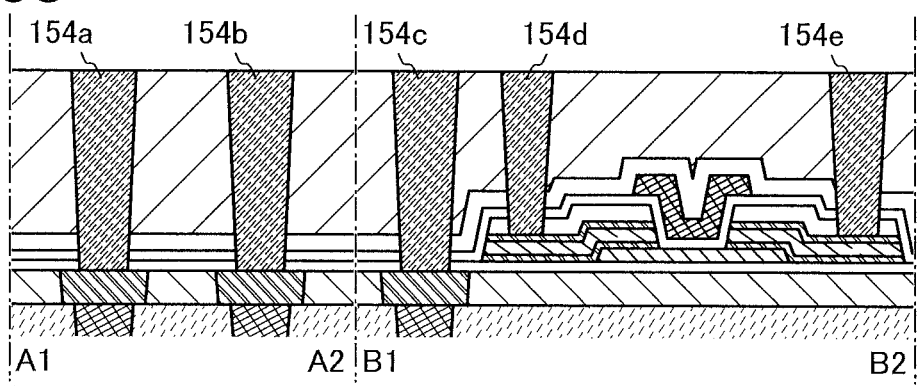
Figure 18D:
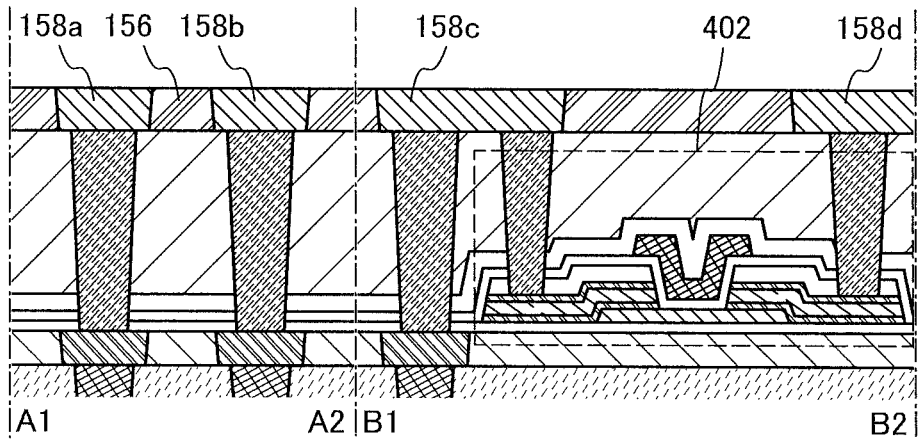

Next, the interlayer insulating layer 170 and the interlayer insulating layer 172 are formed over the gate insulating layer 166 and the gate electrode 178 (see FIG. 18B). The interlayer insulating layer 170 and the interlayer insulating layer 172 can be formed with a PVD method, a CVD method, or the like. The interlayer insulating layer 170 and the interlayer insulating layer 172 can be formed using a material including an inorganic insulating material such as silicon oxide, silicon nitride oxide, silicon nitride, hafnium oxide, aluminum oxide, or tantalum oxide. Note that although a stacked structure of the interlayer insulating layer 170 and the interlayer insulating layer 172 is used in this embodiment, an embodiment of the invention disclosed herein is not limited thereto. A single-layer structure or a stacked structure including three or more layers can also be used.

Note that the interlayer insulating layer 172 is preferably formed so as to have a planarized surface. This is because an electrode, a wiring, or the like can be favorably formed over the interlayer insulating layer 172 when the interlayer insulating layer 172 is formed so as to have a planarized surface.

Next, openings that reach the electrode 136a, the electrode 136b, the electrode 136c, the source or drain electrode 142a, and the source or drain electrode 142b are formed in the gate insulating layer 166, the interlayer insulating layer 170, and the interlayer insulating layer 172. Then, a conductive layer is formed so as to be embedded in the openings. Then, part of the conductive layer is removed with a method such as etching or CMP, so that the interlayer insulating layer 172 is exposed and the electrode 154a, the electrode 154b, the electrode 154c, the electrode 154d, and the electrode 154e are formed (see FIG. 18C).

The openings can be formed with a method such as etching using a mask. The mask can be formed with a method such as light exposure using a photomask. Either wet etching or dry etching may be used as the etching; dry etching is preferably used in terms of microfabrication.

The conductive layer can be formed with a film formation method such as a PVD method or a CVD method. The conductive layer can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings with a PVD method and a thin titanium nitride film is formed with a CVD method, and then, a tungsten film is formed to be embedded in the openings. Here, the titanium film formed with a PVD method has a function of reducing an oxide film which might be formed on the surface of lower electrodes (here, the electrode 136a, the electrode 136b, the electrode 136c, the source or drain electrode 142a, the source or drain electrode 142b, and the like) to decrease the contact resistance with the lower electrodes. The titanium nitride film formed after the formation of the titanium film has a barrier function of preventing diffusion of the conductive material. A copper film may be formed with a plating method after the formation of the barrier film of titanium, titanium nitride, or the like. Note that not only a so-called single damascene method but also a dual damascene method may be employed.

When part of the conductive layer is removed, the process is preferably performed so that the exposed surface of the interlayer insulating layer 172; the surfaces of the electrode 154a, the electrode 154b, the electrode 154c, the electrode 154d, and the electrode 154e; and the like are planarized. The surfaces are planarized in this manner, whereby an electrode, a wiring, or the like can be favorably formed in a later step.

Then, the insulating layer 156 is further formed, and openings that reach the electrode 154a, the electrode 154b, the electrode 154c, the electrode 154d, and the electrode 154e are formed in the insulating layer 156. After a conductive layer is formed to be embedded in the openings, part of the conductive layer is removed with a method such as etching or CMP. Thus, the insulating layer 156 is exposed and the electrode 158a, the electrode 158b, the electrode 158c, and the electrode 158d are formed (see FIG. 18D). This step is similar to the step of forming the electrode 154a and the like; therefore, the detailed description is omitted.

In the case where the transistor 402 is formed with the aforementioned method, the hydrogen concentration in the oxide semiconductor layer 140 is $5\times10^{19}/cm^3$ or less and the off-state current of the transistor 402 is $1\times10^{-13}$ A or less. The transistor 402 with excellent characteristics can be obtained by the application of the oxide semiconductor layer 140 that is highly purified by sufficiently reducing the hydrogen concentration and supplying oxygen as described above.

Note that it is preferable that oxygen be supplied to the oxide semiconductor layer 140 shortly after the hydrogen concentration is reduced because there is no possibility that hydrogen, water, or the like enters the oxide semiconductor layer and thus an oxide semiconductor layer with extremely favorable characteristics can be realized. It is needless to say that treatment for reducing the hydrogen concentration and treatment for supplying oxygen do not need to be performed successively as long as an oxide semiconductor layer with favorable characteristics can be realized. For example, another treatment may be performed between both of the treatment. Alternatively, both of the treatment may be performed at the same time.

Since the nonvolatile latch circuit includes the transistor 160 formed using a material other than an oxide semiconductor in the lower portion and the transistor 402 formed using an oxide semiconductor in the upper portion, it is possible to manufacture an excellent nonvolatile latch circuit having characteristics of both the transistors, and a semiconductor device using the nonvolatile latch circuit.

Although a lot of researches on properties of an oxide semiconductor such as density of state (DOS) have been conducted, they do not include the idea of sufficiently reducing localized states themselves. According to an embodiment of the invention disclosed herein, a highly purified oxide semiconductor is formed by removing water or hydrogen which might affect the localized states. This is based on the idea that the localized states themselves are sufficiently reduced. Such a highly purified oxide semiconductor enables fabrication of very excellent industrial products.

Note that when hydrogen, water, or the like is removed, oxygen is also removed in some cases. Therefore, it is preferable to obtain more highly purified (i-type) oxide semiconductor by supplying oxygen to dangling bonds of metal which are generated by oxygen deficiency so that localized states resulted from oxygen deficiency are reduced. For example, localized states resulted from oxygen deficiency can be reduced in the following manner: an oxide film having excessive oxygen is formed in a close contact with a channel formation region; and heat treatment at 200° C. to 400° C., typically approximately 250° C., is performed so that oxygen is supplied to an oxide semiconductor from the oxide film. An inert gas may be switched to a gas including oxygen during the second heat treatment. In addition, the aforementioned atmosphere may be switched; the oxide semiconductor layer can also be supplied with oxygen by being subjected to a temperature fall process in an oxygen atmosphere or an atmosphere from which hydrogen or water is sufficiently removed, successively after the second heat treatment.

A defect of an oxide semiconductor is said to be attributed to a level of 0.1 eV to 0.2 eV under the conduction band due to excessive hydrogen, a deep level due to shortage of oxygen, or the like. Thorough removal of hydrogen and sufficient supply of oxygen for elimination of such a defect would be right as a technological thought.

An oxide semiconductor is generally considered as an n-type semiconductor; however, according to an embodiment of the invention disclosed herein, an i-type semiconductor is realized by removing an impurity such as water and hydrogen and supplying oxygen that is a component of an oxide semiconductor. In this respect, it can be said that an embodiment of the invention disclosed herein includes a novel technical idea because it is different from an i-type semiconductor such as silicon added with an impurity.

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized. Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

The structures, methods, and the like described in this embodiment can be combined as appropriate with any of the structures, methods, and the like described in the other embodiments.

[Embodiment 3]

In this embodiment, the configuration and the operation of the nonvolatile latch circuit which is an embodiment of the invention disclosed herein will be described with reference to FIGS. 19A and 19B.

Figure 19A:
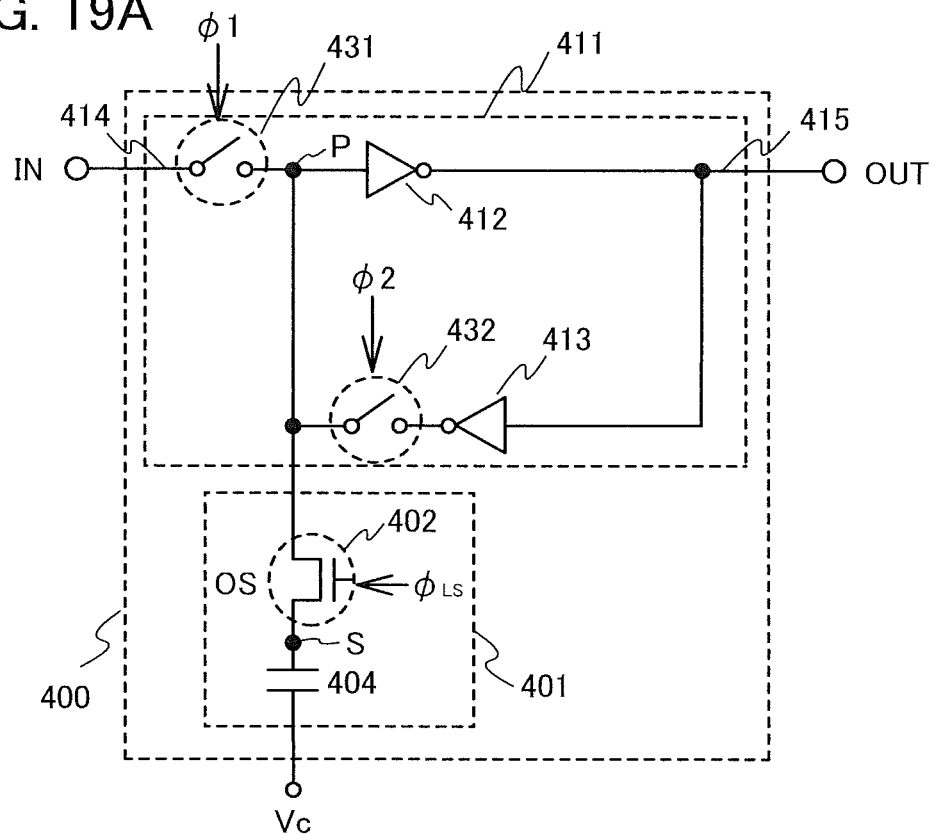
FIG. 19A illustrates an example of a configuration of a nonvolatile latch circuit.

FIG. 19A illustrates a configuration of the nonvolatile latch circuit 400 including the latch portion 411 and the data holding portion 401 for holding data of the latch portion. FIG. 19B illustrates an example of a timing chart of the nonvolatile latch circuit 400.

FIG. 19A is an example in which the configuration of the latch portion 411 in FIG. 1 is specifically illustrated. FIG. 19A is an example of the configuration of the latch portion 411 in FIG. 1, where an inverter 412 is used for the first element and an inverter 413 is used for the second element. The structure of the transistor 402 can be similar to that in Embodiment 1 or Embodiment 2.

The latch portion 411 includes the inverter 412 and the inverter 413. The latch portion 411 has a loop structure in which an output of the inverter 412 is electrically connected to an input of the inverter 413, and an output of the inverter 413 is electrically connected to an input of the inverter 412. In addition, the latch portion 411 includes a switch 431 and a switch 432, and the output of the inverter 413 is electrically connected to the input of the inverter 412 via the switch 432.

The input of the inverter 412 is electrically connected to the wiring 414 supplied with the input signal of the latch circuit via the switch 431. The output of the inverter 412 is electrically connected to the wiring 415 supplied with the output signal of the latch circuit. A node which is connected to the input of the inverter 412 is referred to as a node P. The node P is electrically connected to the wiring 414 supplied with the input signal of the latch circuit. Moreover, the node P is also electrically connected to the output of the inverter 413. Note that the potential of the node P is the same as that of the input of the inverter 412.

In the data holding portion 401, the transistor 402 using an oxide semiconductor as a semiconductor material for forming a channel formation region is used as a switching element. In addition, the data holding portion 401 includes the capacitor 404 which is electrically connected to one of the source electrode and the drain electrode of the transistor 402. One of the electrodes of the capacitor 404 is electrically connected to one of the source electrode and the drain electrode of the transistor 402. The other of the source electrode and the drain electrode of the transistor is electrically connected to the input of the inverter 412 (the node P) in the latch portion.

In addition, the other of the source electrode and the drain electrode of the transistor is electrically connected to the wiring 414 supplied with the input signal of the latch circuit via the switch 431. The other electrode of the capacitor 404 is supplied with a potential $V_c$. A node where the transistor 402 and the capacitor 404 are electrically connected to each other is referred to as a node S.

The transistor 402 using an oxide semiconductor has a function of writing data held in the latch portion 411 into the capacitor 404 of the data holding portion 401. In addition, the transistor 402 has a function of holding the data written into the capacitor 404 of the data holding portion 401. Moreover, the transistor 402 has a function of reading the data held in the capacitor 404 of the data holding portion 401 to the latch portion 411.

The wiring 414 is supplied with a potential of an input signal IN from a circuit of a previous stage. A circuit of a subsequent stage is supplied with the potential of the wiring 415 as an output signal OUT. The switch 431 is supplied with a potential of a clock signal $\phi 1$. When the clock signal $\phi 1$ is supplied with a high-level potential, the switch 431 is turned on. The switch 432 is supplied with a potential of a clock signal $\phi 2$. When the clock signal $\phi 2$ is supplied with a high-level potential, the switch 432 is turned on. A gate of the transistor 402 is supplied with a potential of a control signal $\phi_{LS}$. When the control signal $\phi_{LS}$ is supplied with a high-level potential, the transistor 402 is turned on. In a normal operation period, the clock signal $\phi 2$ has an inverted signal of the clock signal $\phi 1$. Here, an example is shown in which the transistors and the switches are turned on when the potentials of the control signals and the clock signals are at high levels.

Each of the inverter 412 and the inverter 413 of the latch portion 411 is supplied with a high-level power source voltage VDD and a low-level power source voltage VSS.

Figure 19B:
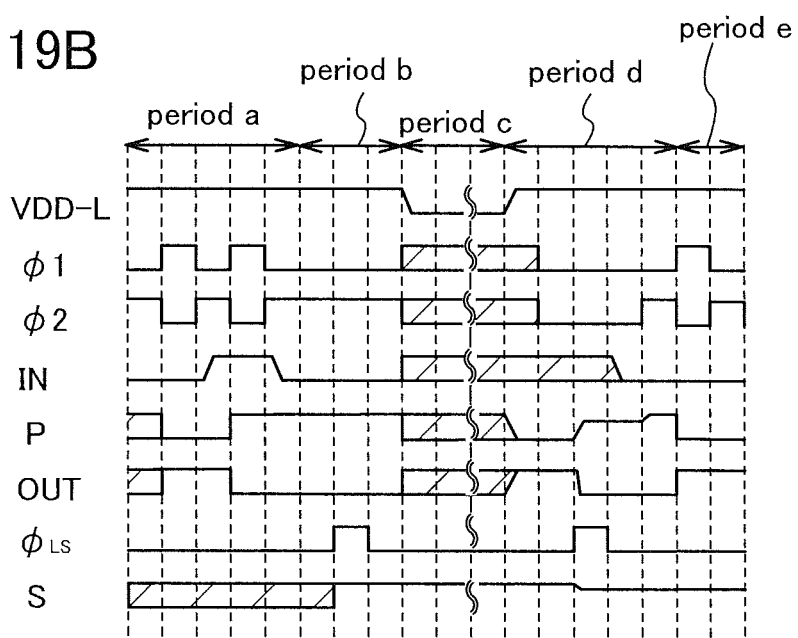
FIG. 19B illustrates an example of an operation of the nonvolatile latch circuit.

Next, FIG. 19B illustrates an example of a timing chart of the potentials of the input signal IN, the output signal OUT, the control signal $\phi_{LS}$, the clock signal $\phi 1$, and the clock signal $\phi 2$ in a period in which the nonvolatile latch circuit 400 is in an operation state (an operation period) and in a period in which the nonvolatile latch circuit 400 is in a stop state (a non-operation period). In addition, FIG. 19B illustrates the potentials of the node S of the data holding portion 401, the node P of the latch portion 411, and the power source voltage VDD-L of the inverter 412 and the inverter 413 of the latch portion 411. The node S indicates the potential of one of the electrodes of the capacitor 404. Note that the other electrode of the capacitor 404 is supplied with a predetermined potential $V_c$, for example, a ground potential.

In FIG. 19B, a period a, a period b, a period d, and a period e are each a period in which the nonvolatile latch circuit 400 is in an operation state (an operation period), and a period c is a period in which the nonvolatile latch circuit 400 is in a stop state (a non-operation period). In each of the period a and the period e, the nonvolatile latch circuit 400 is in a normal operation period, and the clock signal φ1 and the clock signal φ2 are each supplied with a high-level potential or a low-level potential alternately. The period b is a preparation period prior to the non-operation period. The period b is also referred to as a falling period. The period d is a preparation period between the non-operation period and restart of a normal operation period after the supply of power. The period d is also referred to as a rising period.

When the clock signal φ1 is supplied with a high-level potential and the clock signal φ2 is supplied with a low-level potential in the normal operation period (period a), the switch 432 is turned off and an inverter loop is cut, the switch 431 is turned on, and the potential of the input signal is inputted to the inverter 412. The potential of the input signal is inverted by the inverter 412 and is supplied to a circuit of a subsequent stage as the output signal OUT. If the potential of the input signal is at a high level when the clock signal φ1 is supplied with a high-level potential, an output signal having a low-level potential can be obtained. If the potential of the input signal is at a low level when the clock signal φ1 is supplied with a high-level potential, an output signal having a high-level potential can be obtained.

When the clock signal φ1 is supplied with a low-level potential and the clock signal φ2 is supplied with a high-level potential, the switch 431 is turned off, the switch 432 is turned on and an inverter loop is formed, and the potential of the output signal OUT is held (data is latched, i.e., the logical state of the latch circuit is held).

In the normal operation period, the control signal $\phi_{LS}$ is supplied with a potential at which the transistor 402 is turned off and not supplied with a potential at which the transistor 402 is turned on. The node S has the potential corresponding to the charge which has been held. Here, the potential of the node S is set to an undefined value.

Next, when the control signal $\phi_{LS}$ is supplied with a potential at which the transistor 402 is turned on in the preparation period (period b) prior to the non-operation period, the transistor 402 is turned on and the node S is supplied with the potential of the input of the inverter 412 (the node P) in the latch portion (this operation corresponds to writing). When the potential of the input of the inverter 412 (the node P) in the latch portion 412 is set to a high level, the potential of the node S is a high level. The charge corresponding to the potential is accumulated in the node S.

After that, the transistor 402 is turned off by supplying the control signal $\phi_{LS}$ with the potential at which the transistor 402 is turned off, and the node S becomes a floating state. As a result, the charge accumulated in the node S is held without any change (holding).

Note that it is sufficient that, in the period b, the clock signal φ2 and the clock signal φ1 hold a potential at the termination of the period a. Alternatively, data at the termination of the period a may be latched by fixing the potential of the clock signal φ2 to a high level and the potential of the clock signal φ1 to a low level.

Next, in the non-operation period (period c), the supply of power is stopped and the potential of the power source voltage VDD-L is lowered. The potentials of the clock signal φ1, the clock signal φ2, the input signal IN, and the output signal OUT can take any values between VDD and VSS. During this time, the potential of the control signal $\phi_{LS}$ is held at a low level so that the transistor 402 is turned off. For example, the potential is held at a ground potential. In the non-operation period (period c), the charge accumulated in the node S is held by turning off the transistor 402 (holding).

Next, in the preparation period (period d) between the non-operation period and restart of a normal operation period, power is supplied, and the potentials of the clock signal φ2 and the clock signal φ1 are each fixed to a low level. Although the potentials of the node P and the output signal OUT depend on the potential of the node P, the potential of the output signal OUT, and the like which are prior to the supply of power, here, it is considered that the node P has a low-level potential and the output signal OUT has a high-level potential.

Then, when the control signal $\phi_{LS}$ is supplied with a potential at which the transistor 402 is turned on, the transistor 402 is turned on and the potential held in the node S is supplied to the latch portion 411. Specifically, the charge is distributed to the node S and the input of the inverter 412 (the node P), and the input of the inverter 412 (the node P) is supplied with the potential corresponding to the charge accumulated in the node S. Here, the charge accumulated in the node S is distributed to the latch portion 411, the potential of the input of the inverter 412 (the node P) is raised, and the potential of the node S is lowered to some extent. As a result, the input of the inverter 412 (the node P) and the node S each substantially have a high-level potential.

Then, the potential of the node P in the latch portion is inverted by the inverter 412 and is supplied to a circuit of a subsequent stage as the output signal OUT. Shown here is an example in which the potential held in the node S and the potential supplied to the node P of the latch portion are at high levels, and an output signal having a low-level potential can be obtained. Accordingly, the logical state of the latch circuit can be restored to the logical state prior to the non-operation period.

After that, the transistor 402 is turned off by supplying the control signal $\phi_{LS}$ with the potential at which the transistor 402 is turned off, and the node S becomes a floating state. As a result, the charge accumulated in the node S is held without any change (holding). The charge accumulated in the node S can be rewritten at the timing at which the control signal $\phi_{LS}$ is supplied next with a potential at which the transistor 402 is turned on. Therefore, the charge accumulated in the node S is held without any change until the timing at which the control signal $\phi_{LS}$ is supplied next with the potential at which the transistor 402 is turned on.

In addition, in the period d, a period in which the clock signal φ2 is set to high level may be provided after the control signal $\phi_{LS}$ is supplied with a potential at which the transistor 402 is turned on. When the clock signal φ2 is supplied with a high-level potential, the switch 432 is turned on, and an inverter loop is formed. When the inverter loop is formed, the output signal OUT and the node P are each supplied with a high-level potential or a low-level potential, and the potentials are held (data is latched).

As described above, the data is read to the latch portion by distributing the charge to the node S and the input of the inverter 412 (the node P). In the case where the charge corresponding to a high-level potential is accumulated in the node S, after the charge is distributed to the node S and the input of the inverter 412 (the node P), the potential of the input of the inverter 412 (the node P) is set higher than the threshold value of the inverter 412 (an input potential at which the output of the inverter is inverted) without dependence on the potential of the input of the inverter 412 (the node P) before the transistor 402 is turned on.

In the case where the charge corresponding to a low-level potential is accumulated in the node S, after the charge is distributed to the node S and the input of the inverter 412 (the node P), the potential of the input of the inverter 412 (the node P) is set lower than the threshold value of the inverter 412 (the input potential at which the output of the inverter is inverted) without dependence on the potential of the input of the inverter 412 (the node P) before the transistor 402 is turned on.

In order to achieve the above, it is preferable that a capacitance of the node S be larger than a capacitance of the node P, for example. In other words, it is preferable that the capacitance of the capacitor 404 to which the node S is electrically connected be larger than an input capacitance of the inverter 412, to which the node P is electrically connected, (the input capacitance corresponds to the gate capacitance of a transistor of the inverter). In addition, in the period d, it is effective to provide a period in which the potential $V_c$ is set to a value between VDD and VSS. Accordingly, the reading operation can be performed more stably.

In such a manner, without limitation to the case where the node P has a low-level potential and the output signal OUT has a high-level potential, data can be read to the latch portion also in the case where the node P has a high-level potential and the output signal OUT has a low-level potential. In addition, without limitation to the case where the charge corresponding to a high-level potential is accumulated in the node S, data can be read to the latch portion even in the case where the charge corresponding to a low-level potential is accumulated.

Next, the clock signal φ1 and the clock signal φ2 are each supplied with a high-level potential or a low-level potential alternately to be a normal operation state (the period e). At the start of the normal operation period (period e), the operations of the clock signal φ1 and the clock signal φ2 may be started from the same potentials (same state) as the termination of the previous normal operation period (period a) or may be started from an inverted potential of the potential at the termination of the period a (this inverted potential is also referred to as a subsequent state of the period a).

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized. Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

This embodiment can be freely combined with any of the other embodiments.

[Embodiment 4]

In this embodiment, another example of the operation of the nonvolatile latch circuit which is an embodiment of the invention disclosed herein will be described with reference to FIG. 20A. The configuration of the nonvolatile latch circuit is the same as that in FIG. 19A, and the timing chart is different from that in FIG. 19B in this example.

Figure 20A:
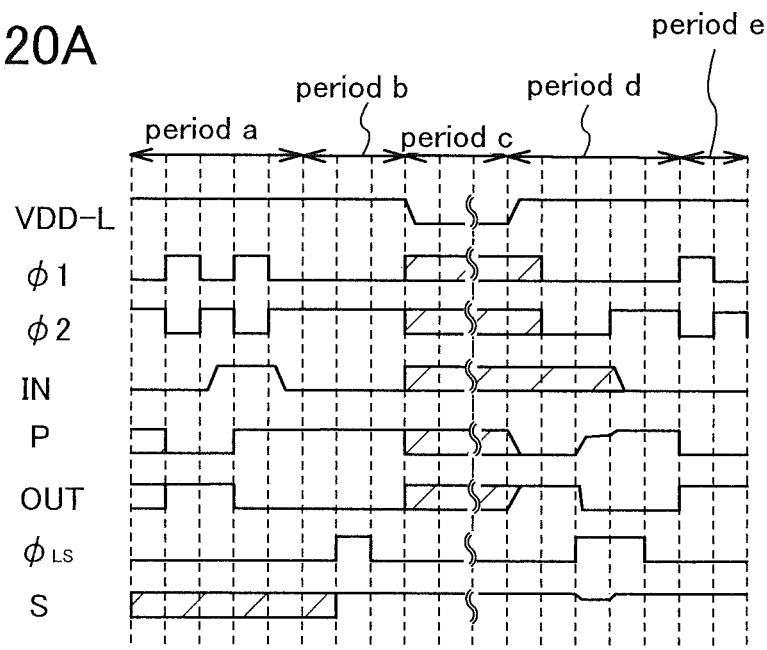
FIGS. 20A and 20B each illustrate an example of an operation of a nonvolatile latch circuit.

FIG. 20A illustrates an example of a timing chart of potentials of an input signal IN, an output signal OUT, a control signal $\phi_{LS}$, a clock signal φ1, and a clock signal φ2 in a period in which the nonvolatile latch circuit 400 is in an operation state (an operation period) and in a period in which the nonvolatile latch circuit 400 is in a stop state (a non-operation period). In addition, FIG. 20A illustrates the potentials of the node S of the data holding portion 401, the node P of the latch portion 411, and the power source voltage VDD-L. The node S indicates the potential of one of the electrodes of the capacitor 404. Note that the other electrode of the capacitor 404 is supplied with a potential $V_c$.

In FIG. 20A, a period a, a period b, a period d, and a period e are each a period in which the nonvolatile latch circuit 400 is in an operation state (an operation period), and a period c is a period in which the nonvolatile latch circuit 400 is in a stop state (a non-operation period). In each of the period a and the period e, the nonvolatile latch circuit 400 is in a normal operation period, and the clock signal φ1 and the clock signal φ2 are each supplied with a high-level potential or a low-level potential alternately. The period b is a preparation period prior to the non-operation period. The period b is also referred to as a falling period. The period d is a preparation period between the non-operation period and restart of a normal operation period. The period d is also referred to as a rising period.

In FIG. 20A, the operations of the period a, the period b, and the period c are similar to those in FIG. 19B. Next, in the preparation period (period d) between the non-operation period and restart of a normal operation period after the supply of power, the potentials of the clock signal φ2 and the clock signal φ1 are each fixed to a low level. Although the potentials of the node P and the output signal OUT depend on the potential of the node P, the potential of the output signal OUT, and the like which are prior to the supply of power, here, it is considered that the node P has a low-level potential and the output signal OUT has a high-level potential.

Then, when the control signal $\phi_{LS}$ is supplied with a potential at which the transistor 402 is turned on, the transistor 402 is turned on and the potential held in the node S is supplied to the latch portion 411. Specifically, the charge is distributed to the node S and the input of the inverter 412 (the node P), and the input of the inverter 412 (the node P) is supplied with the potential corresponding to the charge accumulated in the node S. Here, the charge accumulated in the node S is distributed to the latch portion 411, the potential of the input of the inverter 412 (the node P) is raised, and the potential of the node S is lowered to some extent.

As a result, the input of the inverter 412 (the node P) and the node S each substantially have a high-level potential. Then, the potential of the node P in the latch portion is inverted by the inverter 412 and is supplied to a circuit of a subsequent stage as the output signal OUT. Shown here is an example in which the potential held in the node S and the potential supplied to the node P of the latch portion are at high levels, and an output signal having a low-level potential can be obtained. Accordingly, the logical state of the latch circuit can be restored to the logical state prior to the non-operation period.

Next, the clock signal φ2 is supplied with a high-level potential while the control signal φ$_{LS}$ is supplied with a potential at which the transistor 402 is turned on. When the clock signal φ2 is supplied with a high-level potential, the switch 432 is turned on, and an inverter loop is formed. When the inverter loop is formed, the output signal OUT and the node P are each supplied with a high-level potential or a low-level potential, and the potentials are held (data is latched).

In particular, since the charge is distributed to the node S and the input of the inverter 412 (the node P), even when the potential of the input of the inverter 412 (the node P) is shifted to some extent from a high-level potential or a low-level potential, a high-level potential or a low-level potential is supplied again. Then, the potential of the node P is supplied to the node S. Accordingly, even when the potential of the node S is shifted to some extent from a high-level potential or a low-level potential, a high-level potential or a low-level potential is supplied again. As a result, the potential of the node S can be restored to the potential before the change (this operation is also referred to as rewriting).

After that, the transistor 402 is turned off by supplying the control signal φ$_{LS}$ with a potential at which the transistor 402 is turned off, and the potential of the node S becomes a floating state. As a result, the charge accumulated in the node S is held without any change (holding). The charge accumulated in the node S can be rewritten at the timing at which the control signal φ$_{LS}$ is supplied next with a potential at which the transistor 402 is turned on. Therefore, the charge accumulated in the node S is held without any change until the timing at which the control signal φ$_{LS}$ is supplied next with the potential at which the transistor 402 is turned on.

As described above, the data is read to the latch portion by distributing the charge to the node S and the input of the inverter 412 (the node P). In the case where the charge corresponding to a high-level potential is accumulated in the node S, after the charge is distributed to the node S and the input of the inverter 412 (the node P), the potential of the input of the inverter 412 (the node P) is set higher than the threshold value of the inverter 412 (an input potential at which the output of the inverter is inverted) without dependence on the potential of the input of the inverter 412 (the node P) before the transistor 402 is turned on.

In the case where the charge corresponding to a low-level potential is accumulated in the node S, after the charge is distributed to the node S and the input of the inverter 412 (the node P), the potential of the input of the inverter 412 (the node P) is set lower than the threshold value of the inverter 412 (the input potential at which the output of the inverter is inverted) without dependence on the potential of the input of the inverter 412 (the node P) before the transistor 402 is turned on.

In order to achieve the above, it is preferable that a capacitance of the node S be larger than a capacitance of the node P, for example. In other words, it is preferable that the capacitance of the capacitor 404 to which the node S is electrically connected be larger than the capacitance of an input capacitance of the inverter 412, to which the node P is electrically connected, (the input capacitance corresponds to the gate capacitance of a transistor of the inverter). In addition, in the period d, it is effective to provide a period in which the potential V$_c$ is set to a value between VDD and VSS. Accordingly, the reading operation can be performed more stably.

In such a manner, without limitation to the case where the node P has a low-level potential and the output signal OUT has a high-level potential, data can be read to the latch portion also in the case where the node P has a high-level potential and the output signal OUT has a low-level potential. In addition, without limitation to the case where the charge corresponding to a high-level potential is accumulated in the node S, data can be read to the latch portion even in the case where the charge corresponding to a low-level potential is accumulated.

Next, the clock signal φ1 and the clock signal φ2 are each supplied with a high-level potential or a low-level potential alternately to be a normal operation state (the period e). At the start of the normal operation period (period e), the operations of the clock signal φ1 and the clock signal φ2 may be started from the same potentials (same state) as the termination of the previous normal operation period (period a) or may be started from an inverted potential of the potential at the termination of the period a (this inverted potential is also referred to as a subsequent state of the period a).

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized.

Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

This embodiment can be freely combined with any of the other embodiments.

[Embodiment 5]

In this embodiment, another example of the operation of the nonvolatile latch circuit which is an embodiment of the invention disclosed herein will be described with reference to FIG. 20B. The configuration of the nonvolatile latch circuit is the same as that in FIG. 19A, and the timing chart is different from those in FIG. 19B and FIG. 20A in this example.

FIG. 20A illustrates an example of a timing chart of potentials of an input signal IN, an output signal OUT, a control signal φ$_{LS}$, a clock signal φ1, and a clock signal φ2 in a period in which the nonvolatile latch circuit 400 is in an operation state (an operation period) and in a period in which the nonvolatile latch circuit 400 is in a stop state (a non-operation period). In addition, FIG. 20A illustrates the potentials of the node S of the data holding portion 401, the node P of the latch portion 411, and the power source voltage VDD-L, and a potential $V_c$ of the other electrode of the capacitor 404. The node S indicates the potential of one of the electrodes of the capacitor 404.

Figure 20B:
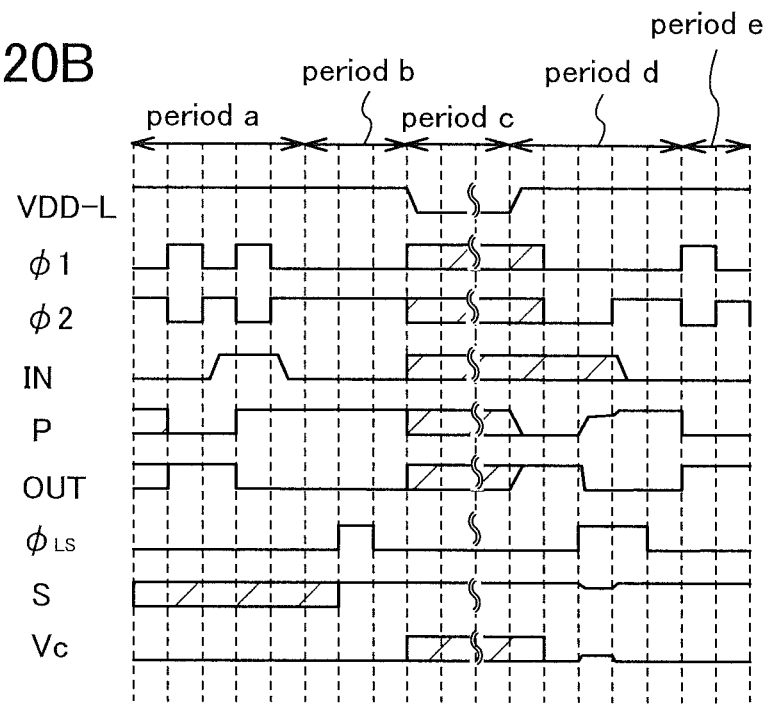

In FIG. 20B, a period a, a period b, a period d, and a period e are each a period in which the nonvolatile latch circuit 400 is in an operation state (an operation period), and a period c is a period in which the nonvolatile latch circuit 400 is in a stop state (a non-operation period). In each of the period a and the period e, the nonvolatile latch circuit 400 is in a normal operation period, and the clock signal φ1 and the clock signal φ2 are each supplied with a high-level potential or a low-level potential alternately. The period b is a preparation period prior to the non-operation period. The period b is also referred to as a falling period. The period d is a preparation period between the non-operation period and restart of a normal operation period after the supply of power. The period d is also referred to as a rising period.

In FIG. 20B, the operations of the period a, the period b, and the period c are similar to those in FIG. 19B. Next, in the preparation period (period d) between the non-operation period and restart of a normal operation period, power is supplied, and the potentials of the clock signal φ2 and the clock signal φ1 are each fixed to a low level. Although the potentials of the node P and the output signal OUT depend on the potential of the node P, the potential of the output signal OUT, and the like which are prior to the supply of power, here, it is considered that the node P has a low-level potential and the output signal OUT has a high-level potential.

Then, when the control signal $φ_{LS}$ is supplied with a potential at which the transistor 402 is turned on, the transistor 402 is turned on and the potential held in the node S is supplied to the latch portion 411. Specifically, the charge is distributed to the node S and the input of the inverter 412 (the node P). Then, the potential $V_c$ of the other electrode of the capacitor is supplied with a predetermined potential at the timing at which the control signal $φ_{LS}$ is supplied with a potential at which the transistor 402 is turned on. The potential $V_c$ is raised from a low-level potential to be a potential between a low-level potential and a high-level potential.

Accordingly, the input of the inverter 412 (the node P) is supplied with a potential in which an increase of the potential $V_c$ of the other electrode of the capacitor is added to the potential which is determined by the distribution of the charge to the input of the inverter 412 (the node P) and the node S. Here, the charge accumulated in the node S is distributed to the latch portion 411 and the potential $V_c$ is supplied with a predetermined potential, the potential of the input of the inverter 412 (the node P) is raised, and the potential of the node S is lowered to some extent. As a result, the input of the inverter 412 (the node P) and the node S each substantially have a high-level potential.

Then, the potential of the node P in the latch portion is inverted by the inverter 412 and is supplied to a circuit of a subsequent stage as the output signal OUT. Accordingly, the logical state of the latch circuit can be restored to the logical state prior to the non-operation period. After that, the potential $V_c$ of the other electrode of the capacitor is restored to be a low-level potential.

Next, the clock signal φ2 is supplied with a high-level potential while the control signal $φ_{LS}$ is supplied with a potential at which the transistor 402 is turned on. When the clock signal φ2 is supplied with a high-level potential, the switch 432 is turned on, and an inverter loop is formed. When the inverter loop is formed, the output signal OUT and the node P are each supplied with a high-level potential or a low-level potential, and the potentials are held (data is latched).

In particular, since the charge is distributed to the node S and the input of the inverter 412 (the node P), even when the potential of the input of the inverter 412 (the node P) is shifted to some extent from a high-level potential or a low-level potential, a high-level potential or a low-level potential is supplied again. Then, the potential of the node P is supplied to the node S. Accordingly, even when the potential of the node S is shifted to some extent from a high-level potential or a low-level potential, a high-level potential or a low-level potential is supplied again. As a result, the potential of the node S can be restored to the potential before the change (this operation is also referred to as rewriting).

After that, the transistor 402 is turned off by supplying the control signal $φ_{LS}$ with a potential at which the transistor 402 is turned off, and the node S becomes a floating state. As a result, the charge accumulated in the node S is held without any change (holding). The charge accumulated in the node S can be rewritten at the timing at which the control signal $φ_{LS}$ is supplied next with a potential at which the transistor 402 is turned on. Therefore, the charge accumulated in the node S is held without any change until the timing at which the control signal $φ_{LS}$ is supplied next with the potential at which the transistor 402 is turned on.

As described above, the data is read to the latch portion by distributing the charge to the node S and the input of the inverter 412 (the node P) and controlling the potential $V_c$. In the case where the charge corresponding to a high-level potential is accumulated in the node S, after the charge is distributed to the node S and the input of the inverter 412 (the node P), the potential of the input of the inverter 412 (the node P) is set higher than the threshold value of the inverter 412 (an input potential at which the output of the inverter is inverted) without dependence on the potential of the input of the inverter 412 (the node P) before the transistor 402 is turned on.

In the case where the charge corresponding to a low-level potential is accumulated in the node S, after the charge is distributed to the node S and the input of the inverter 412 (the node P), the potential of the input of the inverter 412 (the node P) is set lower than the threshold value of the inverter 412 (the input potential at which the output of the inverter is inverted) without dependence on the potential of the input of the inverter 412 (the node P) before the transistor 402 is turned on.

In order to achieve the above, it is preferable that a capacitance of the node S be larger than a capacitance of the node P, for example. In other words, it is preferable that the capacitance of the capacitor 404 to which the node S is electrically connected be larger than an input capacitance of the inverter 412, to which the node P is electrically connected, (the input capacitance corresponds to the gate capacitance of a transistor of the inverter). In addition, in the period d, it is effective to provide a period in which the potential $V_c$ is set to a value between VDD and VSS. Accordingly, the reading operation can be performed more stably.

In such a manner, without limitation to the case where the node P has a low-level potential and the output signal OUT has a high-level potential, data can be read to the latch portion also in the case where the node P has a high-level potential and the output signal OUT has a low-level potential. In addition, without limitation to the case where the charge corresponding to a high-level potential is accumulated in the node S, data can be read to the latch portion even in the case where the charge corresponding to a low-level potential is accumulated.

In particular, as described in this embodiment, the potential $V_c$ of the other electrode of the capacitor is supplied with a predetermined potential at the timing at which the control signal $\phi_{LS}$ is supplied with the potential at which the transistor 402 is turned on, so that the reading operation can be performed more stably.

For example, in the case where the capacitance of the capacitor 404 is small or the case where the supply of power is stopped for a long time, it is difficult to maintain the relationship of the potential of the input of the inverter 412 (the node P) after the charge distribution and the threshold value of the inverter 412 (the input potential at which the output of the inverter is inverted); therefore, there is a possibility that the stability of reading might be degraded.

Even in such cases, the aforementioned potential relationship can be maintained and a potential difference thereof can be maintained as large as possible by supplying the potential $V_c$ of the other electrode of the capacitor with a predetermined potential. As a result, stable reading can be performed. In other words, the reading operation can be performed even in the case of a capacitor having a smaller capacitance and thus miniaturization is possible. Further, a data holding period can be made longer.

Note that the timing at which the potential $V_c$ of the other electrode of the capacitor is restored to be a low-level potential may be after the clock signal $\phi 2$ is supplied with a high-level potential. The potential of the other electrode of the capacitor may be restored to a low-level potential before the control signal $\phi_{LS}$ is supplied with the potential at which the transistor 402 is turned off.

Next, the clock signal $\phi 1$ and the clock signal $\phi 2$ are each supplied with a high-level potential or a low-level potential alternately to be a normal operation state (the period e). At the start of the normal operation period (period e), the operations of the clock signal $\phi 1$ and the clock signal $\phi 2$ may be started from the same potentials (same state) as the termination of the previous normal operation period (period a) or may be started from an inverted potential of the potential at the termination of the period a (this inverted potential is also referred to as a subsequent state of the period a).

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized.

Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily. In addition, the capacitance of the capacitor of the data holding portion can be reduced and the capasitor can be reduced in size thus miniaturization is possible.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

This embodiment can be freely combined with any of the other embodiments.

[Embodiment 6]

In this embodiment, a configuration of a logic circuit including a plurality of the nonvolatile latch circuits which are each an embodiment of the invention disclosed herein will be described with reference to FIG. 21.

Figure 21:
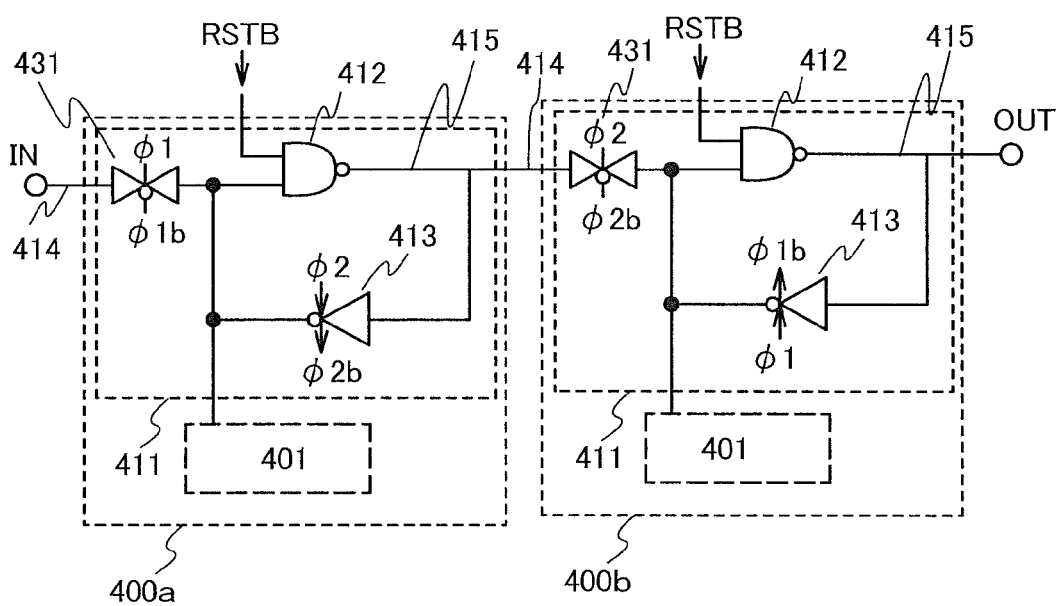
FIG. 21 illustrates an example of a configuration of a nonvolatile latch circuit.

FIG. 21 illustrates a configuration of a logic circuit including two nonvolatile latch circuits 400 each including a latch portion 411 and a data holding portion 401 for holding data of the latch portion. This logic circuit is referred to as D-FF and used as a register in a CPU or various logic circuits.

The configuration of the data holding portion 401 is similar to that in FIG. 1. The configuration of the latch portion 411 is an example in which a NAND is used for the first element and a clocked inverter is used for the second element in the configuration of the latch portion 411 of FIG. 1.

The latch portion 411 includes a NAND 412 and a clocked inverter 413. The latch portion 411 has a loop structure in which an output of the NAND 412 is electrically connected to an input of the clocked inverter 413, and an output of the clocked inverter 413 is electrically connected to an input of the NAND 412. In addition, the latch portion 411 includes an analog switch 431.

One of inputs of the NAND 412 is electrically connected to a wiring 414 supplied with an input signal of the latch circuit 400 via the analog switch 431. The output of the NAND 412 is electrically connected to a wiring 415 supplied with an output signal of the latch circuit 400. The other input of the NAND 412 is electrically connected to a wiring supplied with a signal RSTB. The analog switch 431 is supplied with a clock signal and an inverted signal of the clock signal. The clocked inverter 413 is supplied with a clock signal and an inverted signal of the clock signal.

The logic circuit in FIG. 21 includes a nonvolatile latch circuit 400a and a nonvolatile latch circuit 400b as the aforementioned nonvolatile latch circuits 400. The nonvolatile latch circuit 400a is electrically connected to the wiring 414 supplied with a potential of an input signal from a circuit of a previous stage. The wiring 415 supplied with a potential of an output signal of the nonvolatile latch circuit 400a is electrically connected to the wiring 414 supplied with a potential of an input signal of the nonvolatile latch circuit 400b. The nonvolatile latch circuit 400b is electrically connected to the wiring 415 which supplies a potential of an output signal of the nonvolatile latch circuit 400b to a circuit of a subsequent stage.

In the nonvolatile latch circuit 400a, an analog switch 431 is supplied with a clock signal $\phi 1$ and an inverted signal $\phi 1b$ of the clock signal $\phi 1$, and the clocked inverter 413 is supplied with a clock signal $\phi 2$ and an inverted signal $\phi 2b$ of the clock signal $\phi 2$. In the nonvolatile latch circuit 400b, an analog switch 431 is supplied with a clock signal $\phi 2$ and the inverted signal $\phi 2$, of the clock signal $\phi 2$, and a clocked inverter 413 is supplied with the clock signal $\phi 1$ and the inverted signal $\phi 1b$ of the clock signal $\phi 1$.

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized.

Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

This embodiment can be freely combined with any of the other embodiments.

[Embodiment 7]

Figure 22:
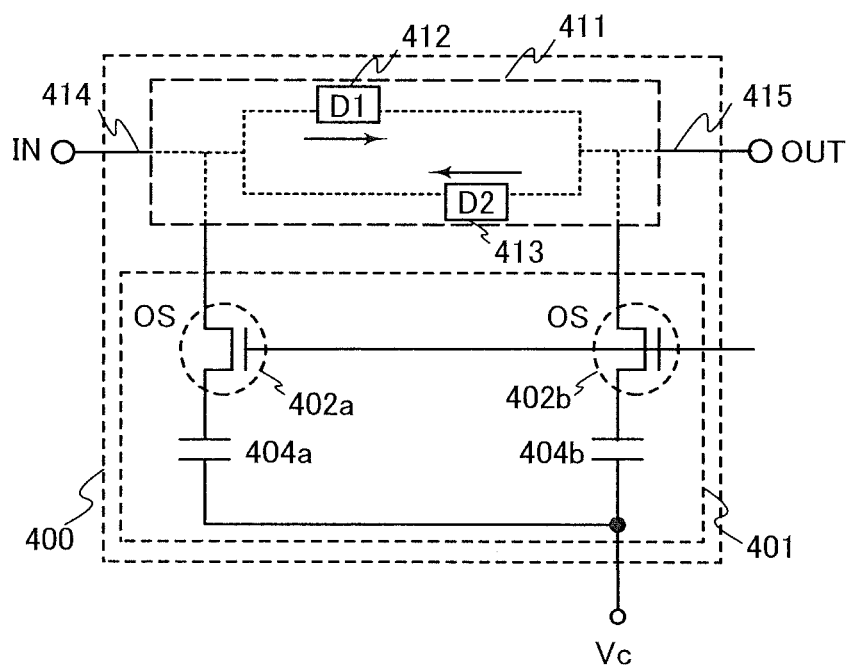
FIG. 22 illustrates an example of a configuration of a nonvolatile latch circuit.

In this embodiment, another example of the configuration of the nonvolatile latch circuit which is an embodiment of the invention disclosed herein will be described with reference to FIG. 22. FIG. 22 is different from FIG. 1 in this example. FIG. 22 illustrates a configuration of a nonvolatile latch circuit 400 including a latch portion 411 and a data holding portion 401 for holding data of the latch portion.

The nonvolatile latch circuit 400 in FIG. 22 includes the latch portion 411 having a loop structure and the data holding portion 401 for holding data of the latch portion. In the latch portion 411 having a loop structure, an output of a first element (D1) 412 is electrically connected to an input of a second element (D2) 413, and an output of the second element (D2) 413 is electrically connected to an input of the first element (D1) 412.

The input of the first element (D1) 412 is electrically connected to a wiring 414 supplied with an input signal of the latch circuit. The output of the first element (D1) 412 is electrically connected to a wiring 415 supplied with an output signal of the latch circuit.

When there is a plurality of inputs of the first element (D1) 412, one of the inputs can be electrically connected to the wiring 414 supplied with the input signal of the latch circuit. When there is a plurality of inputs of the second element (D2) 413, one of the inputs can be electrically connected to the output of the first element (D1) 412.

As the first element (D1) 412, an element in which inputted signal is inverted and the resulting signal serves as an output can be used. For example, as the first element (D1) 412, an inverter, a NAND, a NOR, a clocked inverter, or the like can be used. As the second element (D2) 413, an element in which inputted signal is inverted and the resulting signal serves as an output can be used. For example, as the second element (D2) 413, an inverter, a NAND, a NOR, a clocked inverter, or the like can be used.

In the data holding portion 401, a transistor 402a and a transistor 402b using an oxide semiconductor as a semiconductor material for forming a channel formation region are each used as a switching element. In addition, the data holding portion 401 includes a capacitor 404a which is electrically connected to a source electrode or a drain electrode of the transistor 402a and a capacitor 404b which is electrically connected to a source electrode or a drain electrode of the transistor 402b.

One of electrodes of the capacitor 404a is electrically connected to one of the source electrode and the drain electrode of the transistor 402a, and one of electrodes of the capacitor 404b is electrically connected to one of the source electrode and the drain electrode of the transistor 402b. The other of the source electrode and the drain electrode of the transistor 402a is electrically connected to the wiring 414 supplied with the input of the first element (D1) 412 or the input signal of the latch circuit. The other of the source electrode and the drain electrode of the transistor 402b is electrically connected to the output of the first element (D1) 412 or the wiring 415 supplied with the output signal of the latch circuit. The other electrode of the capacitor 404a and the other electrode of the capacitor 404b are each supplied with a potential $V_c$.

The transistor 402a and the transistor 402b using an oxide semiconductor each have a function of writing data held in the latch portion 411 into the capacitor 404a and the capacitor 404b of the data holding portion 401. In addition, the transistor 402a and the transistor 402b each have a function of holding the data written into the capacitor 404a and the capacitor 404b of the data holding portion 401. Moreover, the transistor 402a and the transistor 402b each have a function of reading the data held in the capacitor 404a and the capacitor 404b of the data holding portion 401 to the latch portion 411.

A writing operation of the data held in the latch portion 411 into the data holding portion 401, a holding operation of the data, a reading operation of the data from the data holding portion 401 to the latch portion 411, and a rewriting operation of the data will be described. First, the transistor 402a and the transistor 402b are turned on by supplying a gate electrode of each of the transistor 402a and the transistor 402b with a potential at which the transistor 402a and the transistor 402b are turned on.

Accordingly, one of the electrodes of the capacitor 404a is supplied with the data held in the latch portion, that is, a potential of the input of the first element (D1) 412, which is held in the latch portion, and one of the electrodes of the capacitor 404b is supplied with a potential of the output of the first element (D1) 412, which is held in the latch portion. As a result, the charge corresponding to the potential of the input of the first element (D1) 412 is accumulated in one of the electrodes of the capacitor 404a, and the charge corresponding to the potential of the output of the first element (D1) 412 is accumulated in one of the electrodes of the capacitor 404b (this operation corresponds to writing).

After that, the transistor 402a and the transistor 402b are turned off in such a manner that a potential of the gate electrode of each of the transistor 402a and the transistor 402b is set to a potential at which each of the transistor 402a and the transistor 402b is turned off. Accordingly, the charge accumulated in one of the electrodes of the capacitor 404a and the capacitor 404b is held (holding).

In addition, the transistor 402a and the transistor 402b are turned on by supplying the gate electrode of each of the transistor 402a and the transistor 402b with a potential at which each of the transistor 402a and the transistor 402b is turned on. Accordingly, a charge is distributed to one of the electrodes of the capacitor 404a and the input of the first element (D1) 412, and to one of the electrodes of the capacitor 404b and the output of the first element (D1) 412. As a result, the input and the output of the first element (D1) 412 are each supplied with the potential corresponding to the charge accumulated in one of the electrodes of the capacitor 404b. As a result, the data can be read (reading). Rewriting of the data can be performed in a manner similar to that of the writing and holding of the data.

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized.

Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

This embodiment can be freely combined with any of the other embodiments.

[Embodiment 8]

In this embodiment, the configuration and the operation of the nonvolatile latch circuit which is an embodiment of the invention disclosed herein will be described with reference to FIG. 23 and FIGS. 24A and 24B.

Figure 23:
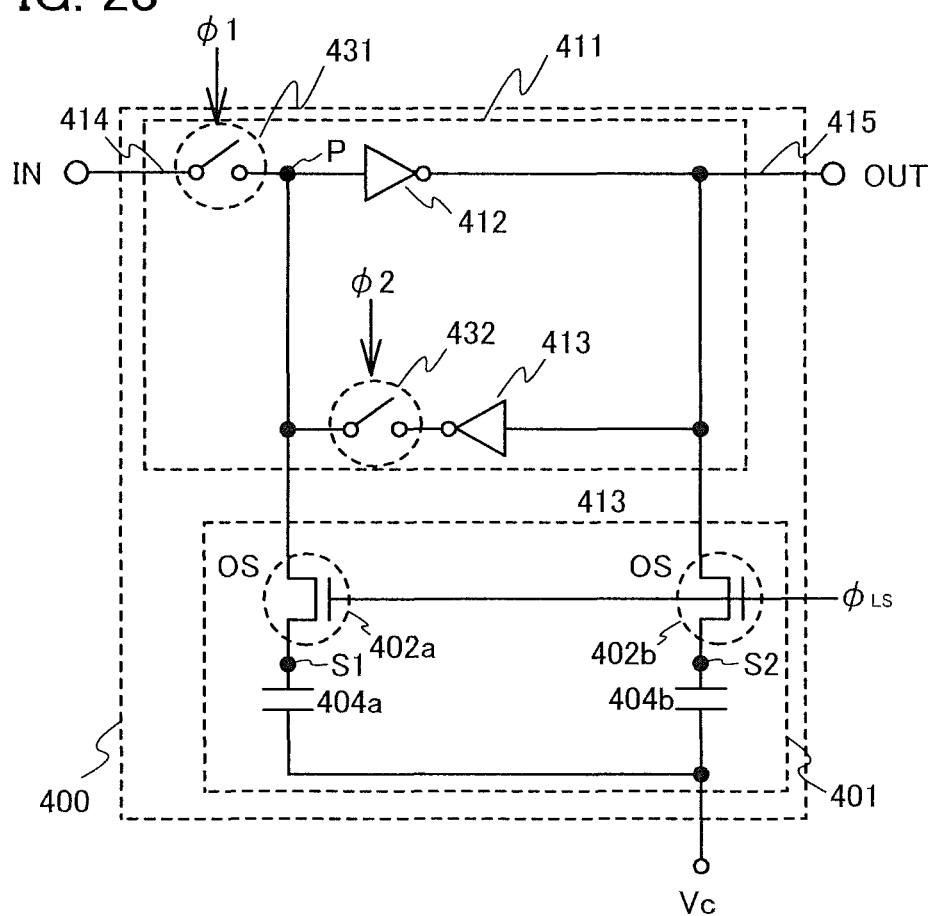
FIG. 23 illustrates an example of a configuration of a nonvolatile latch circuit.

FIG. 23 illustrates a configuration of the nonvolatile latch circuit 400 including the latch portion 411 and the data holding portion 401 for holding data of the latch portion.

Figure 24A:
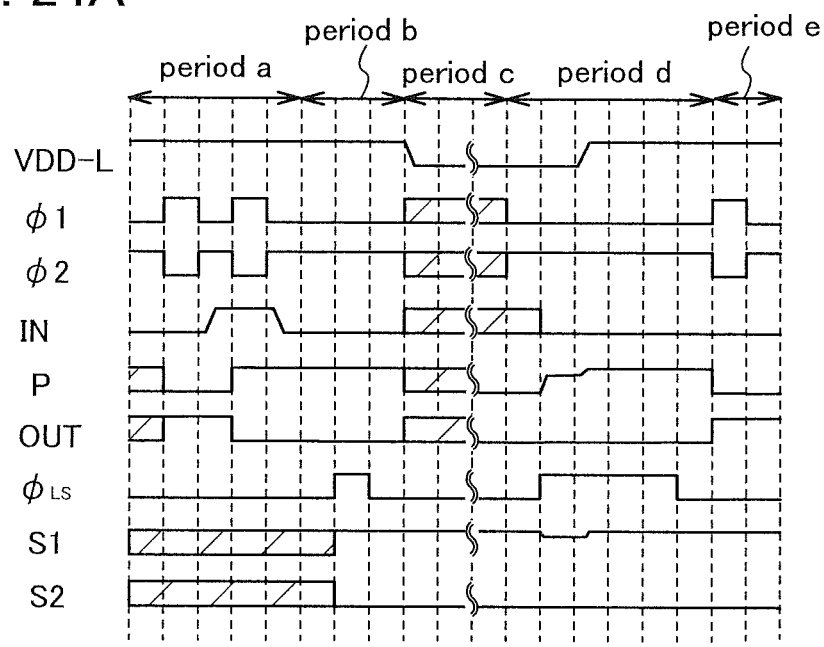
FIGS. 24A and 24B each illustrate an example of an operation of a nonvolatile latch circuit.
Figure 24B:
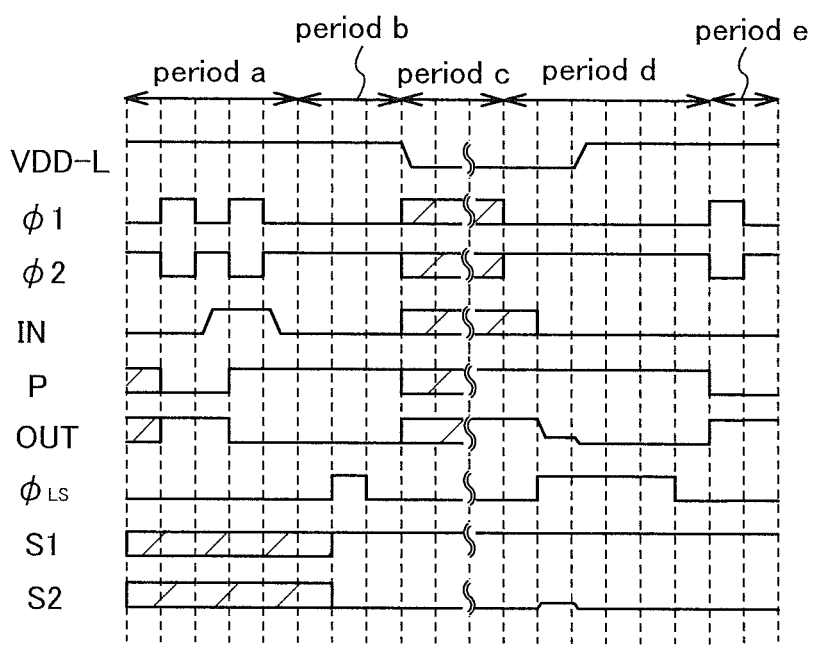

FIGS. 24A and 24B each illustrate an example of a timing chart of the nonvolatile latch circuit 400.

FIG. 23 is an example in which the configuration of the latch portion 411 in FIG. 22 is specifically illustrated. FIG. 23 is an example of the configuration of the latch portion 411 in FIG. 22, where an inverter 412 is used for the first element and an inverter 413 is used for the second element. Each structure of the transistor 402a and the transistor 402b can be similar to that in Embodiment 1 or Embodiment 2.

The latch portion 411 includes the inverter 412 and the inverter 413. The latch portion 411 has a loop structure in which an output of the inverter 412 is electrically connected to an input of the inverter 413, and an output of the inverter 413 is electrically connected to an input of the inverter 412. In addition, the latch portion 411 includes a switch 431 and a switch 432, and the output of the inverter 413 is electrically connected to the input of the inverter 412 via the switch 432.

The input of the inverter 412 is electrically connected to the wiring 414 supplied with the input signal of the latch circuit via the switch 431. The output of the inverter 412 is electrically connected to the wiring 415 supplied with the output signal of the latch circuit. A node which is connected to the input of the inverter 412 is referred to as a node P. The node P is electrically connected to the wiring 414 supplied with the input signal of the latch circuit. Moreover, the node P is also electrically connected to the output of the inverter 413. Note that the potential of the node P is the same as that of the input of the inverter 412.

In the data holding portion 401, the transistor 402a and the transistor 402b using an oxide semiconductor as a semiconductor material for forming a channel formation region are each used as a switching element. In addition, the data holding portion 401 includes the capacitor 404a which is electrically connected to the source electrode or the drain electrode of the transistor 402a and the capacitor 404b which is electrically connected to the source electrode or the drain electrode of the transistor 402b.

One of the electrodes of the capacitor 404a is electrically connected to one of the source electrode and the drain electrode of the transistor 402a, and one of the electrodes of the capacitor 404b is electrically connected to one of the source electrode and the drain electrode of the transistor 402b. The other of the source electrode and the drain electrode of the transistor 402a is electrically connected to the wiring 414 supplied with the input signal of the latch circuit and the input of the inverter 412 (the node P) in the latch portion.

The other of the source electrode and the drain electrode of the transistor 402b is electrically connected to the wiring 415 supplied with the output signal of the latch circuit and the output of the inverter 412 in the latch portion. The other electrode of the capacitor 404a and the other electrode of the capacitor 404b are each supplied with a potential $V_c$. A node where the transistor 402a and the capacitor 404a are electrically connected to each other is referred to as a node S1, and a node where the transistor 402b and the capacitor 404b are electrically connected to each other is referred to as a node S2.

The transistor 402a and the transistor 402b using an oxide semiconductor each have a function of writing data held in the latch portion 411 into the capacitor 404a and the capacitor 404b of the data holding portion 401. In addition, the transistor 402a and the transistor 402b each have a function of holding the data written into the capacitor 404a and the capacitor 404b of the data holding portion 401. Moreover, the transistor 402a and the transistor 402b each have a function of reading the data held in the capacitor 404a and the capacitor 404b of the data holding portion 401 to the latch portion 411.

The wiring 414 is supplied with a potential of an input signal IN from a circuit of a previous stage. A circuit of a subsequent stage is supplied with the potential of the wiring 415 as an output signal OUT. The switch 431 is supplied with a potential of a clock signal $\phi 1$. When the clock signal $\phi 1$ is supplied with a high-level potential, the switch 431 is turned on. The switch 432 is supplied with a potential of a clock signal $\phi 2$. When the clock signal $\phi 2$ is supplied with a high-level potential, the switch 432 is turned on. A gate of each of the transistor 402a and the transistor 402b is supplied with a potential of a control signal $\phi_{LS}$.

When the control signal $\phi_{LS}$ is supplied with a high-level potential, the transistor 402a and the transistor 402b are turned on. In a normal operation period, the clock signal $\phi 2$ is an inverted signal of the clock signal $\phi 1$. Here, an example is shown in which the transistors and the switches are turned on when the potentials of the control signals and the clock signals are at high levels.

Each of the inverter 412 and the inverter 413 of the latch portion 411 is supplied with a high-level power source voltage VDD and a low-level power source voltage VSS.

Next, FIGS. 24A and 24B each illustrate an example of a timing chart of the potentials of the input signal IN, the output signal OUT, the control signal $\phi_{LS}$, the clock signal $\phi 1$, and the clock signal $\phi 2$ in a period in which the nonvolatile latch circuit 400 is in an operation state (an operation period) and in a period in which the nonvolatile latch circuit 400 is in a stop state (a non-operation period). In addition, FIGS. 24A and 24B illustrate the potentials of the node S1 and the node S2 of the data holding portion 401, the node P of the latch portion 411, and the power source voltage VDD-L of the inverter 412 and the inverter 413 of the latch portion 411.

The node S1 indicates the potential of one of the electrodes of the capacitor 404a. The node S2 indicates the potential of one of the electrodes of the capacitor 404b. Note that the other electrode of the capacitor 404a and the other electrode of the capacitor 404b are each supplied with a predetermined potential $V_c$, for example, a ground potential.

First, FIG. 24A is described. In FIG. 24A, a period a, a period b, a period d, and a period e are each a period in which the nonvolatile latch circuit 400 is in an operation state (an operation period), and a period c is a period in which the nonvolatile latch circuit 400 is in a stop state (a non-operation period). In each of the period a and the period e, the nonvolatile latch circuit 400 is in a normal operation period, and the clock signal φ1 and the clock signal φ2 are each supplied with a high-level potential or a low-level potential alternately. The period b is a preparation period prior to the non-operation period. The period b is also referred to as a falling period. The period d is a preparation period between the non-operation period and restart of a normal operation period. The period d is also referred to as a rising period.

When the clock signal φ1 is supplied with a high-level potential and the clock signal φ2 is supplied with a low-level potential in the normal operation period (period a), the switch 432 is turned off and an inverter loop is cut, the switch 431 is turned on, and the potential of the input signal is inputted to the inverter 412. The potential of the input signal is inverted by the inverter 412 and is supplied to a circuit of a subsequent stage as the output signal OUT. If the potential of the input signal is at a high level when the clock signal φ1 is supplied with a high-level potential, an output signal having a low-level potential can be obtained. If the potential of the input signal is at a low level when the clock signal φ1 is supplied with a high-level potential, an output signal having a high-level potential can be obtained.

When the clock signal φ1 is supplied with a low-level potential and the clock signal φ2 is supplied with a high-level potential, the switch 431 is turned off, the switch 432 is turned on and an inverter loop is formed, and the potential of the output signal OUT is held (data is latched, i.e., the logical state of the latch circuit is held).

In the normal operation period, the control signal φ$_{LS}$ is supplied with a potential at which the transistor 402a and the transistor 402b are turned off and not supplied with a potential at which the transistor 402a and the transistor 402b are turned on. The node S1 and the node S2 each have the potential corresponding to a charge which has been held. Here, the potential of the node S1 and the node S2 are each set to an undefined value.

Next, when the control signal φ$_{LS}$ is supplied with the potential at which the transistor 402a and the transistor 402b are turned on in the preparation period (period b) prior to the non-operation period, the transistor 402a and the transistor 402b are turned on. Accordingly, one of the electrodes of the capacitor 404a (the node S1) is supplied with the potential of the input of the inverter 412 (the node P) in the latch portion, and one of the electrodes of the capacitor 404b (the node S2) is supplied with the potential of the output of the inverter 412 (or the wiring 415 supplied with the output signal) in the latch portion.

As a result, the charge corresponding to the potential of the input of the inverter 412 (the node P) in the latch portion is accumulated in the capacitor 404a, and the charge corresponding to the potential of the output of the inverter 412 (or the wiring 415 supplied with the output signal) in the latch portion is accumulated in the capacitor 404b (this operation corresponds to writing). For example, at the timing at which the control signal φ$_{LS}$ is supplied with the potential at which the transistor 402a and the transistor 402b are turned on, the potential of the node S1 is set to a high level if the potential of the input of the inverter 412 (the node P) in the latch portion is at a high level. In addition, the potential of the node S2 is set to a low level if the potential of the output of the inverter 412 (or the wiring 415 supplied with the output signal) in the latch portion is at a low level.

After that, the transistor 402a and the transistor 402b are turned off by supplying the control signal φ$_{LS}$ with the potential at which the transistor 402a and the transistor 402b are turned off, and the node S1 and the node S2 each become a floating state. As a result, the charges accumulated in the node S1 and the node S2 are held without any change (holding).

Note that it is sufficient that, in the period b, the clock signal φ2 and the clock signal φ1 hold a potential at the termination of the period a. Alternatively, data at the termination of the period a may be latched by fixing the potential of the clock signal φ2 to a high level and the potential of the clock signal φ1 to a low level.

Next, in the non-operation period (period c), the supply of power is stopped and the potentials of the power source voltage VDD-L of the inverter 412 and the inverter 413 of the latch portion 411 are lowered. The potentials of the clock signal φ1, the clock signal φ2, the input signal IN, the output signal OUT and the node P can take any values between VDD and VSS. During this time, the potential of the control signal φ$_{LS}$ is held at a low level so that the transistor 402a and the transistor 402b are turned off. For example, the potential is held at a ground potential. In the non-operation period (period c), the charges accumulated in the node S1 and the node S2 are held by turning off the transistor 402a and the transistor 402b (holding).

Next, the preparation period (period d) starts which is between the non-operation period and restart of a normal operation period. FIG. 24A illustrates an example of the case where the potentials of the node P and the output signal OUT are at low levels at the timing at which the control signal φ$_{LS}$ is supplied with the potential at which the transistor 402a and the transistor 402b are turned on.

In the period d, prior to the supply of power to the inverter 412 and the inverter 413 of the latch portion 411, the potential of the clock signal φ2 is fixed to a high level and the potential of the clock signal φ1 is fixed to a low level. When the control signal φ$_{LS}$ is supplied in this state with the potential at which the transistor 402a and the transistor 402b are turned on, the transistor 402a and the transistor 402b are turned on, and the latch portion 411 is supplied with the potentials held in the node S1 and the node S2.

Specifically, the charge is distributed to the node S1 and the input of the inverter 412 (the input corresponds to the node P, and the input of the inverter 412 (the node P) is supplied with the potential corresponding to the charge accumulated in the node S1. Here, the potential of the input of the inverter 412 (the node P) is raised, and the potential of the node S1 is lowered to some extent.

In addition, the charge is distributed to the node S2 and the output of the inverter 412 (or the wiring 415 supplied with the output signal), and the output of the inverter 412 (or the wiring 415 supplied with the output signal) is supplied with the potential corresponding to the charge accumulated in the node S2. Here, both the potential of the input of the inverter 412 (the node P) and the potential of the node S2 are still at low levels.

When power is supplied in this state to the inverter 412 and the inverter 413, in the latch portion, the potential of the input of the inverter 412 (the node P) is set to a high level and the potential of the output of the inverter 412 (or the wiring 415 supplied with the output signal) is set to a low level by a potential difference between the input and the output of the inverter 412 and a potential difference between the input and the output of the inverter 413.

Accordingly, the data of the data holding portion is read to the latch portion, and the logical state of the latch circuit can be restored to the logical state prior to the start of the non-operation period. When the potential difference between the input and the output of the inverter 412 and the potential difference between the input and the output of the inverter 413 are generated in such a manner before power is supplied, the latch circuit can be used as a differential amplifier. As a result, more stable reading can be performed as compared to FIG. 19B.

When power is supplied and the inverter loop is formed, the node P and the output signal OUT are each supplied with a high-level potential or a low-level potential, and the potentials are held (data is latched). Then, the potential of the node P and the potential of the output signal OUT are supplied to the node S1 and the node S2, respectively. Accordingly, the node S1 and the node S2 are supplied again with a high-level potential or a low-level potential. As a result, the potentials of the node S1 and the node S2 can be restored to the potentials before the change (this operation is also referred to as rewriting).

After that, the transistor 402a and the transistor 402b are turned off by supplying the control signal $\phi_{LS}$ with the potential at which the transistor 402a and the transistor 402b are turned off, and the node S1 and the node S2 each become a floating state. As a result, the charges accumulated in the node S1 and the node S2 are held without any change (holding). The charges accumulated in the node S1 and the node S2 can be rewritten at the timing at which the control signal $\phi_{LS}$ is supplied next with the potential at which the transistor 402a and the transistor 402b are turned on. Therefore, the charges accumulated in the node S1 and the node S2 are held without any change until the timing at which the control signal $\phi_{LS}$ is supplied next with the potential at which the transistor 402a and the transistor 402b are turned on.

As described above, the data is read to the latch portion in such a manner that the charge is distributed to the node S1 and the input of the inverter 412 (the node P) and the charge is distributed to the node S2 and the output of the inverter 412 (or the wiring 415 supplied with the output signal). In the case where the charge corresponding to a high-level potential is accumulated in the node S1 and the charge corresponding to a low-level potential is accumulated in the node S2, after the charge distribution, the potential of the input of the inverter 412 (the node P) is set higher than the potential of the output of the inverter 412 (or the wiring 415 supplied with the output signal) without dependence on the potentials of the input of the inverter 412 (the node P) and the output of the inverter 412 (or the wiring 415 supplied with the output signal) before the transistor 402a and the transistor 402b are turned on.

In the case where the charge corresponding to a low-level potential is accumulated in the node S1 and the charge corresponding to a high-level potential is accumulated in the node S2, after the charge distribution, the potential of the input of the inverter 412 (the node P) is set lower than the potential of the output of the inverter 412 (or the wiring 415 supplied with the output signal) without dependence on the potentials of the input of the inverter 412 (the node P) and the output of the inverter 412 (or the wiring 415 supplied with the output signal) before the transistor 402a and the transistor 402b are turned on. In addition, after the charge distribution, the potential of the input of the inverter 412 (the node P) and the potential of the output of the inverter 412 (or the wiring 415 supplied with the output signal) are both set not to be lowered too much. For example, both of the potentials are set so as not to be lower than the threshold voltage of the transistor included in the inverter.

In order to achieve the above, it is preferable that a capacitance of the node S1 be larger than a capacitance of the node P, for example. In other words, it is preferable that the capacitance of the capacitor 404a to which the node S1 is electrically connected be larger than an input capacitance of the inverter 412, to which the node P is electrically connected, (the input capacitance corresponds to the gate capacitance of a transistor of the inverter). In addition, in the period d, it is effective to provide a period in which the potential $V_c$ is set to a value between VDD and VSS. Accordingly, the reading operation can be performed more stably.

In such a manner, without limitation to the case where the node P has a low-level potential and the output signal OUT has a high-level potential, data can be read to the latch portion also in the case where the node P has a high-level potential and the output signal OUT has a low-level potential. In addition, without limitation to the case where the charge corresponding to a high-level potential is accumulated in the node S1, data can be read to the latch portion even in the case where the charge corresponding to a low-level potential is accumulated.

Next, the clock signal φ1 and the clock signal φ2 are each supplied with a high-level potential or a low-level potential alternately to be a normal operation state (the period e). At the start of the normal operation period (period e), the operations of the clock signal φ1 and the clock signal φ2 may be started from the same potentials (same state) as the termination of the previous normal operation period (period a) or may be started from an inverted potential of the potential at the termination of the period a (this inverted potential is also referred to as a subsequent state of the period a).

Next, FIG. 24B is described. In FIG. 24B, the operations of the period a, the period b, and the period c are similar to those in FIG. 24A.

Next, the preparation period (period d) starts which is between the non-operation period and restart of a normal operation period. FIG. 24B illustrates an example of the case where the potentials of the node P and the output signal OUT are at high levels at the timing at which the control signal $\phi_{LS}$ is supplied with the potential at which the transistor 402a and the transistor 402b are turned on.

In the period d, prior to the supply of power to the inverter 412 and the inverter 413 of the latch portion 411, the potential of the clock signal φ2 is fixed to a high level and the potential of the clock signal φ1 is fixed to a low level. When the control signal $\phi_{LS}$ is supplied in this state with the potential at which the transistor 402a and the transistor 402b are turned on, the transistor 402a and the transistor 402b are turned on, and the latch portion 411 is supplied with the potentials held in the node S1 and the node S2.

Specifically, the charge is distributed to the node S1 and the input of the inverter 412 (the node P), and the input of the inverter 412 (the node P) is supplied with the potential corresponding to the charge accumulated in the node S1. Here, both the potential of the input of the inverter 412 (the node P) and the potential of the node S1 are still at high levels.

In addition, the charge is distributed to the node S2 and the output of the inverter 412 (or the wiring 415 supplied with the output signal, and the output of the inverter 412 (or the wiring 415 supplied with the output signal) is supplied with the potential corresponding to the charge accumulated in the node S2. Here, the potential of the output (the output signal OUT) of the inverter 412 is lowered, and the potential of the node S2 is raised to some extent.

When power is supplied in this state to the inverter 412 and the inverter 413, in the latch portion, the potential of the input of the inverter 412 (the node P) is set to a high level and the potential of the output of the inverter 412 (or the wiring 415 supplied with the output signal) is set to a low level by a potential difference between the input and the output of the inverter 412 and a potential difference between the input and the output of the inverter 413.

Accordingly, the data of the data holding portion is read to the latch portion, and the logical state of the latch circuit can be restored to the logical state prior to the start of the non-operation period. When the potential difference between the input and the output of the inverter 412 and the potential difference between the input and the output of the inverter 413 are generated in such a manner before power is supplied, the latch circuit can be used as a differential amplifier. As a result, more stable reading can be performed as compared to FIG. 19B.

When power is supplied and the inverter loop is formed, the node P and the output signal OUT are each supplied with a high-level potential or a low-level potential, and the potentials are held (data is latched). Then, the potential of the node P and the potential of the output signal OUT are supplied to the node S1 and the node S2, respectively. Accordingly, the node S1 and the node S2 are supplied again with a high-level potential or a low-level potential. As a result, the potentials of the node S1 and the node S2 can be restored to the potentials before the change (this operation is also referred to as rewriting).

After that, the transistor 402a and the transistor 402b are turned off by supplying the control signal $\phi_{LS}$ with the potential at which the transistor 402a and the transistor 402b are turned off, and the node S1 and the node S2 each become a floating state. As a result, the charges accumulated in the node S1 and the node S2 are held without any change (holding). The charges accumulated in the node S1 and the node S2 can be rewritten at the timing at which the control signal $\phi_{LS}$ is supplied next with the potential at which the transistor 402a and the transistor 402b are turned on. Therefore, the charges accumulated in the node S1 and the node S2 are held without any change until the timing at which the control signal $\phi_{LS}$ is supplied next with the potential at which the transistor 402a and the transistor 402b are turned on.

Next, the clock signal $\phi 1$ and the clock signal $\phi 2$ are each supplied with a high-level potential or a low-level potential alternately to be a normal operation state (the period e). At the start of the normal operation period (period e), the operations of the clock signal $\phi 1$ and the clock signal $\phi 2$ may be started from the same potentials (same state) as the termination of the previous normal operation period (period a) or may be started from an inverted potential of the potential at the termination of the period a (this inverted potential is also referred to as a subsequent state of the period a).

Note that although the example in which the potential difference between the input and the output of the inverter 412 and the potential difference between the input and the output of the inverter 413 are generated before power is supplied is shown here, the nonvolatile latch circuit with the configuration described in this embodiment (FIG. 23) can also be operated with the use of a timing chart similar to that in FIG. 19B.

Note that in the period d, it is effective to provide a period in which the potential $V_c$ is set to a value between VDD and VSS. Accordingly, the reading operation can be performed more stably.

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized.

Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily. Moreover, more stable reading can be performed in the case where the latch circuit is used as a differential amplifier.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

This embodiment can be freely combined with any of the other embodiments.

[Embodiment 9]

In this embodiment, another example of the operation of the nonvolatile latch circuit which is an embodiment of the invention disclosed herein will be described with reference to FIG. 25. The configuration of the nonvolatile latch circuit is the same as that in FIG. 23, and the timing chart is different from those in FIGS. 24A and 24B in this example.

Figure 25:
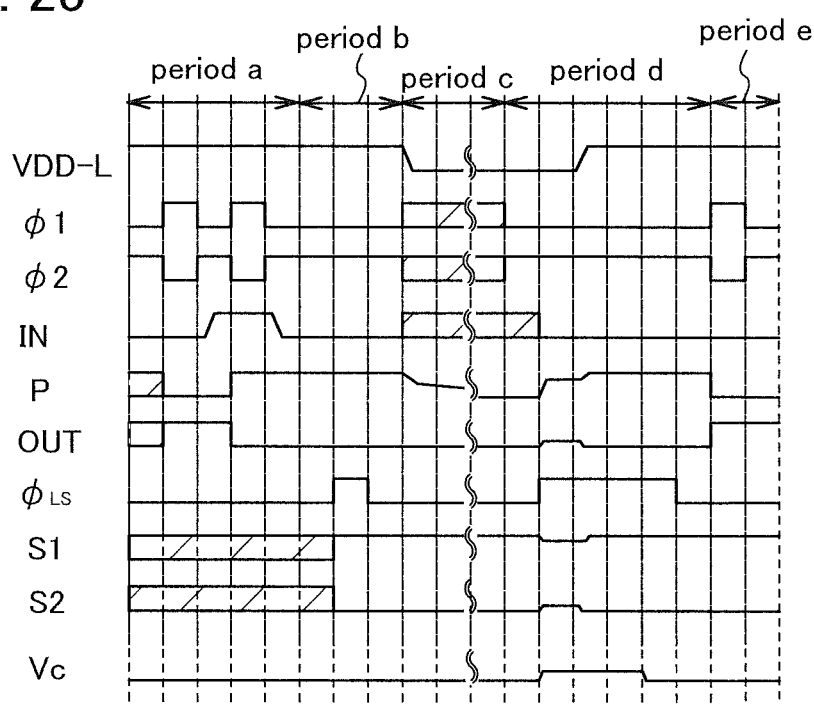
FIG. 25 illustrates an example of an operation of a nonvolatile latch circuit.

Next, FIG. 25 illustrates an example of a timing chart of the potentials of an input signal IN, an output signal OUT, a control signal $\phi_{LS}$, a clock signal $\phi 1$, and a clock signal $\phi 2$ in a period in which the nonvolatile latch circuit 400 is in an operation state (an operation period) and in a period in which the nonvolatile latch circuit 400 is in a stop state (a non-operation period). In addition, FIG. 25 illustrates the potentials of the node S1 and the node S2 of the data holding portion 401, the node P of the latch portion 411, and the power source voltage VDD-L of the inverter 412 and the inverter 413 of the latch portion 411, and a potential $V_c$ of the other electrode of each of the capacitor 404a and the capacitor 404b. The node S1 indicates the potential of one of the electrodes of the capacitor 404a. The node S2 indicates the potential of one of the electrodes of the capacitor 404b.

In FIG. 25, a period a, a period b, a period d, and a period e are each a period in which the nonvolatile latch circuit 400 is in an operation state (an operation period), and a period c is a period in which the nonvolatile latch circuit 400 is in a stop state (a non-operation period). In each of the period a and the period e, the nonvolatile latch circuit 400 is in a normal operation period, and the clock signal $\phi 1$ and the clock signal $\phi 2$ are each supplied with a high-level potential or a low-level potential alternately. The period b is a preparation period prior to the non-operation period. The period b is also referred to as a falling period. The period d is a preparation period between the non-operation period and restart of a normal operation period. The period d is also referred to as a rising period.

In FIG. 25, the operations of the period a and the period b are similar to those in FIGS. 24A and 24B. Next, in the non-operation period (period c), the supply of power is stopped and the potentials of the power source voltage VDD-L of the inverter 412 and the inverter 413 of the latch portion 411 are lowered. The potentials of the clock signal $\phi 1$, the clock signal $\phi 2$, and the input signal IN can take any values between VDD and VSS. During this time, the potential of the control signal $\phi_{LS}$ is held at a low level so that the transistor 402a and the transistor 402b are turned off. For example, the potential is held at a ground potential.

In the non-operation period (period c), the charges accumulated in the node S1 and the node S2 are held by turning off the transistor 402a and the transistor 402b (holding). In addition, the potential of the output signal OUT is held at a low level. Moreover, the potential of the node P is lowered gradually.

Next, the preparation period (period d) starts which is between the non-operation period and restart of a normal operation period. In the period d, prior to the supply of power to the inverter 412 and the inverter 413 of the latch portion 411, the potential of the clock signal $\phi 2$ is fixed to a high level and the potential of the clock signal $\phi 1$ is fixed to a low level. When the control signal $\phi_{LS}$ is supplied in this state with the potential at which the transistor 402a and the transistor 402b are turned on, the transistor 402a and the transistor 402b are turned on, and the latch portion 411 is supplied with the potentials held in the node S1 and the node S2.

Specifically, the charge is distributed to the node S1 and the input of the inverter 412 (the node P). Then, the potential $V_c$ of the other electrode of the capacitor 404a is supplied with a predetermined potential at the timing at which the control signal $\phi_{LS}$ is supplied with a potential at which the transistor 402a is turned on. The potential $V_c$ is raised from a low-level potential to be a potential between a low-level potential and a high-level potential. Accordingly, the input of the inverter 412 (the node P) is supplied with a potential in which an increase of the potential $V_c$ of the other electrode of the capacitor 404a is added to the potential which is determined by the distribution of the charge to the input of the inverter 412 (the node P) and the node S1. Here, the potential of the input of the inverter 412 (the node P) is raised, and the potential of the node S1 is lowered to some extent.

In addition, the charge is distributed to the node S2 and the output of the inverter 412 (or the wiring 415 supplied with the output signal). Then, the potential $V_c$ of the other electrode of the capacitor 404b is supplied with a predetermined potential at the timing at which the control signal $\phi_{LS}$ is supplied with a potential at which the transistor 402b is turned on. The potential $V_c$ is raised from a low-level potential to be a potential between a low-level potential and a high-level potential.

Accordingly, the output of the inverter 412 (or the wiring 415 supplied with the output signal) is supplied with a potential in which an increase of the potential $V_c$ of the other electrode of the capacitor 404b is added to the potential which is determined by the distribution of the charge to the output of the inverter 412 (or the wiring 415 supplied with the output signal) and the node S2. Here, the potential of the output of the inverter 412 (or the wiring 415 supplied with the output signal) and the potential of the node S2 are raised to some extent by the increase of the potential $V_c$ of the other electrode of the capacitor 404b.

When power is supplied in this state to the inverter 412 and the inverter 413, in the latch portion, the potential of the input of the inverter 412 (the node P) is set to a high level and the potential of the output of the inverter 412 (or the wiring 415 supplied with the output signal) is set to a low level by a potential difference between the input and the output of the inverter 412 and a potential difference between the input and the output of the inverter 413.

Accordingly, the data of the data holding portion is read to the latch portion, and the logical state of the latch circuit can be restored to the logical state prior to the start of the non-operation period. When the potential difference between the input and the output of the inverter 412 and the potential difference between the input and the output of the inverter 413 are generated in such a manner before power is supplied, the latch circuit can be used as a differential amplifier. As a result, more stable reading can be performed as compared to FIG. 19B.

When power is supplied and the inverter loop is formed, the node P and the output signal OUT are each supplied with a high-level potential or a low-level potential, and the potentials are held (data is latched). Then, the potential of the node P and the potential of the output signal OUT are supplied to the node S1 and the node S2, respectively. Accordingly, the node S1 and the node S2 are supplied again with a high-level potential or a low-level potential. As a result, the potentials of the node S1 and the node S2 can be restored to the potentials before the change (this operation is also referred to as rewriting).

After that, the potential $V_c$ of the other electrodes of the capacitors is restored to be a low-level potential.

After that, the transistor 402a and the transistor 402b are turned off by supplying the control signal $\phi_{LS}$ with the potential at which the transistor 402a and the transistor 402b are turned off, and the node S1 and the node S2 each become a floating state. As a result, the charges accumulated in the node S1 and the node S2 are held without any change (holding).

The charges accumulated in the node S1 and the node S2 can be rewritten at the timing at which the control signal $\phi_{LS}$ is supplied next with the potential at which the transistor 402a and the transistor 402b are turned on. Therefore, the charges accumulated in the node S1 and the node S2 are held without any change until the timing at which the control signal $\phi_{LS}$ is supplied next with the potential at which the transistor 402a and the transistor 402b are turned on.

As described above, the data is read to the latch portion in such a manner that the charge is distributed to the node S1 and the input of the inverter 412 (the node P) and the charge is distributed to the node S2 and the output of the inverter 412 (or the wiring 415 supplied with the output signal). In the case where the charge corresponding to a high-level potential is accumulated in the node S1 and the charge corresponding to a low-level potential is accumulated in the node S2, after the charge distribution, the potential of the input of the inverter 412 (the node P) is set higher than the potential of the output of the inverter 412 (or the wiring 415 supplied with the output signal) without dependence on the potentials of the input of the inverter 412 (the node P) and the output of the inverter 412 (or the wiring 415 supplied with the output signal) before the transistor 402a and the transistor 402b are turned on.

In the case where the charge corresponding to a low-level potential is accumulated in the node S1 and the charge corresponding to a high-level potential is accumulated in the node S2, after the charge distribution, the potential of the input of the inverter 412 (the node P) is set lower than the potential of the output of the inverter 412 (or the wiring 415 supplied with the output signal) without dependence on the potentials of the input of the inverter 412 (the node P) and the output of the inverter 412 (or the wiring 415 supplied with the output signal) before the transistor 402a and the transistor 402b are turned on. In addition, after the charge distribution, the potential of the input of the inverter 412 (the node P) and the potential of the output of the inverter 412 (or the wiring 415 supplied with the output signal) are both set not to be lowered too much. For example, both of the potentials are set so as not to be lower than the threshold voltage of the transistor included in the inverter.

In order to achieve the above, it is preferable that a capacitance of the node S1 be larger than a capacitance of the node P, for example. In other words, it is preferable that the capacitance of the capacitor 404a to which the node S1 is electrically connected be larger than an input capacitance of the inverter 412, to which the node P is electrically connected, (the input capacitance corresponds to the gate capacitance of a transistor of the inverter). In addition, in the period d, it is effective to provide a period in which the potential $V_c$ is set to a value between VDD and VSS. Accordingly, the reading operation can be performed more stably.

In such a manner, without limitation to the case where the node P has a low-level potential and the output signal OUT has a high-level potential, data can be read to the latch portion also in the case where the node P has a high-level potential and the output signal OUT has a low-level potential. In addition, without limitation to the case where the charge corresponding to a high-level potential is accumulated in the node S1, data can be read to the latch portion even in the case where the charge corresponding to a low-level potential is accumulated.

In particular, as described in this embodiment, the potential $V_c$ of the other electrode of the capacitor is supplied with a predetermined potential at the timing at which the control signal $\phi_{LS}$ is supplied with the potential at which the transistor 402a and the transistor 402b are turned on, so that the reading operation can be performed more stably.

For example, in the case where the capacitance of the capacitor 404a and the capacitor 404b are small or the case where the supply of power is stopped for a long time, it is difficult to keep a potential difference between the input of the inverter 412 (the node P) and the output of the inverter 412 (or the wiring 415 supplied with the output signal) after the charge distribution, and the potentials of the input of the inverter 412 (the node P) and the output of the inverter 412 (or the wiring 415 supplied with the output signal) after the charge distribution become low. Therefore, there is a possibility that the stability of reading might be degraded.

Even in such cases, after the charge distribution, the potentials of the input of the inverter 412 (the node P) and the output of the inverter 412 (or the wiring 415 supplied with the output signal) can be controlled to appropriate potentials by supplying the potential $V_c$ of the other electrode of each of the capacitor 404a and the capacitor 404b with a predetermined potential. As a result, stable reading can be performed. In other words, the reading operation can be performed even in the case of a capacitor having a smaller capacitance and thus miniaturization is possible. Further, a data holding period can be made longer.

Next, the clock signal $\phi 1$ and the clock signal $\phi 2$ are each supplied with a high-level potential or a low-level potential alternately to be a normal operation state (the period e). At the start of the normal operation period (period e), the operations of the clock signal $\phi 1$ and the clock signal $\phi 2$ may be started from the same potentials (same state) as the termination of the previous normal operation period (period a) or may be started from an inverted potential of the potential at the termination of the period a (this inverted potential is also referred to as a subsequent state of the period a).

Note that although the example in which the potential difference between the input and the output of the inverter 412 and the potential difference between the input and the output of the inverter 413 are generated before power is supplied is shown here, the nonvolatile latch circuit with the configuration described in this embodiment (FIG. 23) can also be operated with the use of a timing chart similar to that in FIG. 19B.

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized.

Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily. In addition, the capacitance of the capacitor of the data holding portion can be reduced and the capacitor can be reduced in size thus miniaturization is possible.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

This embodiment can be freely combined with any of the other embodiments.

[Embodiment 10]

In this embodiment, another example of a configuration of a logic circuit including a plurality of the nonvolatile latch circuits which are each an embodiment of the invention disclosed herein will be described with reference to FIG. 26.

Figure 26:
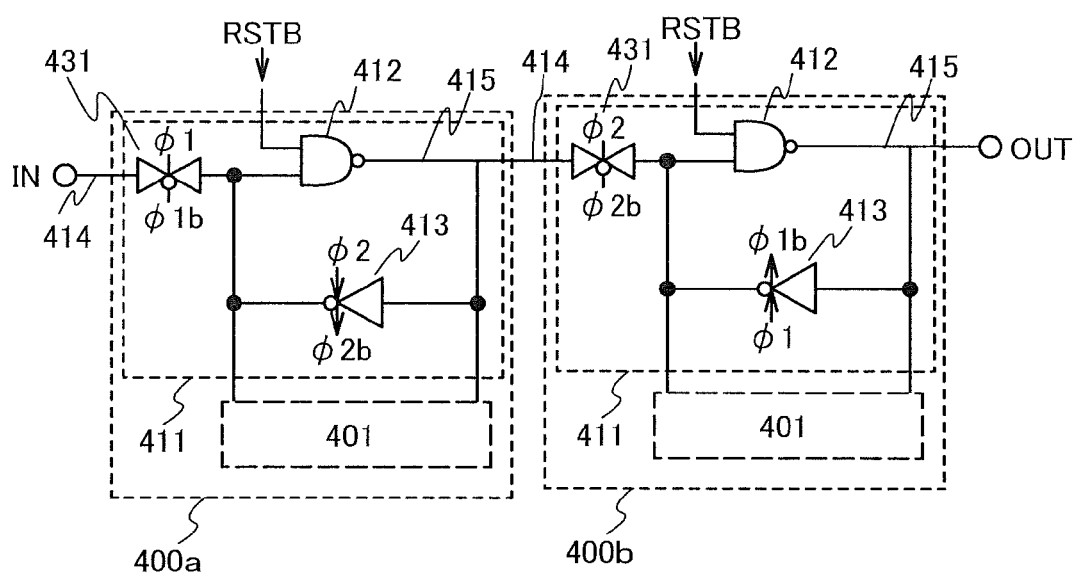
FIG. 26 illustrates a configuration of a nonvolatile latch circuit.

FIG. 26 illustrates a configuration of a logic circuit including two nonvolatile latch circuits 400 each including a latch portion 411 and a data holding portion 401 for holding data of the latch portion. This logic circuit is referred to as D-FF and used as a register in a CPU or various logic circuits.

The configuration of the data holding portion 401 is similar to that in FIG. 22. The configuration of the latch portion 411 is an example in which a NAND is used for the first element and a clocked inverter is used for the second element in the configuration of the latch portion 411 of FIG. 22.

The latch portion 411 includes a NAND 412 and a clocked inverter 413. The latch portion 411 has a loop structure in which an output of the NAND 412 is electrically connected to an input of the clocked inverter 413, and an output of the clocked inverter 413 is electrically connected to an input of the NAND 412. In addition, the latch portion 411 includes an analog switch 431.

One of inputs of the NAND 412 is electrically connected to a wiring 414 supplied with an input signal of the latch circuit 400 via the analog switch 431. The output of the NAND 412 is electrically connected to a wiring 415 supplied with an output signal of the latch circuit 400. The other input of the NAND 412 is electrically connected to a wiring supplied with a signal RSTB. The analog switch 431 is supplied with a clock signal and an inverted signal of the clock signal. The clocked inverter 413 is supplied with a clock signal and an inverted signal of the clock signal.

The logic circuit in FIG. 26 includes a nonvolatile latch circuit 400a and a nonvolatile latch circuit 400b as the aforementioned nonvolatile latch circuits 400. The nonvolatile latch circuit 400a is electrically connected to the wiring 414 supplied with a potential of an input signal from a circuit of a previous stage. The wiring 415 supplied with a potential of an output signal of the nonvolatile latch circuit 400a is electrically connected to the wiring 414 supplied with a potential of an input signal of the nonvolatile latch circuit 400b. The nonvolatile latch circuit 400b is electrically connected to the wiring 415 which supplies a potential of an output signal of the nonvolatile latch circuit 400b to a circuit of a subsequent stage.

In the nonvolatile latch circuit 400a, an analog switch 431 is supplied with a clock signal $\phi 1$ and an inverted signal $\phi 1b$ of the clock signal $\phi 1$, and the clocked inverter 413 is supplied with a clock signal $\phi 2$ and an inverter signal $\phi 2b$ of the clock signal $\phi 2$. In the nonvolatile latch circuit 400b, an analog switch 431 is supplied with the clock signal $\phi 2$ and the inverted signal $\phi 2b$ of the clock signal $\phi 2$, and a clocked inverter 413 is supplied with the clock signal $\phi 1$ and the inverter signal $\phi 1b$ of the clock signal $\phi 1$.

With the use of a transistor using an oxide semiconductor as a semiconductor material for forming a channel formation region, which serves as a switching element of a data holding portion, for the nonvolatile latch circuit according to this embodiment, a nonvolatile latch circuit which has a wide operating temperature range and operates stably even at a high temperature and in which a logical state of storing data is not erased even after power is turned off or a latch circuit provided with a data holding portion where a refresh period is sufficiently long can be realized.

Since data writing is performed by switching of the transistor, the number of rewrites is not substantially limited. In addition, the writing voltage is almost equivalent to the threshold voltage of the transistor; thus, the data writing can be performed at a low voltage. Further, a potential is directly supplied to the data holding portion; therefore, the variation in the amount of charge which is stored as data can be suppressed small and data can be read easily.

Various logic circuits can be provided by using the nonvolatile latch circuit. For example, the power consumption can be reduced by turning off power of the unused block. In addition, since a logical state is stored even when power is turned off, a system can be started when power is turned on or terminated when power is turned off, at high speed and low power.

This embodiment can be freely combined with any of the other embodiments.

[Embodiment 11]

Next, another example of the manufacturing method of a transistor using an oxide semiconductor which can be used as the transistor 402 in the above embodiments (such as Embodiment 1 or Embodiment 2) will be described with reference to FIGS. 27A to 27E. In this embodiment, description is made in detail on the case where an oxide semiconductor (particularly with an amorphous structure) which is highly purified is used. Although a top-gate transistor is used as an example in the following description, the structure of the transistor is not limited thereto.

First, an insulating layer 202 is formed over a bottom substrate 200. Then, an oxide semiconductor layer 206 is formed over the insulating layer 202 (see FIG. 27A).

Here, the bottom substrate 200 corresponds to the substrate including the transistor 160 in the lower portion and the like, which is shown in the above embodiments. The above embodiments can be referred to for details of the bottom substrate 200. Note that a surface of the bottom substrate 200 is preferably as flat as possible. In order to achieve this, the surface may be subjected to a chemical mechanical polishing (CMP) method or the like so as to have a peak-to-valley height of 5 nm or less, preferably 1 nm or less, or a root-mean-square roughness (RMS) of 2 nm or less, preferably 0.4 nm or less.

The insulating layer 202 serves as a base and can be formed in a manner similar to that of the insulating layer 168, the protective insulating layer 144, or the like shown in the above embodiments. The above embodiments can be referred to for details of the insulating layer 202. Note that it is preferable to form the insulating layer 202 so as to contain hydrogen or water as little as possible.

As the oxide semiconductor layer 206, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor which are one-component metal oxides.

In particular, an In—Ga—Zn—O-based oxide semiconductor material has sufficiently high resistance when there is no electric field and thus a sufficiently low off-state current can be obtained. In addition, having a high field-effect mobility, the In—Ga—Zn—O-based oxide semiconductor material is suitable for a semiconductor device.

A typical example of the In—Ga—Zn—O-based oxide semiconductor material is represented by $InGaO_3(ZnO)_m$ (m>0). Another example of the oxide semiconductor material is represented by $InMO_3(ZnO)_m$ (m>0) where M is used instead of Ga. Here, M denotes one or more of metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the aforementioned composition is only an example obtained from a crystalline structure.

In this embodiment, the oxide semiconductor layer 206 with an amorphous structure is formed with a sputtering method using an In—Ga—Zn—O-based metal oxide target.

As the metal oxide target used for forming the oxide semiconductor layer 206 with a sputtering method, for example, a metal oxide target having a composition ratio of $In_2O_3:Ga_2O_3:ZnO=1:1:1$ [molar ratio] can be used. Furthermore, a metal oxide target having a composition ratio of $In_2O_3:Ga_2O_3:ZnO=1:1:2$ [molar ratio] or a metal oxide target having a composition ratio of $In_2O_3:Ga_2O_3:ZnO=1:1:4$ [molar ratio] can also be used.

The relative density of the oxide semiconductor in the metal oxide target is greater than or equal to 80%, preferably greater than or equal to 95%, and more preferably greater than or equal to 99.9%. The use of the metal oxide target with high relative density makes it possible to form the oxide semiconductor layer 206 having a dense structure.

The atmosphere in which the oxide semiconductor layer 206 is formed is preferably a rare gas (typically argon) atmosphere, an oxygen atmosphere, or a mixed atmosphere containing a rare gas (typically argon) and oxygen. Specifically, it is preferable to use, for example, a high-purity gas atmosphere from which an impurity such as hydrogen, water, a hydroxyl group, or hydride is removed to a concentration of a few ppm or less (preferably, a few ppb or less).

At the time of forming the oxide semiconductor layer 206, for example, the substrate is held in a treatment chamber kept under reduced pressure and the substrate is heated to a temperature of 100° C. to 550° C. inclusive, preferably 200° C. to 400° C. inclusive. Then, a sputtering gas from which hydrogen, water, or the like is removed is introduced into the treatment chamber while moisture in the treatment chamber is removed, whereby the oxide semiconductor layer 206 is formed using the aforementioned target. The oxide semiconductor layer 206 is formed while the substrate is heated, so that the concentration of an impurity contained in the oxide semiconductor layer 206 can be reduced. Moreover, damage due to sputtering can be reduced. An entrapment vacuum pump is preferably used in order to remove moisture in the treatment chamber. For example, a cryopump, an ion pump, or a titanium sublimation pump can be used. Alternatively, a turbo pump provided with a cold trap may also be used. Since hydrogen, water, or the like is removed from the treatment chamber evacuated with a cryopump, the concentration of an impurity in the oxide semiconductor layer 206 can be reduced.

The oxide semiconductor layer 206 can be formed under the following conditions, for example: the distance between the substrate and the target is 170 mm; the pressure is 0.4 Pa; the direct-current (DC) power is 0.5 kW; and the atmosphere is oxygen (the proportion of the oxygen flow is 100%), argon (the proportion of the argon flow is 100%), or a mixed atmosphere containing oxygen and argon. Note that it is preferable to use a pulsed direct-current (DC) power source because dust (such as powder substances formed at the time of film formation) can be reduced and the thickness distribution can be reduced. The thickness of the oxide semiconductor layer 206 is 2 nm to 200 nm inclusive, preferably 5 nm to 30 nm inclusive. Note that the appropriate thickness of the oxide semiconductor layer differs depending on the oxide semiconductor material to be used, the intended purpose of a semiconductor device, or the like; therefore, the thickness may be determined in accordance with the material, the intended purpose, or the like.

Note that before the oxide semiconductor layer 206 is formed with a sputtering method, reverse sputtering is preferably performed in which plasma is generated with an argon gas introduced, so that dust on the surface of the insulating layer 202 is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which a high-frequency voltage is applied to the surface to be processed under an argon atmosphere so that plasma is generated near a substrate. Note that an atmosphere of nitrogen, helium, oxygen, or the like may be used instead of an argon atmosphere.

Next, the oxide semiconductor layer 206 is processed with a method such as etching using a mask, whereby an island-shaped oxide semiconductor layer 206a is formed.

As an etching method for the oxide semiconductor layer 206, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape. The above embodiments can be referred to for details of the etching conditions. The oxide semiconductor layer 206 can be etched in a manner similar to that of the oxide semiconductor layer shown in the above embodiments. The above embodiments can be referred to for details of the etching.

After that, heat treatment (first heat treatment) is preferably performed on the oxide semiconductor layer 206a. Through the first heat treatment, excess hydrogen (including water and hydroxyl groups) in the oxide semiconductor layer 206a can be removed, the structure of the oxide semiconductor layer 206a can be aligned, and defects in the oxide semiconductor layer 206a can be reduced. The first heat treatment is performed at a temperature of, for example, 300° C. to 550° C. inclusive, or 400° C. to 550° C. inclusive.

The heat treatment can be performed in such a manner that, for example, the bottom substrate 200 is introduced into an electric furnace using a resistance heating element or the like, and then heated under a nitrogen atmosphere at 450° C. for 1 hour. The oxide semiconductor layer 206a is not exposed to the air during the heat treatment so that the entry of water or hydrogen can be prevented.

The heat treatment apparatus is not limited to the electric furnace and can be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, for example, nitrogen or a rare gas such as argon is used.

For example, as the first heat treatment, a GRTA process may be performed as follows. The substrate is put in an inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the substrate because it is heat treatment for a short time.

Note that the inert gas atmosphere may be changed during the process to an atmosphere including oxygen. This is because defects caused by oxygen deficiency can be reduced by performing the first heat treatment under an atmosphere containing oxygen.

For example, in the case where an electrical furnace is used in the first heat treatment, an atmosphere can be changed when a heat treatment temperature falls. For example, the heat treatment can be performed (at a constant temperature) under an atmosphere of an inert gas such as a rare gas (e.g., helium, neon, or argon) or nitrogen, and the atmosphere can be switched to an atmosphere containing oxygen when the heat treatment temperature falls. As the atmosphere containing oxygen, an oxygen gas or a mixed gas of an oxygen gas and a nitrogen gas can be used.

Note that as the inert gas atmosphere, it is preferable to employ an atmosphere that contains nitrogen or a rare gas (e.g., helium, neon, or argon) as its main component and that does not contain water, hydrogen, or the like. For example, the purity of nitrogen or a rare gas such as helium, neon, or argon introduced into the heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

In any case, when the impurity are reduced through the first heat treatment to form the i-type or substantially i-type oxide semiconductor layer 206a, a transistor with excellent properties can be realized.

Note that the first heat treatment can also be performed on the oxide semiconductor layer 206 that has not yet been processed into the island-shaped oxide semiconductor layer 206a. In that case, after the first heat treatment, the bottom substrate 200 is taken out of the heating apparatus and a photolithography step is performed.

The first heat treatment, which has an effect of removing hydrogen or water, can also be referred to as dehydration treatment, dehydrogenation treatment, or the like. The dehydration treatment or dehydrogenation treatment can be performed, for example, after the oxide semiconductor layer is formed, or after a source or drain electrode is stacked over the oxide semiconductor layer 206a. Such dehydration treatment or dehydrogenation treatment may be performed once or plural times.

Next, a conductive layer is formed to be in contact with the oxide semiconductor layer 206a. Then, a source or drain electrode 208a and a source or drain electrode 208b are formed by selectively etching the conductive layer (see FIG. 27B). This step is similar to the step for forming the source or drain electrode 142a and the like described in the above embodiments. The above embodiments can be referred to for details of the step.

Figure 27A:
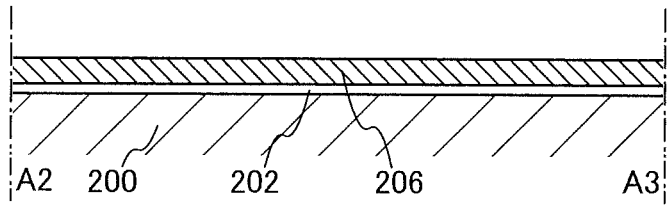
FIGS. 27A to 27E illustrate an example of a manufacturing method of an element of a nonvolatile latch circuit.
Figure 27B:
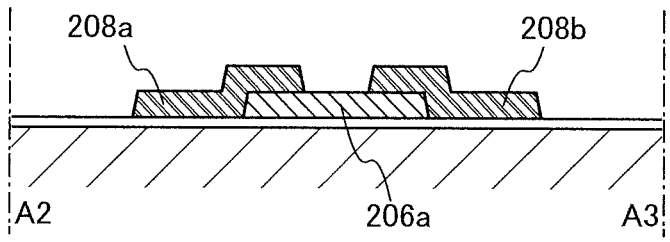
Figure 27C:
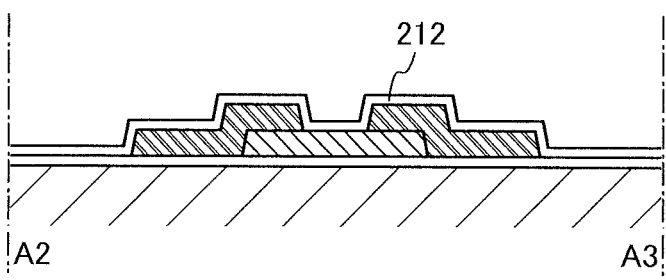

Next, a gate insulating layer 212 in contact with part of the oxide semiconductor layer 206a is formed (see FIG. 27C). The description of the gate insulating layer in the above embodiments can be referred to for details of the gate insulating layer 212.

After the gate insulating layer 212 is formed, second heat treatment is preferably performed under an inert gas atmosphere or an oxygen atmosphere. The heat treatment is performed at a temperature of 200° C. to 450° C. inclusive, preferably 250° C. to 350° C. inclusive. For example, the heat treatment may be performed at 250° C. for 1 hour under a nitrogen atmosphere. The second heat treatment can reduce variation in electric characteristics of the transistor. In the case where the gate insulating layer 212 contains oxygen, by supplying oxygen to the oxide semiconductor layer 206a to reduce oxygen deficiency of the oxide semiconductor layer 206a, an i-type (intrinsic) or substantially i-type oxide semiconductor layer can also be formed.

Note that although the second heat treatment is performed in this embodiment immediately after the gate insulating layer 212 is formed, the timing of the second heat treatment is not limited thereto.

Figure 27D:
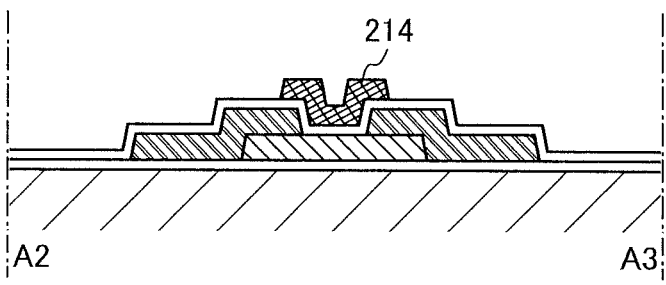

Next, a gate electrode 214 is formed over the gate insulating layer 212 in a region overlapping with the oxide semiconductor layer 206a (see FIG. 27D). The gate electrode 214 can be formed by forming a conductive layer over the gate insulating layer 212 and then selectively patterning the conductive layer. The description of the gate electrode in the above embodiments can be referred to for details of the gate electrode 214.

Figure 27E:
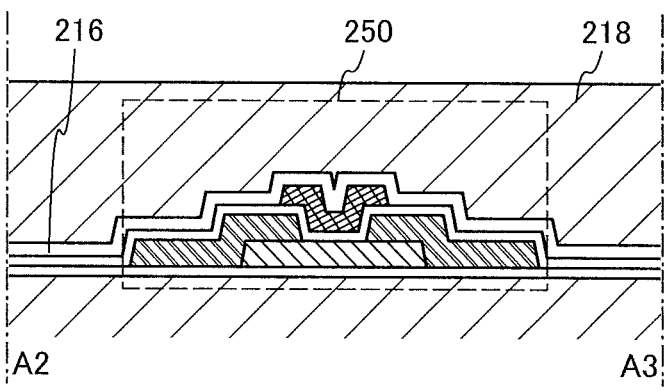

Next, an interlayer insulating layer 216 and an interlayer insulating layer 218 are formed over the gate insulating layer 212 and the gate electrode 214 (see FIG. 27E). The interlayer insulating layer 216 and the interlayer insulating layer 218 can be formed with a PVD method, a CVD method, or the like. The interlayer insulating layer 216 and the interlayer insulating layer 218 can be formed using a material including an inorganic insulating material such as silicon oxide, silicon oxynitride, silicon nitride, hafnium oxide, aluminum oxide, or tantalum oxide. Note that although a stacked structure of the interlayer insulating layer 216 and the interlayer insulating layer 218 is used in this embodiment, an embodiment of the invention disclosed herein is not limited thereto. A single-layer structure or a stacked structure including three or more layers can also be used.

Note that the interlayer insulating layer 218 is preferably formed so as to have a planarized surface. This is because an electrode, a wiring, or the like can be favorably formed over the interlayer insulating layer 218 when the interlayer insulating layer 218 is formed so as to have a planarized surface.

Through the above steps, a transistor 250 including the highly-purified oxide semiconductor layer 206a is completed.

The transistor 250 illustrated in FIG. 27E includes the following: the oxide semiconductor layer 206a provided over the bottom substrate 200 with the insulating layer 202 interposed therebetween; the source or drain electrode 208a and the source or drain electrode 208b electrically connected to the oxide semiconductor layer 206a; the gate insulating layer 212 covering the oxide semiconductor layer 206a, the source or drain electrode 208a, and the source or drain electrode 208b; the gate electrode 214 over the gate insulating layer 212; the interlayer insulating layer 216 over the gate insulating layer 212 and the gate electrode 214; and the interlayer insulating layer 218 over the interlayer insulating layer 216.

In the transistor 250 shown in this embodiment, the oxide semiconductor layer 206a is highly purified. Therefore, the concentration of hydrogen in the oxide semiconductor layer 206a is less than or equal to $5\times10^{19}/cm^3$, preferably less than or equal to $5\times10^{18}/cm^3$, more preferably less than or equal to $5\times10^{17}/cm^3$, and still more preferably less than or equal to $1\times10^{16}/cm^3$. In addition, the carrier density of the oxide semiconductor layer 206a is sufficiently low (e.g., less than $1\times10^{12}/cm^3$, preferably less than $1\times10^{11}/cm^3$) as compared to that of a typical silicon wafer (approximately $1\times10^{14}/cm^3$). As a result of this, a sufficiently low off-state current can be obtained. For example, when a drain voltage $V_D$ is +1 V or +10 V and a gate voltage $V_G$ ranges from −5 V to −20 V, the off-state current is less than or equal to $1\times10^{-13}$ A at room temperature. Moreover, the aforementioned transistor has characteristics of a normally-off transistor. Therefore, leakage current, that is, an off-state current at a state where a voltage between a gate electrode and a source electrode is approximately 0 V is much smaller than that of a transistor using silicon. For example, the leakage current per unit channel width is less than or equal to 10 aA/μm at room temperature.

In this manner, by using the highly-purified and intrinsic oxide semiconductor layer 206a, the off-state current of the transistor can be sufficiently reduced.

Note that although, in this embodiment, the transistor 250 is used as the transistor 402 shown in the above embodiments, the invention disclosed herein does not need to be construed as being limited to that case. For example, when the electric characteristics of an oxide semiconductor are sufficiently increased, the oxide semiconductor can be used for all the transistors including transistors included in an integrated circuit. In such a case, it is not necessary to employ a stacked structure as shown in the above embodiments, and a semiconductor device can be formed using, for example, a substrate such as a glass substrate.

The structures, methods, and the like described in this embodiment can be combined as appropriate with any of the structures, methods, and the like described in the other embodiments.

[Embodiment 12]

Next, another example of the manufacturing method of a transistor using an oxide semiconductor which can be used as the transistor 402 in the above embodiments (such as Embodiment 1 or Embodiment 2) will be described with reference to FIGS. 28A to 28E. In this embodiment, description is made in detail on the case where, as an oxide semiconductor layer, a first oxide semiconductor layer having a crystallized region and a second oxide semiconductor layer that is obtained by crystal growth from the crystallized region of the first oxide semiconductor layer are used. Although a top-gate transistor is used as an example in the following description, the structure of the transistor is not limited thereto.

First, an insulating layer 302 is formed over a bottom substrate 300. Next, a first oxide semiconductor layer is formed over the insulating layer 302, and then subjected to first heat treatment so that a region including at least a surface of the first oxide semiconductor layer is crystallized, whereby a first oxide semiconductor layer 304 is formed (see FIG. 28A).

Here, the bottom substrate 300 corresponds to the substrate including the transistor 160 in the lower portion and the like, which is shown in the above embodiments. The above embodiments can be referred to for details of the bottom substrate 300. Note that the planarity of the surface of the bottom substrate 300 is particularly important in this embodiment, because it is indispensable for uniform crystal growth. In order to obtain an oxide semiconductor layer with preferable crystallinity, the surface of the bottom substrate 300 may have a peak-to-valley height of 1 nm or less, preferably 0.2 nm or less, or a root-mean-square roughness (RMS) of 0.5 nm or less, preferably 0.1 nm or less.

The insulating layer 302 serves as a base and can be formed in a manner similar to that of the insulating layer 168, the protective insulating layer 144, or the like shown in the above embodiments. The above embodiments can be referred to for details of the insulating layer 302. Note that it is preferable to form the insulating layer 302 so as to contain hydrogen or water as little as possible.

The first oxide semiconductor layer 304 can be formed in a manner similar to that of the oxide semiconductor layer 206 shown in the above embodiment. The above embodiment can be referred to for details of the first oxide semiconductor layer 304 and a manufacturing method thereof. Note that in this embodiment, the first oxide semiconductor layer 304 is intentionally crystallized through the first heat treatment; therefore, the first oxide semiconductor layer 304 is preferably formed using a metal oxide target which causes crystallization easily. For example, ZnO can be used. Further, it is also preferable to use an In—Ga—Zn—O-based oxide in which the proportion of Zn in metal elements (In, Ga, Zn) is greater than or equal to 60%, because an In—Ga—Zn—O-based oxide containing Zn at high concentration is easily crystallized. The thickness of the first oxide semiconductor layer 304 is preferably 3 nm to 15 nm inclusive, and in this embodiment, 5 nm for example. Note that the appropriate thickness of the oxide semiconductor layer 304 differs depending on the oxide semiconductor material to be used, the intended purpose of a semiconductor device, or the like; therefore, the thickness may be determined in accordance with the material, the intended purpose, or the like.

The first heat treatment is performed at a temperature of 450° C. to 850° C. inclusive, preferably 550° C. to 750° C. inclusive. The time for the first heat treatment is preferably 1 minute to 24 hours inclusive. The temperature and time differ depending on the kind or composition ratio of the oxide semiconductor. In addition, the first heat treatment is preferably performed under an atmosphere that does not contain hydrogen or water, such as an atmosphere of nitrogen, oxygen, or a rare gas (e.g., helium, neon, or argon), from which water is sufficiently removed.

The heat treatment apparatus is not limited to the electric furnace can be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, for example, nitrogen or a rare gas such as argon is used.

Through the aforementioned first heat treatment, a region including at least the surface of the first oxide semiconductor layer is crystallized. The crystallized region is formed in such a manner that crystal growth proceeds from the surface of the first oxide semiconductor layer toward the inside of the first oxide semiconductor layer. Note that in some cases, the crystallized region includes a plate-like crystal with an average thickness of 2 nm to 10 nm inclusive. In some cases, the crystallized region also includes a crystal which has an a-b surface substantially parallel to the surface of the oxide semiconductor layer and in which a c-axis is oriented in a direction substantially perpendicular to the surface of the oxide semiconductor layer. Here, a "direction substantially parallel" means a direction within ±10° of the parallel direction, and a "direction substantially perpendicular" means a direction within ±10° of the perpendicular direction.

Through the first heat treatment during which the crystallized region is formed, hydrogen (including water or hydroxyl groups) in the first oxide semiconductor layer is preferably removed. In order to remove hydrogen or the like, the first heat treatment may be performed under an atmosphere of nitrogen, oxygen, or a rare gas (e.g., helium, neon, or argon), which has a purity of 6 N (99.9999%) or more (i.e., the impurity concentration is less than or equal to 1 ppm), more preferably a purity of 7 N (99.99999%) or more (i.e., the impurity concentration is less than or equal to 0.1 ppm). Alternatively, the first heat treatment may be performed in ultra-dry air containing $H_2O$ with 20 ppm or less, preferably 1 ppm or less.

Furthermore, through the first heat treatment during which the crystallized region is formed, oxygen is preferably supplied to the first oxide semiconductor layer. Oxygen can be supplied to the first oxide semiconductor layer by, for example, changing the atmosphere for the heat treatment to an oxygen atmosphere.

The first heat treatment in this embodiment is as follows: hydrogen or the like is removed from the oxide semiconductor layer through heat treatment under a nitrogen atmosphere at 700° C. for 1 hour, and then the atmosphere is changed to an oxygen atmosphere so that oxygen is supplied to the inside of the first oxide semiconductor layer. Note that the main purpose of the first heat treatment is to form the crystallized region; accordingly, heat treatment for removing hydrogen or the like and treatment for supplying oxygen may be performed separately. For example, heat treatment for crystallization can be performed after heat treatment for removing hydrogen or the like and treatment for supplying oxygen.

Through such first heat treatment, the crystallized region is formed, hydrogen (including water and hydroxyl groups) or the like is removed, and the first oxide semiconductor layer 304 supplied with oxygen can be obtained.

Figure 28A:
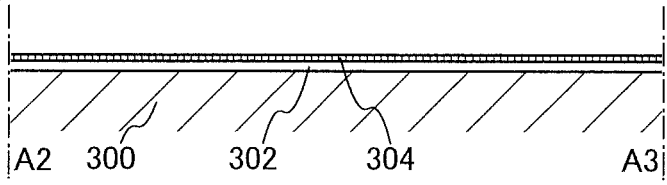
FIGS. 28A to 28E illustrate an example of a manufacturing method of an element of a nonvolatile latch circuit.
Figure 28B:
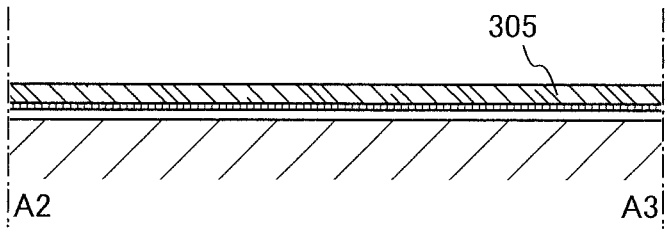

Next, a second oxide semiconductor layer 305 is formed over the first oxide semiconductor layer 304 including the crystallized region at least on its surface (see FIG. 28B).

The second oxide semiconductor layer 305 can be formed in a manner similar to that of the oxide semiconductor layer 206 shown in the above embodiments. The above embodiments can be referred to for details of the second oxide semiconductor layer 305 and a manufacturing method thereof. Note that the second oxide semiconductor layer 305 is preferably formed to be thicker than the first oxide semiconductor layer 304. Further, the second oxide semiconductor layer 305 is preferably formed so that the total thickness of the first oxide semiconductor layer 304 and the second oxide semiconductor layer 305 are 3 nm to 50 nm inclusive. Note that the appropriate thickness of the oxide semiconductor layer differs depending on the oxide semiconductor material to be used, the intended purpose of a semiconductor device, or the like; therefore, the thickness may be determined in accordance with the material, the intended purpose, or the like.

The second oxide semiconductor layer 305 and the first oxide semiconductor layer 304 are preferably formed using materials which have the same main component and further have close lattice constants after crystallization (lattice mismatch is less than or equal to 1%). This is because in the crystallization of the second oxide semiconductor layer 305, crystal growth easily proceeds from the crystallized region of the first oxide semiconductor layer 304 in the case where materials having the same main component are used. In addition, the use of materials having the same main component realizes favorable interface physical properties or electric characteristics.

Note that in the case where a desired film quality is obtained through crystallization, the second oxide semiconductor layer 305 may be formed using a material which has a main component different from that of the material of the first oxide semiconductor layer 304.

Figure 28C:
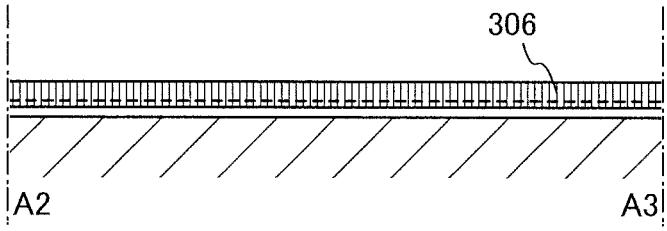

Next, second heat treatment is performed on the second oxide semiconductor layer 305, whereby crystal growth proceeds from the crystallized region of the first oxide semiconductor layer 304, and a second oxide semiconductor layer 306 is formed (see FIG. 28C).

The second heat treatment is performed at a temperature of 450° C. to 850° C. inclusive, preferably 600° C. to 700° C. inclusive. The time for the second heat treatment is 1 minute to 100 hours inclusive, preferably 5 hours to 20 hours inclusive, and typically 10 hours. Note that also the second heat treatment is preferably performed under an atmosphere that does not contain hydrogen or water.

Details of the atmosphere and the effect of the second heat treatment are similar to those of the first heat treatment. The heat treatment apparatus that can be used is also similar to that of the first heat treatment. For example, in the second heat treatment, a furnace is filled with a nitrogen atmosphere when a temperature rises, and the furnace is filled with an oxygen atmosphere when the temperature falls, whereby hydrogen or the like can be removed under the nitrogen atmosphere and oxygen can be supplied under the oxygen atmosphere.

Through the aforementioned second heat treatment, crystal growth can proceed from the crystallized region of the first oxide semiconductor layer 304 to the whole of the second oxide semiconductor layer 305, so that the second oxide semiconductor layer 306 can be formed. In addition, it is possible to form the second oxide semiconductor layer 306 from which hydrogen (including water and hydroxyl groups) or the like is removed and to which oxygen is supplied. Furthermore, the orientation of the crystallized region of the first oxide semiconductor layer 304 can be improved through the second heat treatment.

For example, in the case where an In—Ga—Zn—O-based oxide semiconductor material is used for the second oxide semiconductor layer 306, the second oxide semiconductor layer 306 can include a crystal represented by $InGaO_3(ZnO)_m$ (m>0, and m is not a natural number), a crystal represented by $In_2Ga_2ZnO_7$ (In:Ga:Zn:O=2:2:1:7), or the like. Such crystals are oriented through the second heat treatment so that a c-axis is in a direction substantially perpendicular to the surface of the second oxide semiconductor layer 306.

Here, the aforementioned crystals include any of In, Ga, and Zn, and can be considered to have a stacked structure of a plurality of layers parallel to an a-axis and a b-axis. Specifically, the aforementioned crystals have a structure in which a layer containing In and a layer not containing In (a layer containing Ga or Zn) are stacked in the c-axis direction.

In an In—Ga—Zn—O-based oxide semiconductor crystal, a layer containing In, that is, a layer in a direction parallel to the a-axis and the b-axis has favorable conductivity. This is because electrical conduction in the In—Ga—Zn—O-based oxide semiconductor crystal is mainly controlled by In, and the 5s orbital of an In atom overlaps with the 5s orbital of an adjacent In atom, so that a carrier path is formed.

Further, in the case where the first oxide semiconductor layer 304 includes an amorphous region at the interface with the insulating layer 302, through the second heat treatment, crystal growth proceeds in some cases from the crystallized region formed on the surface of the first oxide semiconductor layer 304 toward the bottom of the first oxide semiconductor layer to crystallize the amorphous region. Note that in some cases, the amorphous region remains depending on the material of the insulating layer 302, the heat treatment conditions, and the like.

In the case where the first oxide semiconductor layer 304 and the second oxide semiconductor layer 305 are formed using oxide semiconductor materials having the same main component, in some cases, the first oxide semiconductor layer 304 and the second oxide semiconductor layer 306 have the same crystal structure, as illustrated in FIG. 28C. Therefore, although indicated by a dotted line in FIG. 28C, the boundary between the first oxide semiconductor layer 304 and the second oxide semiconductor layer 306 cannot be distinguished in some cases so that the first oxide semiconductor layer 304 and the second oxide semiconductor layer 306 can be considered as the same layer.

Figure 28D:
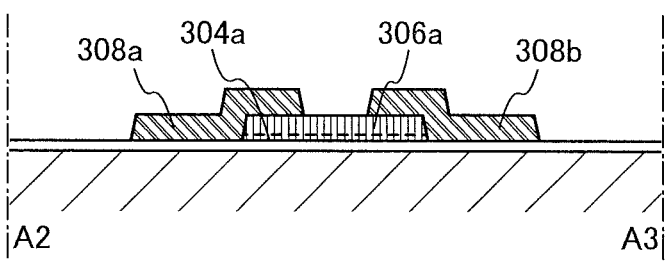

Next, the first oxide semiconductor layer 304 and the second oxide semiconductor layer 306 are processed with a method such as etching using a mask, whereby an island-shaped first oxide semiconductor layer 304a and an island-shaped second oxide semiconductor layer 306a are formed (see FIG. 28D).

As an etching method for the first oxide semiconductor layer 304 and the second oxide semiconductor layer 306, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape. The first oxide semiconductor layer 304 and the second oxide semiconductor layer 306 can be etched in a manner similar to that of the oxide semiconductor layer shown in the above embodiments. The above embodiments can be referred to for details of the etching.

A region of the oxide semiconductor layers, which becomes a channel formation region, preferably has a planarized surface. For example, the surface of the second oxide semiconductor layer preferably has a peak-to-valley height of 1 nm or less (more preferably 0.2 nm or less) in a region overlapping with a gate electrode (the channel formation region).

Next, a conductive layer is formed to be in contact with the second oxide semiconductor layer 306a. Then, a source or drain electrode 308a and a source or drain electrode 308b are formed by selectively etching the conductive layer (see FIG. 28D). The source or drain electrode 308a and the source or drain electrode 308b can be formed in a manner similar to that of the source or drain electrode 142a and the source or drain electrode 142b shown in the above embodiments. The above embodiments can be referred to for details of the source or drain electrode 308a and the source or drain electrode 308b.

In the step illustrated in FIG. 28D, crystal layers on the side surfaces of the first oxide semiconductor layer 304a and the second oxide semiconductor layer 306a, which are in contact with the source or drain electrode 308a and the source or drain electrode 308b, are brought into an amorphous state in some cases.

Next, a gate insulating layer 312 in contact with part of the second oxide semiconductor layer 306a is formed. The gate insulating layer 312 can be formed with a CVD method or a sputtering method. Then, a gate electrode 314 is formed over the gate insulating layer 312 in a region overlapping with the first oxide semiconductor layer 304a and the second oxide semiconductor layer 306a. After that, an interlayer insulating layer 316 and an interlayer insulating layer 318 are formed over the gate insulating layer 312 and the gate electrode 314 (see FIG. 28E). The gate insulating layer 312, the gate electrode 314, the interlayer insulating layer 316, and the interlayer insulating layer 318 can be formed in a manner similar to that of the gate insulating layer and the like shown in the above embodiments. The above embodiments can be referred to for details of the gate insulating layer 312, the gate electrode 314, the interlayer insulating layer 316, and the interlayer insulating layer 318.

After the gate insulating layer 312 is formed, third heat treatment is preferably performed under an inert gas atmosphere or an oxygen atmosphere. The third heat treatment is performed at a temperature of 200° C. to 450° C. inclusive, preferably 250° C. to 350° C. inclusive. For example, the heat treatment may be performed at 250° C. for 1 hour under an atmosphere containing oxygen. The third heat treatment can reduce variation in electric characteristics of the transistor. In the case where the gate insulating layer 312 contains oxygen, by supplying oxygen to the second oxide semiconductor layer 306a to reduce oxygen deficiency of the second oxide semiconductor layer 306a, an i-type (intrinsic) or substantially i-type oxide semiconductor layer can also be formed.

Note that although the third heat treatment is performed in this embodiment after the gate insulating layer 312 is formed, the timing of the third heat treatment is not limited thereto. Further, the third heat treatment may be omitted in the case where oxygen is supplied to the second oxide semiconductor layer through other treatment such as the second heat treatment.

The gate electrode 314 can be formed by forming a conductive layer over the gate insulating layer 312 and then selectively patterning the conductive layer. The description of the gate electrode in the above embodiments can be referred to for details of the gate electrode 314.

The interlayer insulating layer 316 and the interlayer insulating layer 318 can be formed with a PVD method, a CVD method, or the like. The interlayer insulating layer 316 and the interlayer insulating layer 318 can be formed using a material including an inorganic insulating material such as silicon oxide, silicon oxynitride, silicon nitride, hafnium oxide, aluminum oxide, or tantalum oxide. Note that although a stacked structure of the interlayer insulating layer 316 and the interlayer insulating layer 318 is used in this embodiment, an embodiment of the invention disclosed herein is not limited thereto. A single-layer structure or a stacked structure including three or more layers can also be used.

Note that the interlayer insulating layer 318 is preferably formed so as to have a planarized surface. This is because an electrode, a wiring, or the like can be favorably formed over the interlayer insulating layer 318 when the interlayer insulating layer 318 is formed so as to have a planarized surface.

Through the above steps, a transistor 350 is completed. The transistor 350 uses the first oxide semiconductor layer 304a and the second oxide semiconductor layer 306a which is obtained by crystal growth from the crystallized region of the first oxide semiconductor layer 304a.

Figure 28E:
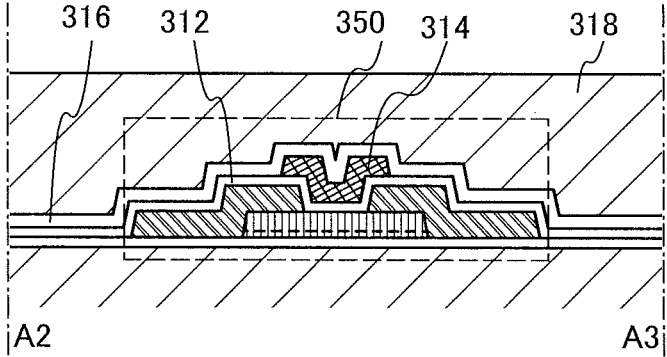

The transistor 350 illustrated in FIG. 28E includes the following: the first oxide semiconductor layer 304a provided over the bottom substrate 300 with the insulating layer 302 interposed therebetween; the second oxide semiconductor layer 306a provided over the first oxide semiconductor layer 304a; the source or drain electrode 308a and the source or drain electrode 308b electrically connected to the second oxide semiconductor layer 306a; the gate insulating layer 312 covering the second oxide semiconductor layer 306a, the source or drain electrode 308a, and the source or drain electrode 308b; the gate electrode 314 over the gate insulating layer 312; the interlayer insulating layer 316 over the gate insulating layer 312 and the gate electrode 314; and the interlayer insulating layer 318 over the interlayer insulating layer 316.

In the transistor 350 shown in this embodiment, the first oxide semiconductor layer 304a and the second oxide semiconductor layer 306a are highly purified. Therefore, the concentration of hydrogen in the first oxide semiconductor layer 304a and the second oxide semiconductor layer 306a is less than or equal to $5 \times 10^{19}/cm^3$, preferably less than or equal to $5 \times 10^{18}/cm^3$, more preferably less than or equal to $5 \times 10^{17}/cm^3$, and still more preferably less than or equal to $1 \times 10^{16}/cm^3$. In addition, the carrier density of the first semiconductor layer 304a and the second oxide semiconductor layer 306a is sufficiently low (e.g., less than $1 \times 10^{12}/cm^3$, preferably less than $1 \times 10^{11}/cm^3$) as compared to that of a typical silicon wafer (approximately $1 \times 10^{14}/cm^3$). As a result of this, a sufficiently low off-state current can be obtained. For example, when a drain voltage $V_D$ is +1 V or +10 V and a gate voltage $V_G$ ranges from −5 V to −20 V, the off-state current is less than or equal to $1 \times 10^{-13}$ A at room temperature. Moreover, the aforementioned transistor has characteristics of a normally-off transistor. Therefore, leakage current, that is, an off-state current at a state where a voltage between a gate electrode and a source electrode is approximately 0 V is much smaller than that of a transistor using silicon. For example, the leakage current per unit channel width is less than or equal to 10 aA/μm at room temperature.

In this manner, by using the highly-purified and intrinsic first oxide semiconductor layer 304a and second oxide semiconductor layer 306a, the off-state current of the transistor can be sufficiently reduced.

Furthermore, in this embodiment, the first oxide semiconductor layer 304a having a crystallized region and the second oxide semiconductor layer 306a which is obtained by crystal growth from the crystallized region of the first oxide semiconductor layer 304a are used as the oxide semiconductor layer. Thus, the field-effect mobility can be increased and a transistor with favorable electric characteristics can be realized.

Note that although, in this embodiment, the transistor 350 is used as the transistor 402 shown in the above embodiments, the invention disclosed herein does not need to be construed as being limited to that case. For example, the transistor 350 shown in this embodiment uses the first oxide semiconductor layer 304a having a crystallized region and the second oxide semiconductor layer 306a which is obtained by crystal growth from the crystallized region of the first oxide semiconductor layer 304a, and thus has a high field-effect mobility. Accordingly, the oxide semiconductor can be used for all the transistors including transistors included in an integrated circuit. In such a case, it is not necessary to employ a stacked structure as shown in the above embodiments, and a semiconductor device can be formed using, for example, a substrate such as a glass substrate.

The structures, methods, and the like described in this embodiment can be combined as appropriate with any of the structures, methods, and the like described in the other embodiments.

[Embodiment 13]

In this embodiment, examples of the electronic device on which a semiconductor device using the nonvolatile latch circuit according to any of the above embodiments is mounted will be described with reference to FIGS. 29A to 29F. The electronic device on which the semiconductor device using the nonvolatile latch circuit according to any of the above embodiments is mounted has excellent characteristics which cannot be seen in the conventional technology. Therefore, it is possible to provide an electronic device having a novel structure with the semiconductor device using the nonvolatile latch circuit. Note that the semiconductor device using the nonvolatile latch circuit according to any of the above embodiments is integrated and mounted on a circuit board or the like to be mounted on an electronic device.

Figure 29A:
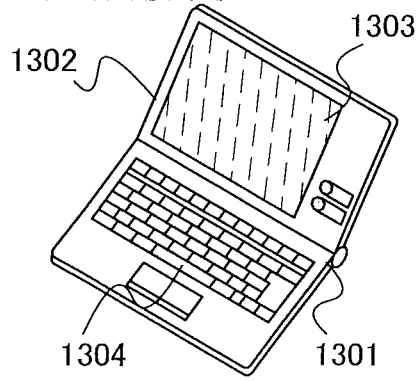
FIGS. 29A to 29F each illustrate an example of an electronic device including a semiconductor device using a nonvolatile latch circuit.

FIG. 29A illustrates a laptop personal computer including the semiconductor device using the nonvolatile latch circuit according to any of the above embodiments. The laptop personal computer includes a main body 1301, a housing 1302, a display portion 1303, a keyboard 1304, and the like. A laptop personal computer with excellent performance can be provided by applying the semiconductor device according to the invention disclosed herein to a laptop personal computer.

Figure 29D:
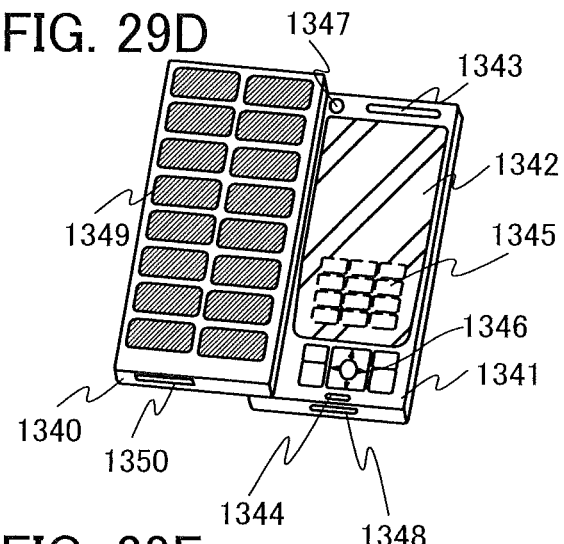
Figure 29B:
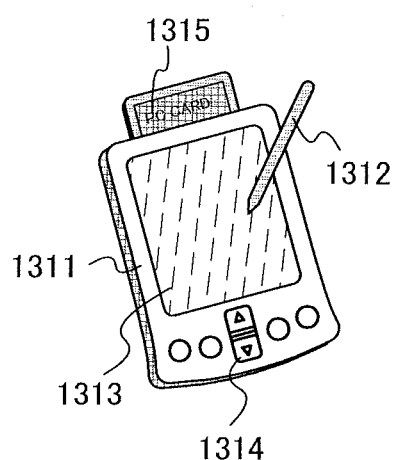

FIG. 29B illustrates a portable digital assistant (PDA) including the semiconductor device using the nonvolatile latch circuit according to any of the above embodiments. A main body 1311 includes a display portion 1313, an external interface 1315, operation keys 1314, and the like. Further, a stylus 1312 is provided as an accessory for operation. A portable digital assistant (PDA) with excellent performance can be provided by applying the semiconductor device according to the invention disclosed herein to a portable digital assistant (PDA).

Figure 29E:
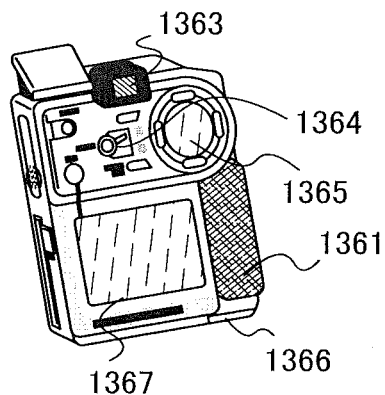
Figure 29C:
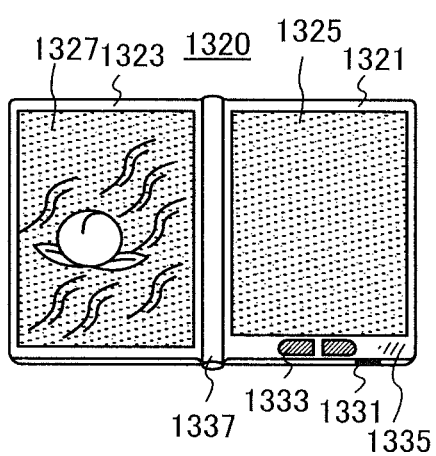

FIG. 29C illustrates an e-book reader 1320 as an example of electronic paper including the semiconductor device using the nonvolatile latch circuit according to any of the above embodiments. The e-book reader 1320 includes two housings: a housing 1321 and a housing 1323. The housing 1321 is combined with the housing 1323 by a hinge 1337, so that the e-book reader 1320 can be opened and closed with the hinge 1337 used as an axis. Such a structure allows the e-book reader 1320 to be used as paper books.

The housing 1321 includes a display portion 1325, and the housing 1323 includes a display portion 1327. The display portion 1325 and the display portion 1327 can display a continuous image or different images. The structure for displaying different images allows text to be displayed on the right display portion (the display portion 1325 in FIG. 29C) and images to be displayed on the left display portion (the display portion 1327 in FIG. 29C).

FIG. 29C illustrates an example of the case where the housing 1321 includes an operating portion and the like. For example, the housing 1321 includes a power button 1331, operation keys 1333, a speaker 1335, and the like. The operation keys 1333 allow pages to be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. The e-book reader 1320 can also serve as an electronic dictionary.

In addition, the e-book reader 1320 may have a structure capable of transmitting and receiving data wirelessly. Through wireless communication, desired book data or the like can be purchased and downloaded from an electronic book server.

Note that electronic paper can be used in any field as long as data is displayed. For example, electronic paper can be applied to posters, advertisement in vehicles such as trains, and a variety of cards such as credit cards, as well as e-book readers. Electronic paper with excellent performance can be provided by applying the semiconductor device according to the invention disclosed herein to electronic paper.

FIG. 29D illustrates a cellular phone including the semiconductor device using the nonvolatile latch circuit according to any of the above embodiments. The cellular phone includes two housings: a housing 1340 and a housing 1341. The housing 1341 includes a display panel 1342, a speaker 1343, a microphone 1344, a pointing device 1346, a camera lens 1347, an external connection terminal 1348, and the like. The housing 1340 includes a solar cell 1349 for charging the cellular phone, an external memory slot 1350, and the like. An antenna is built in the housing 1341.

The display panel 1342 includes a touch panel. A plurality of operation keys 1345 which are displayed as an image are shown by dashed lines in FIG. 29D. Note that the cellular phone includes a booster circuit for increasing a voltage outputted from the solar cell 1349 to a voltage needed for each circuit. In addition to the above structure, a noncontact IC chip, a small recording device, or the like may be built in the cellular phone.

The display orientation of the display panel 1342 changes as appropriate in accordance with the application mode. Further, the camera lens 1347 is provided on the same surface as the display panel 1342, so that the cellular phone can be used as a video phone. The speaker 1343 and the microphone 1344 can be used for videophone calls, recording, and playing sound, etc. as well as voice calls. Moreover, the housing 1340 and the housing 1341 which are unfolded as in FIG. 29D can overlap with each other by sliding. Thus, the cellular phone can be in a suitable size for portable use.

The external connection terminal 1348 is connectable to an AC adaptor and a variety of cables such as a USB cable, which enables charging of the cellular phone and data communication. Moreover, a larger amount of data can be saved and moved by inserting a recording medium to the external memory slot 1350. In addition to the above functions, an infrared communication function, a television reception function, or the like may be provided. A cellular phone with excellent performance can be provided by applying the semiconductor device according to the invention disclosed herein to a cellular phone.

FIG. 29E illustrates a digital camera including the semiconductor device using the nonvolatile latch circuit according to any of the above embodiments. The digital camera includes a main body 1361, a display portion A 1367, an eyepiece portion 1363, an operation switch 1364, a display portion B 1365, a battery 1366, and the like. A digital camera with excellent performance can be provided by applying the semiconductor device according to the invention disclosed herein to a digital camera.

Figure 29F:
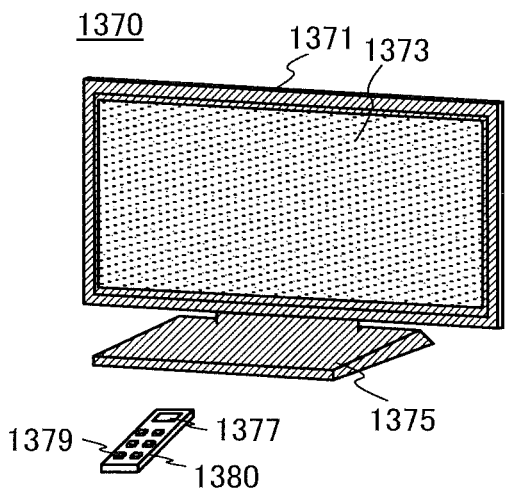

FIG. 29F illustrates a television set including the semiconductor device using the nonvolatile latch circuit according to any of the above embodiments. A television set 1370 includes a housing 1371 provided with a display portion 1373. Images can be displayed on the display portion 1373. Here, the housing 1371 is supported by a stand 1375.

The television set 1370 can operate by an operation switch included in the housing 1371 or by a remote controller 1380 separately provided. Channels and volume can be controlled by operation keys 1379 included in the remote controller 1380, and images displayed on the display portion 1373 can thus be controlled. Further, the remote controller 1380 can be provided with a display portion 1377 for displaying data outputted from the remote controller 1380.

Note that the television set 1370 preferably includes a receiver, a modem, and the like. With the receiver, a general television broadcast can be received. Furthermore, when the television set 1370 is connected to a communication network by wired or wireless connection via the modem, one-way (from a transmitter to a receiver) or two-way (between a transmitter and a receiver, between receivers, or the like) data communication can be performed. A television set with excellent performance can be provided by applying the semiconductor device according to the invention disclosed herein to a television set.

The structures, methods, and the like described in this embodiment can be combined as appropriate with any of the structures, methods, and the like described in the other embodiments.

The present application is based on Japanese Patent Application serial No. 2009-282139 filed with the Japan Patent Office on Dec. 11, 2009, the entire contents of which are hereby incorporated by reference.

The invention claimed is:

1. A semiconductor device comprising:
 a latch portion;
 an insulating layer over the latch portion; and
 a data holding portion operationally connected to the latch portion to hold data of the latch portion,
 the latch portion comprising:
  a transistor,
  wherein a channel formation region of the transistor of the latch portion includes crystalline silicon,
 the data holding portion comprising:
  a transistor; and
  a capacitor having a pair of electrodes,
  wherein a channel formation region of the transistor of the data holding portion includes an oxide semiconductor layer over the insulating layer, and
  wherein one of a source and a drain of the transistor of the data holding portion is electrically connected to one of the electrodes of the capacitor.

2. The semiconductor device according to claim 1, wherein the oxide semiconductor layer contains indium, gallium, and zinc.

3. The semiconductor device according to claim 1, wherein the transistor of the data holding portion controls writing of data into the capacitor.

4. The semiconductor device according to claim 1, wherein the transistor of the data holding portion has a function of holding data in the capacitor.

5. The semiconductor device according to claim 1, wherein the transistor of the data holding portion has a function of reading data held in the capacitor to the latch portion.

6. A logic circuit including the semiconductor device according to claim 1.

7. A CPU including a logic circuit, the logic circuit the semiconductor device according to claim 1.

8. A semiconductor device comprising:
 a latch portion;
 an insulating layer over the latch portion;
 a data holding portion operationally connected to the latch portion to hold data of the latch portion,
 the latch portion comprising:
  a first element; and
  a second element,
  wherein an output of the first element is electrically connected to an input of the second element, and an output of the second element is electrically connected to an input of the first element, and
  wherein each of the first element and the second element comprises a transistor, the transistor comprising a channel formation region which includes crystalline silicon, and
 the data holding portion comprising:
  a transistor; and
  a capacitor having a pair of electrodes,
  wherein a channel formation region of the transistor of the data holding portion includes an oxide semiconductor layer over the insulating layer,
  wherein one of a source and a drain of the transistor of the data holding portion is electrically connected to one of the electrodes of the capacitor, and
  wherein the other of the source and the drain of the transistor of the data holding portion is electrically connected to the input of the first element.

9. The semiconductor device according to claim 8, wherein the first element is an inverter and the second element is an inverter.

10. The semiconductor device according to claim 8, wherein the latch portion comprises:
 a first switch; and
 a second switch,
 wherein the output of the second element is electrically connected to the input of the first element through the second switch, and
 wherein the input of the first element is electrically connected to a wiring supplied with an input signal through the first switch.

11. The semiconductor device according to claim 8, wherein the first element is a NAND and the second element is a clocked inverter.

12. The semiconductor device according to claim 8, wherein the oxide semiconductor layer contains indium, gallium, and zinc.

13. A logic circuit including the semiconductor device according to claim 8.

14. A CPU including a logic circuit, the logic circuit the semiconductor device according to claim 8.

15. A semiconductor device comprising:
a latch portion;
the latch portion comprising:
   a transistor,
   wherein a channel formation region of the transistor of the latch portion includes crystalline silicon,
an insulating layer over the latch portion; and
a data holding portion operationally connected to the latch portion to hold data of the latch portion,
the data holding portion comprising:
   a first transistor;
   a second transistor;
   a first capacitor having a pair of electrodes; and
   a second capacitor having a pair of electrodes,
   wherein channel formation regions of the first transistor and the second transistor each include an oxide semiconductor layer over the insulating layer,
   wherein one of a source and a drain of the first transistor is electrically connected to one of the electrodes of the first capacitor,
   wherein the other of the source and the drain of the first transistor is electrically connected to an input of the latch portion,
   wherein one of a source and a drain of the second transistor is electrically connected to one of the electrodes of the second capacitor, and
   wherein the other of the source and the drain of the second transistor is electrically connected to an output of the latch portion.

16. The semiconductor device according to claim 15, wherein the oxide semiconductor layer contains indium, gallium, and zinc.

17. The semiconductor device according to claim 15, wherein the first transistor controls writing of data into the first capacitor, and wherein the second transistor controls writing of data into the second capacitor.

18. The semiconductor device according to claim 15, wherein the first transistor has a function of holding data in the first capacitor, and wherein the second transistor has a function of holding data in the second capacitor.

19. The semiconductor device according to claim 15, wherein the first transistor has a function of reading data held in the first capacitor to the latch portion, and wherein the second transistor has a function of reading data held in the second capacitor to the latch portion.

20. A logic circuit including the semiconductor device of claim 15.

* * * * *